(12) United States Patent
Song et al.

(10) Patent No.: US 12,156,457 B2
(45) Date of Patent: Nov. 26, 2024

(54) DISPLAY DEVICE

(71) Applicant: Samsung Display Co., Ltd., Yongin-Si (KR)

(72) Inventors: Heerim Song, Yongin-si (KR); Mukyung Jeon, Yongin-si (KR); Cheol-Gon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/226,369

(22) Filed: Jul. 26, 2023

(65) Prior Publication Data

US 2024/0130194 A1 Apr. 18, 2024

(30) Foreign Application Priority Data

Oct. 17, 2022 (KR) ........................ 10-2022-0133528

(51) Int. Cl.
| | | |
|---|---|---|
| *G09G 5/00* | (2006.01) | |
| *G06V 40/13* | (2022.01) | |
| *H10K 59/121* | (2023.01) | |
| *H10K 59/131* | (2023.01) | |
| *H10K 59/65* | (2023.01) | |

(52) U.S. Cl.
CPC ......... *H10K 59/65* (2023.02); *G06V 40/1306* (2022.01); *H10K 59/1213* (2023.02); *H10K 59/131* (2023.02)

(58) Field of Classification Search
CPC .. H10K 59/65; H10K 59/131; H10K 59/1213; H10K 65/00; G06V 40/1306; G06F 3/0412
USPC ........................................ 345/207
See application file for complete search history.

(56) References Cited

U.S. PATENT DOCUMENTS

| | | | |
|---|---|---|---|
| 9,257,493 B2 | 2/2016 | Lee et al. | |
| 11,079,871 B2 | 8/2021 | Sun et al. | |
| 11,287,911 B2 | 3/2022 | Kang et al. | |
| 2012/0182277 A1* | 7/2012 | Jeong | G06F 3/0412 345/207 |
| 2021/0158751 A1* | 5/2021 | Cha | H10K 65/00 |

FOREIGN PATENT DOCUMENTS

| | | |
|---|---|---|
| KR | 10-1980757 | 5/2019 |
| KR | 10-1997423 | 7/2019 |
| KR | 10-2448031 | 9/2022 |

* cited by examiner

*Primary Examiner* — Abdul-Samad A Adediran
(74) *Attorney, Agent, or Firm* — F. CHAU & ASSOCIATES, LLC

(57) ABSTRACT

A display device including: a base layer; a circuit layer disposed on the base layer; and an element layer disposed on the circuit layer, the element layer including a light emitting element and a light receiving element, wherein the circuit layer includes: a pixel drive circuit connected to the light emitting element; a sensor drive circuit connected to the light receiving element; a data wire connected to the pixel drive circuit; a readout wire connected to the sensor drive circuit; and a shielding electrode wire overlapping the readout wire on a plane.

27 Claims, 31 Drawing Sheets

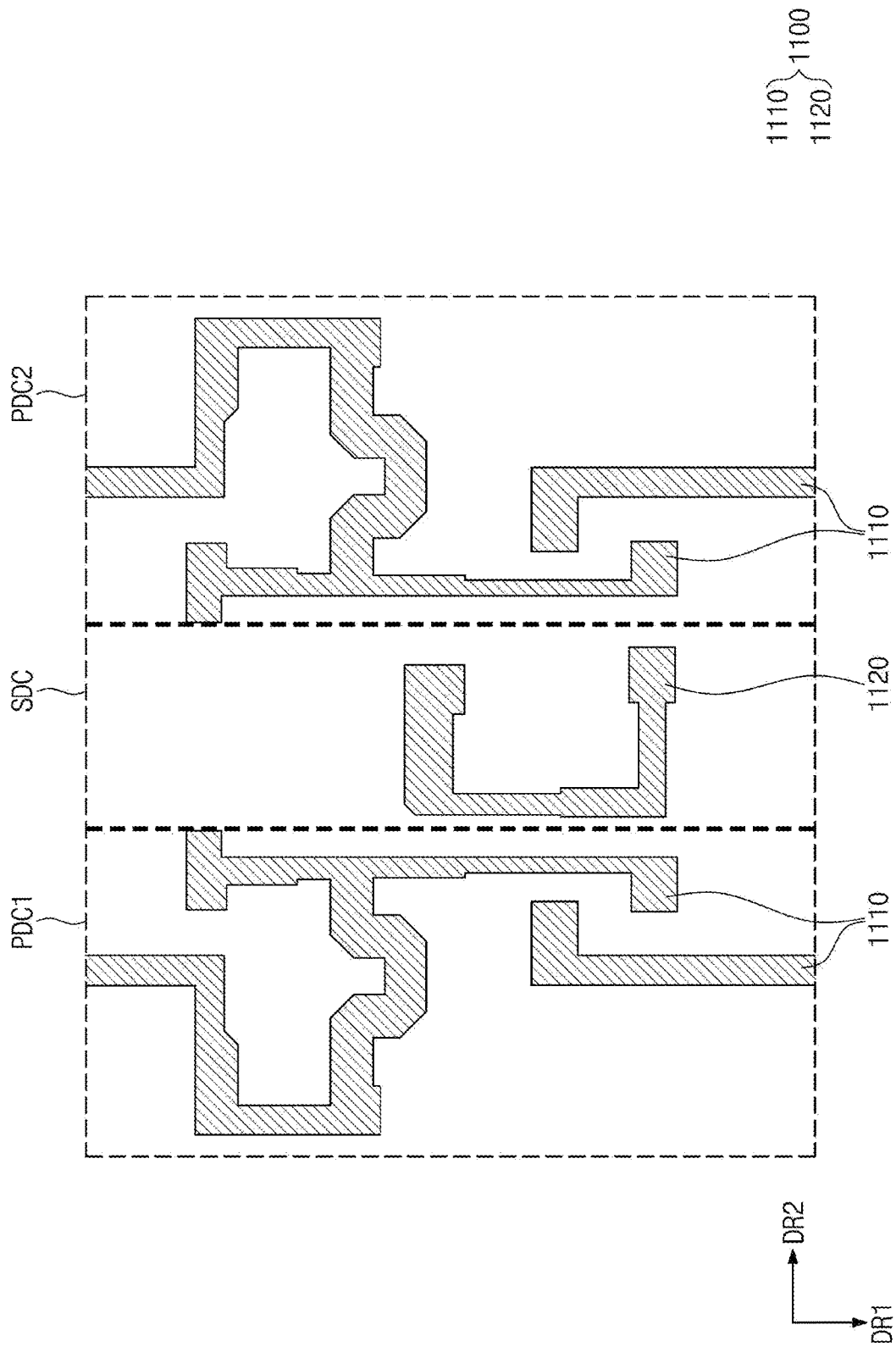

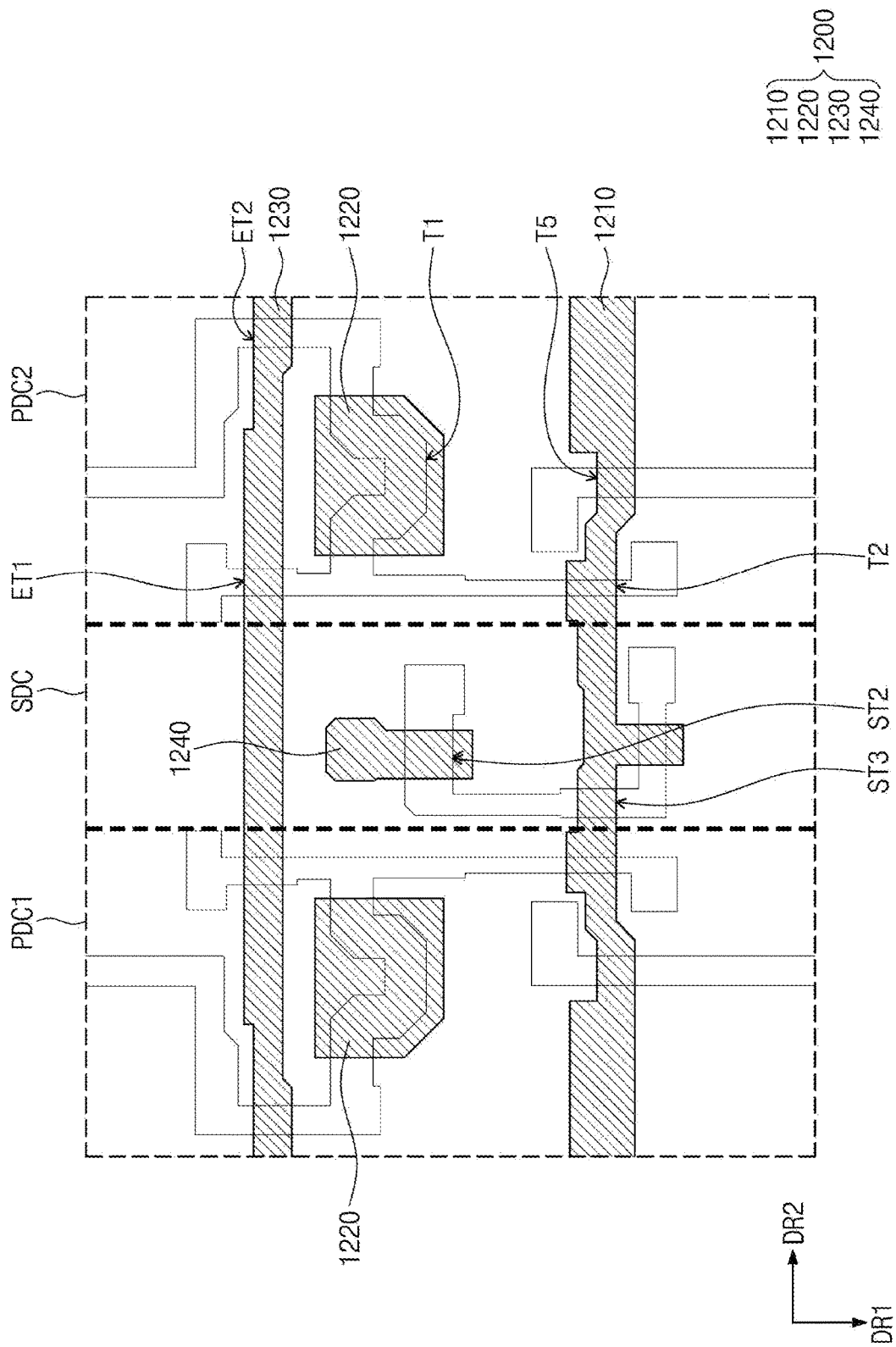

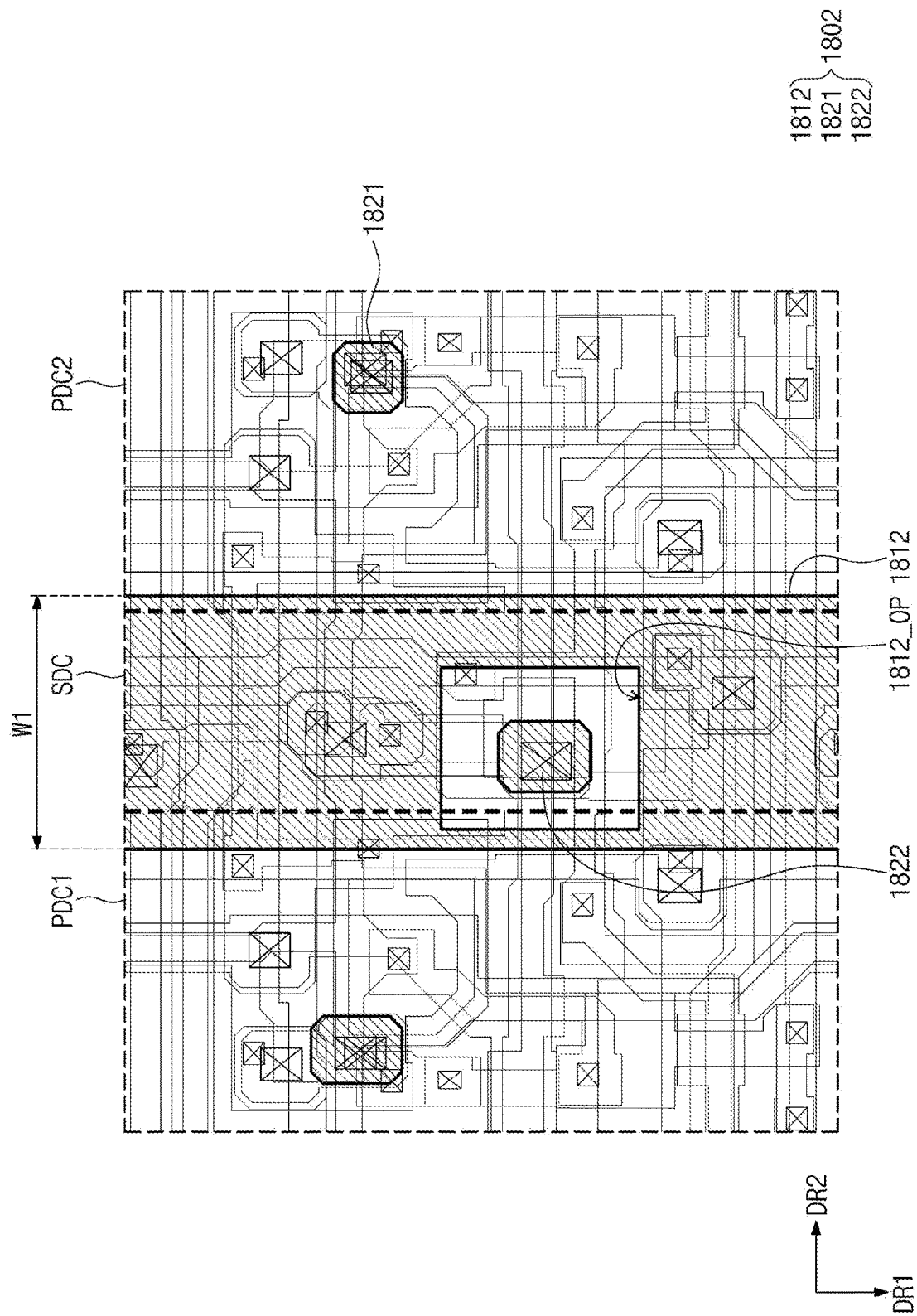

DISPLAY DEVICE

CROSS-REFERENCE TO RELATED APPLICATION

This application claims priority under 35 U.S.C. § 119 to Korean Patent Application No. 10-2022-0133528 filed on Oct. 17, 2022, in the Korean Intellectual Property Office, the disclosure of which is incorporated by reference herein in its entirety.

TECHNICAL FIELD

Embodiments of the present disclosure described herein relate to a display device, and more particularly, to a display device that can recognize biometric information.

DISCUSSION OF RELATED ART

Display devices offer various functions that facilitate user interaction, such as displaying information through images or detecting user input. More recently, some display devices also integrate biometric sensing capabilities.

Capacitive sensing, light sensing, and ultrasonic sensing techniques can be utilized to recognize biometric information. Capacitive sensing measures changes in capacitance between electrodes, light sensing uses an optical sensor to detect incident light, and ultrasonic sensing employs a piezoelectric element to detect vibration.

SUMMARY

Embodiments of the present disclosure provide a display device that enhances sensing performance of a sensor for biometric information recognition.

According to an embodiment of the present disclosure, there is provided a display device including: a base layer; a circuit layer disposed on the base layer; and an element layer disposed on the circuit layer, the element layer including a light emitting element and a light receiving element, wherein the circuit layer includes: a pixel drive circuit connected to the light emitting element; a sensor drive circuit connected to the light receiving element; a data wire connected to the pixel drive circuit; a readout wire connected to the sensor drive circuit; and a shielding electrode wire overlapping the readout wire on a plane.

According to an embodiment of the present disclosure, there is provided a display device including: a base layer; a circuit layer disposed on the base layer; and an element layer disposed on the circuit layer, the element layer including a light emitting element and a light receiving element, wherein the circuit layer includes: a pixel drive circuit connected to the light emitting element; a sensor drive circuit connected to the light receiving element; and a shielding electrode pattern overlapping the sensor drive circuit on a plane.

BRIEF DESCRIPTION OF THE DRAWINGS

The above and other features of the present disclosure will become apparent by describing in detail embodiments thereof with reference to the accompanying drawings.

FIGS. 7A, 7B, 7C, 7D, 7E, 7F, 7G, 7H and 7I are plan views illustrating an arrangement order of conductive patterns included in a circuit layer according to an embodiment of the present disclosure.

FIGS. 8A and 8B are plan views illustrating shielding electrode wires according to embodiments of the present disclosure.

DETAILED DESCRIPTION OF THE EMBODIMENTS

Figure 1:
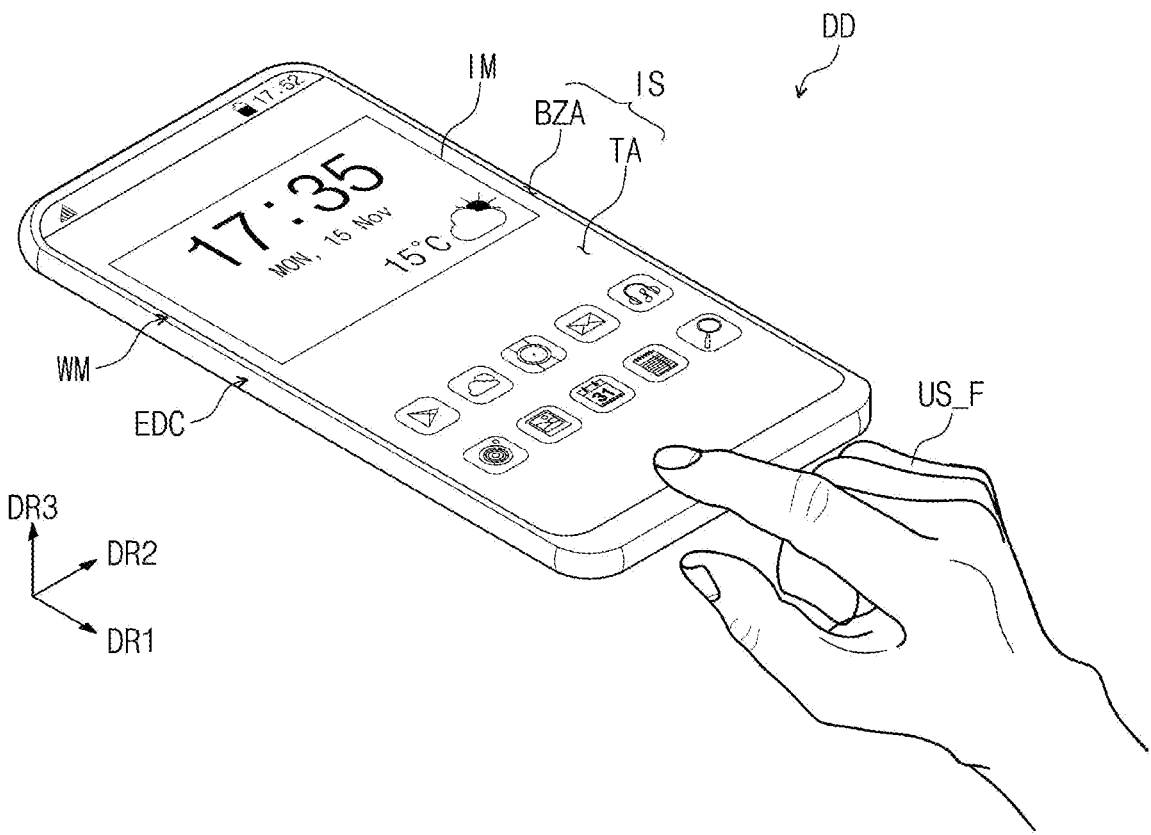
FIG. 1 is a perspective view of a display device according to an embodiment of the present disclosure.

In this specification, when a component (or, a region, a layer, a part, etc.) is referred to as being "on", "connected to" or "coupled to" another component, this may mean that the component is directly on, connected to, or coupled to the other component or a third component is present therebetween.

Identical reference numerals may refer to identical components. Additionally, in the drawings, the thicknesses, proportions, and dimensions of components may be exaggerated for effective description. As used herein, the term "and/or" includes all of one or more combinations defined by related components.

Terms such as first, second, and the like may be used to describe various components, but the components should not be limited by the terms. These terms may be used to distinguish one component from other components. For example, a first component may be referred to as a second component, and similarly, the second component may be referred to as the first component. The terms of a singular form may include plural forms unless otherwise specified.

In addition, terms such as "below", "under", "above", and "over" are used to describe a relationship of components illustrated in the drawings. These terms are relative concepts and are described based on directions illustrated in the particular drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described with reference to the accompanying drawings.

Figure 2:
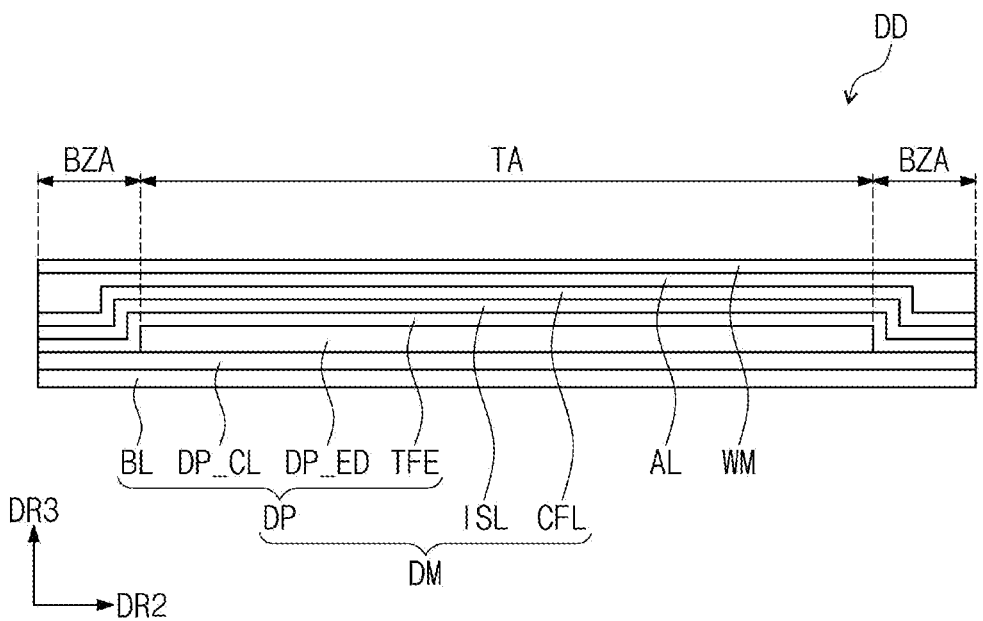
FIG. 2 is a sectional view of the display device according to an embodiment of the present disclosure.

FIG. 1 is a perspective view of a display device according to an embodiment of the present disclosure. FIG. 2 is a sectional view of the display device according to an embodiment of the present disclosure.

Referring to FIGS. 1 and 2, the display device DD according to an embodiment of the present disclosure may have a rectangular shape with long sides parallel to a first direction DR1 and short sides parallel to a second direction DR2 crossing the first direction DR1. However, without being limited thereto, the display device DD may have various shapes such as a circular shape, a polygonal shape, and the like.

The display device DD may be a device activated in response to an electrical signal. The display device DD may include various implementations. For example, the display device DD may be applied to an electronic device such as a smart watch, a tablet computer, a notebook computer, a computer, a smart television, or the like.

Hereinafter, a normal direction substantially perpendicular to a plane formed by the first direction DR1 and the second direction DR2 is referred to as a third direction DR3. The expression "when viewed on the plane" used herein may mean that it is viewed in the third direction DR3.

An upper surface of the display device DD may be a display surface IS and may be parallel to the plane formed by the first direction DR1 and the second direction DR2. Images IM generated by the display device DD may be provided to a user through the display surface IS.

The display surface IS may be divided into a transmissive region TA and a bezel region BZA. The transmissive region TA may be a region on which the images IM are displayed. For example, a user visually recognizes the images IM through the transmissive region TA. In this embodiment, the transmissive region TA is illustrated in a rounded rectangular shape. However, this is illustrative, and the transmissive region TA may have various shapes and is not limited to any one shape.

The bezel region BZA is adjacent to the transmissive region TA. The bezel region BZA may have a predetermined color. The bezel region BZA may surround the transmissive region TA. Accordingly, the shape of the transmissive region TA may be substantially formed by the bezel region BZA. However, this is illustrative, and the bezel region BZA may be disposed adjacent to only one side of the transmissive region TA, or may be omitted.

The display device DD may sense an external input applied from the outside. The external input may include various forms of inputs provided from outside the display device DD. For example, the external input may include not only contact by a body part such as a hand US_F of the user or contact by a separate device (e.g., an active pen or a digitizer) but also an external input (e.g., hovering) that is in proximity to the display device DD or adjacent to the display device DD at a predetermined distance. Furthermore, the external input may have various forms such as force, pressure, temperature, light, and the like.

The display device DD may sense the user's biometric information applied from the outside. A biometric information sensing region capable of sensing the user's biometric information may be provided on the display surface IS of the display device DD. The biometric information sensing region may be provided in the entire region of the transmissive region TA, or may be provided in a partial region of the transmissive region TA. In other words, the entire transmissive region TA can be used to sense the user's biometric information or just a portion of the transmissive region TA can be used to sense the user's biometric information. FIG. 1 illustrates one example in which the entire transmissive region TA is used as the biometric information sensing region.

The display device DD may include a window WM, a display module DM, and a housing EDC. In this embodiment, the window WM and the housing EDC are coupled to form the exterior of the display device DD.

A front surface of the window WM forms the display surface IS of the display device DD. The window WM may include an optically clear insulating material. For example, the window WM may include glass or plastic. The window WM may have a multi-layer structure or a single-layer structure. For example, the window WM may include a plurality of plastic films coupled through an adhesive, or may include a glass substrate and a plastic film coupled through an adhesive.

The display module DM may include a display panel DP and an input sensing layer ISL. The display panel DP may display an image in response to an electrical signal, and the input sensing layer ISL may sense an external input applied from the outside. The external input may be provided in various forms.

The display panel DP according to an embodiment of the present disclosure may be an emissive display panel, but is not particularly limited. For example, the display panel DP may be an organic light emitting display panel, an inorganic light emitting display panel, or a quantum-dot light emitting display panel. An emissive layer of the organic light emitting display panel may include an organic light emitting material, and an emissive layer of the inorganic light emitting display panel may include an inorganic light emitting material. An emissive layer of the quantum-dot light emitting display panel may include quantum dots and quantum rods. Hereinafter, the display panel DP will be described as an organic light emitting display panel.

Referring to FIG. 2, the display panel DP includes a base layer BL, a circuit layer DP_CL, an element layer DP_ED, and an encapsulation layer TFE. The display panel DP according to the present disclosure may be a flexible display panel. However, the present disclosure is not limited thereto. For example, the display panel DP may be a foldable display panel that is folded about a folding axis, or a rigid display panel.

The base layer BL may include a synthetic resin layer. The synthetic resin layer may be a polyimide-based resin layer, and the material thereof is not particularly limited. In addition, the base layer BL may include a glass substrate, a metal substrate, or an organic/inorganic composite substrate.

The circuit layer DP_CL may be disposed on the base layer BL. The circuit layer DP_CL is disposed between the base layer BL and the element layer DP_ED. The circuit layer DP_CL includes at least one insulating layer and a circuit element. Hereinafter, the insulating layer included in the circuit layer DP_CL is referred to as the intermediate insulating layer. The intermediate insulating layer includes at least one intermediate inorganic film and at least one intermediate organic film. The circuit element may include a pixel drive circuit included in each of a plurality of pixels for displaying an image and a sensor drive circuit included in each of a plurality of sensors for recognizing external information. The external information may be biometric information. In an embodiment of the present disclosure, the sensor may be a fingerprint recognition sensor, a proximity sensor, an iris recognition sensor, a blood pressure measurement sensor, an illuminance sensor, or the like. Furthermore, the sensor may be an optical sensor for optically recognizing biometric information. The circuit layer DP_CL may further include signal lines connected to the pixel drive circuit and/or the sensor drive circuit.

The element layer DP_ED may include a light emitting element included in each of the pixels and a light receiving element included in each of the sensors. In an embodiment of the present disclosure, the light receiving element may be a photo diode. The light receiving element may be a sensor that senses, or reacts to, light reflected by a fingerprint of the user. The circuit layer DP_CL and the element layer DP_ED will be described below in detail with reference to FIGS. 6 and 7A to 7I.

The encapsulation layer TFE seals the element layer DP_ED. The encapsulation layer TFE may include at least one organic film and at least one inorganic film. The inorganic film may include an inorganic material and may protect the element layer DP_ED from moisture/oxygen. The inorganic film may include, but is not particularly limited to, a silicon nitride layer, a silicon oxy-nitride layer, a silicon oxide layer, a titanium oxide layer, or an aluminum oxide layer. The organic film may include an organic material and may protect the element layer DP_ED from foreign matter such as dust particles.

The input sensing layer ISL may be formed on the display panel DP. The input sensing layer ISL may be directly disposed on the encapsulation layer TFE. According to an embodiment of the present disclosure, the input sensing layer ISL may be formed on the display panel DP by a continuous process. In other words, when the input sensing layer ISL is directly disposed on the display panel DP, an adhesive film is not disposed between the input sensing layer ISL and the encapsulation layer TFE. Alternatively, an adhesive film may be disposed between the input sensing layer ISL and the display panel DP. In this case, the input sensing layer ISL may not be manufactured together with the display panel DP by a continuous process and may be manufactured separately from the display panel DP and then fixed to an upper surface of the display panel DP by the adhesive film.

The input sensing layer ISL may sense an external input (e.g., a touch of the user), may change the sensed external input to a predetermined input signal, and may provide the input signal to the display panel DP. In other words, the input sensing layer ISL is capable of detecting external inputs such as a user's touch, converting the detected input into a predefined input signal, and transmitting the input signal to the display panel DP. The input sensing layer ISL may include a plurality of sensing electrodes for sensing the external input. The sensing electrodes may sense the external input in a capacitive manner. The display panel DP may receive the input signal from the input sensing layer ISL and may generate an image corresponding to the input signal.

The display module DM may further include a color filter layer CFL. In an embodiment of the present disclosure, the color filter layer CFL may be disposed on the input sensing layer ISL. For example, the color filter layer CFL may be in direct contact with the input sensing layer ISL. However, the present disclosure is not limited thereto. The color filter layer CFL may be disposed between the display panel DP and the input sensing layer ISL. The color filter layer CFL may include a plurality of color filters and a black matrix.

The structures of the input sensing layer ISL and the color filter layer CFL will be described below in detail.

The display device DD according to an embodiment of the present disclosure may further include an adhesive layer AL. The window WM may be attached to the input sensing layer ISL by the adhesive layer AL. The adhesive layer AL may include an optically clear adhesive, an optically clear adhesive resin, or a pressure sensitive adhesive (PSA).

The housing EDC is coupled with the window WM. The housing EDC is coupled with the window WM to provide a predetermined inner space. The display module DM may be accommodated in the inner space. The housing EDC may include a material having a relatively high stiffness. For example, the housing EDC may include glass, plastic, or metal, or may include a plurality of frames and/or plates formed of a combination thereof. The housing EDC may stably protect components of the display device DD accommodated in the inner space from an external impact. A battery module for supplying power required for the operation of the display device DD may also be disposed between the display module DM and the housing EDC.

Figure 3:
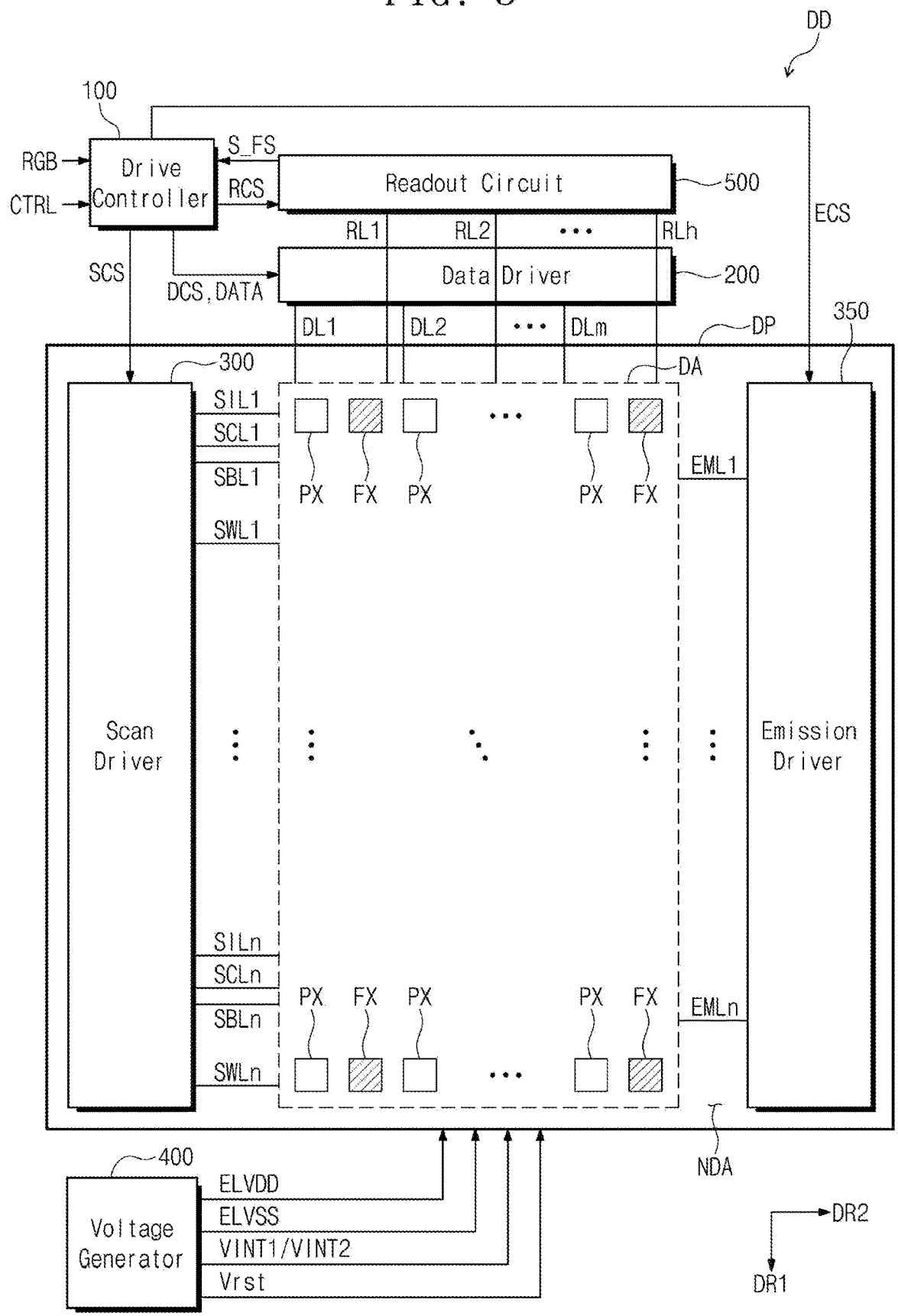
FIG. 3 is a block diagram of the display device according to an embodiment of the present disclosure.

FIG. 3 is a block diagram of the display device according to an embodiment of the present disclosure.

Referring to FIG. 3, the display device DD includes the display panel DP, a panel driver, and a drive controller 100. In an embodiment of the present disclosure, the panel driver includes a data driver 200, a scan driver 300, an emission driver 350, a voltage generator 400, and a readout circuit 500.

The drive controller 100 receives an image signal RGB and a control signal CTRL. The drive controller 100 generates an image data signal DATA by converting the data format of the image signal RGB according to the specification of an interface with the data driver 200. The drive controller 100 outputs a first control signal SCS, a second control signal ECS, a third control signal DCS, and a fourth control signal RCS.

The data driver 200 receives the third control signal DCS and the image data signal DATA from the drive controller 100. The data driver 200 converts the image data signal DATA into data signals and outputs the data signals to a plurality of data lines DL1 to DLm to be described below. The data signals are analog voltages corresponding to the gray level value of the image data signal DATA. In other words, the data signals are represented by analog voltages that correspond to the gray level value of the image data signal DATA.

The scan driver 300 receives the first control signal SCS from the drive controller 100. The scan driver 300 may output scan signals to scan lines in response to the first control signal SCS.

The voltage generator 400 generates voltages required for operation of the display panel DP. In this embodiment, the voltage generator 400 generates a first drive voltage ELVDD, a second drive voltage ELVSS, a first initialization voltage VINT1, and a second initialization voltage VINT2.

The display panel DP may include a display region DA corresponding to the transmissive region TA (illustrated in FIG. 1) and a non-display region NDA corresponding to the bezel region BZA (illustrated in FIG. 1).

The display panel DP may include a plurality of pixels PX disposed in the display region DA and a plurality of sensors FX disposed in the display region DA. In an embodiment of the present disclosure, each of the plurality of sensors FX may be disposed between two pixels PX adjacent to each other. The plurality of pixels PX and the plurality of sensors FX may be alternately disposed in the first and second directions DR1 and DR2. However, the present disclosure is not limited thereto. In other words, two or more pixels PX may be disposed between two sensors FX adjacent to each other in the first direction DR1 among the plurality of sensors FX, or two or more pixels PX may be disposed between two sensors FX adjacent to each other in the second direction DR2 among the plurality of sensors FX.

The display panel DP further includes initialization scan lines SIL1 to SILn, compensation scan lines SCL1 to SCLn, write scan lines SWL1 to SWLn, black scan lines SBL1 to SBLn, emission control lines EML1 to EMLn, the data lines DL1 to DLm, and readout lines RL1 to RLh. The initialization scan lines SIL1 to SILn, the compensation scan lines SCL1 to SCLn, the write scan lines SWL1 to SWLn, the black scan lines SBL1 to SBLn, and the emission control lines EML1 to EMLn extend in the second direction DR2. The initialization scan lines SIL1 to SILn, the compensation scan lines SCL1 to SCLn, the write scan lines SWL1 to SWLn, the black scan lines SBL1 to SBLn, and the emission control lines EML1 to EMLn may be spaced apart from each other in the first direction DR1. The data lines DL1 to DLm and the readout lines RL1 to RLh extend in the first direction DR1 and are arranged in the second direction DR2 to be spaced apart from each other.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the emission control lines EML1 to EMLn, and the data lines DL1 to DLm, respectively. For example, each of the plurality of pixels PX may be electrically connected to four scan lines. However, without being limited thereto, the number of scan lines connected to each pixel PX may be changed.

The plurality of sensors FX are electrically connected to the write scan lines SWL1 to SWLn and the readout lines RL1 to RLh, respectively. Each of the plurality of sensors FX may be electrically connected to one scan line. However, the present disclosure is not limited thereto. The number of scan lines connected to each sensor FX may be varied. In an embodiment of the present disclosure, the number of readout lines RL1 to RLh may be smaller than or equal to the number of data lines DL1 to DLm. For example, the number of readout lines RL1 to RLh may correspond to ½, ¼, or ⅛ of the number of data lines DL1 to DLm.

The scan driver 300 may be disposed in the non-display region NDA of the display panel DP. The scan driver 300 receives the first control signal SCS from the drive controller 100. In response to the first control signal SCS, the scan driver 300 outputs initialization scan signals to the initialization scan lines SIL1 to SILn and outputs compensation scan signals to the compensation scan lines SCL1 to SCLn.

Furthermore, in response to the first control signal SCS, the scan driver 300 may output write scan signals to the write scan lines SWL1 to SWLn and may output black scan signals to the black scan lines SBL1 to SBLn. Alternatively, the scan driver 300 may include first and second scan drivers. The first scan driver may output the initialization scan signals and the compensation scan signals, and the second scan driver may output the write scan signals and the black scan signals.

The emission driver 350 may be disposed in the non-display region NDA of the display panel DP. The emission driver 350 receives the second control signal ECS from the drive controller 100. The emission driver 350 may output emission control signals to the emission control lines EML1 to EMLn in response to the second control signal ECS. Alternatively, the scan driver 300 may be connected to the emission control lines EML1 to EMLn. In this case, the emission driver 350 may be omitted, and the scan driver 300 may output the emission control signals to the emission control lines EML1 to EMLn.

The readout circuit 500 receives the fourth control signal RCS from the drive controller 100. In response to the fourth control signal RCS, the readout circuit 500 may receive sensing signals from the readout lines RL1 to RLh. The readout circuit 500 may generate sensing signals S_FS by processing the readout signals received from the readout lines RL1 to RLh and may provide the generated sensing signals S_FS to the drive controller 100. The drive controller 100 may recognize biometric information based on the sensing signals S_FS.

Figure 4A:
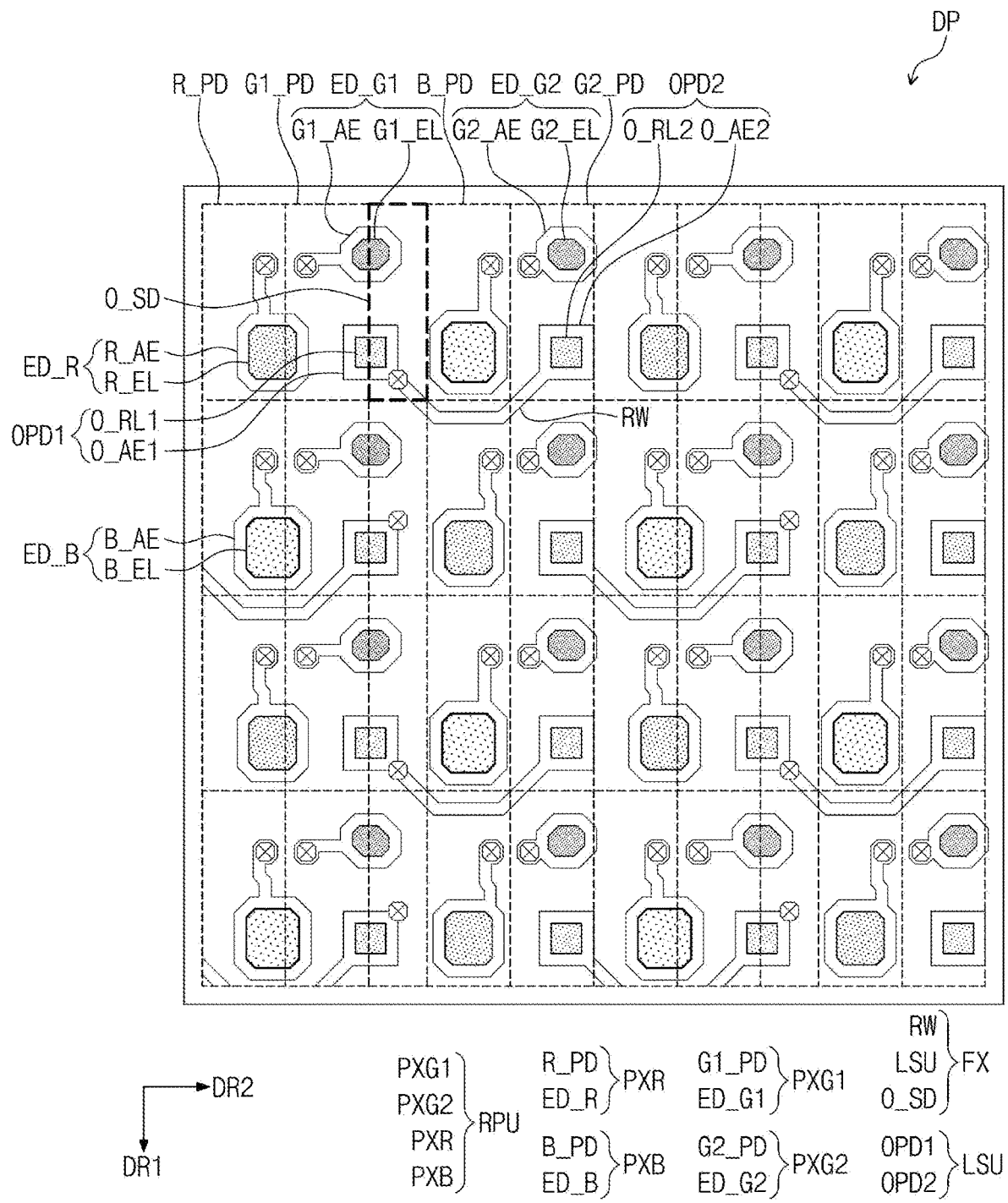
FIGS. 4A and 4B are enlarged plan views of partial regions of a display panel according to embodiments of the present disclosure.
Figure 4B:
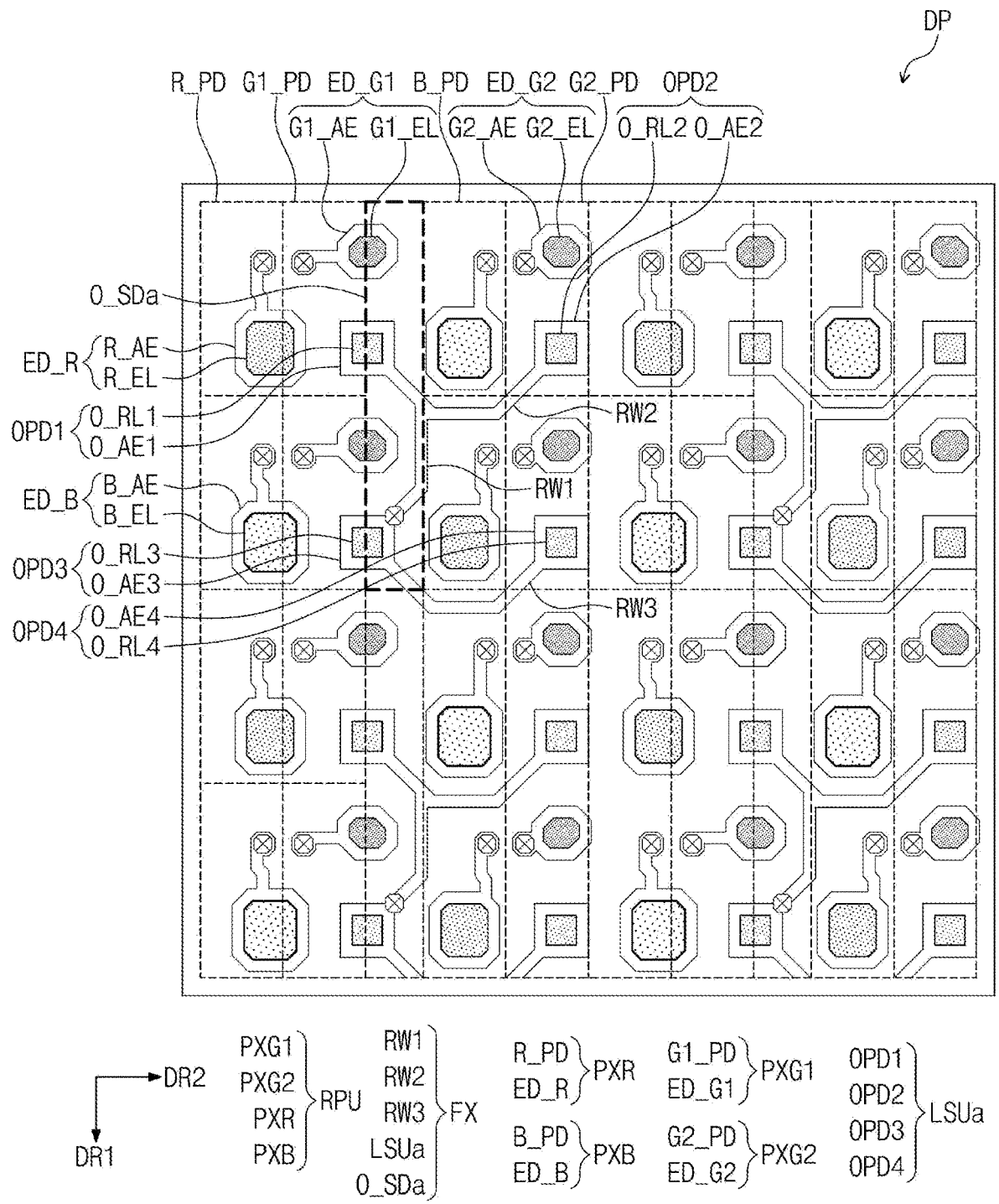

FIGS. 4A and 4B are enlarged plan views of partial regions of the display panel according to embodiments of the present disclosure.

Referring to FIG. 4A, the display panel DP includes a plurality of pixels PXR, PXG1, PXG2, and PXB and a plurality of sensors FX.

The plurality of pixels PXR, PXG1, PXG2, and PXB may be grouped into a plurality of reference pixel units RPU. In an embodiment of the present disclosure, each of the reference pixel units RPU may include four pixels, in other words, two first pixels PXG1 and PXG2 (hereinafter, referred to as the first and second green pixels), a third pixel PXR (hereinafter, referred to as the red pixel), and a fourth pixel PXB (hereinafter, referred to as the blue pixel). However, the number of pixels included in each reference pixel unit RPU is not limited thereto. Alternatively, each reference pixel unit RPU may include three pixels, in other words, the first green pixel PXG1 (or, the second green pixel PXG2), the red pixel PXR, and the blue pixel PXB.

The first and second green pixels PXG1 and PXG2 include first and second light emitting elements ED_G1 and ED_G2 (hereinafter, referred to as first and second green light emitting elements), the red pixel PXR includes a third light emitting element ED_R (hereinafter, referred to as a red light emitting element), and the blue pixel PXB includes a fourth light emitting element ED_B (hereinafter, referred to as a blue light emitting element). In an embodiment of the present disclosure, each of the first and second green light emitting elements ED_G1 and ED_G2 outputs first color light (e.g., green light), the red light emitting element ED_R outputs second color light (e.g., red light) different from the first color light, and the blue light emitting element ED_B outputs third color light (e.g., blue light) different from the first color light and the second color light. The green light output from the first green light emitting element ED_G1 may have the same wavelength band as the green light output from the second green light emitting element ED_G2.

The red light emitting elements ED_R and the blue light emitting elements ED_B may be alternately and repeatedly disposed in the first and second directions DR1 and DR2. The first and second green light emitting elements ED_G1 and ED_G2 are alternately and repeatedly disposed in the first direction DR1 and alternately and repeatedly disposed in the second direction DR2. The first and second green light emitting elements ED_G1 and ED_G2 may be disposed in rows and columns different from those of the red light emitting elements ED_R and the blue light emitting elements ED_B in the first and second directions DR1 and DR2.

In an embodiment of the present disclosure, the red light emitting element ED_R may have a larger size than each of the first and second green light emitting elements ED_G1 and ED_G2. Furthermore, the blue light emitting element ED_B may have a size greater than or equal to the size of the red light emitting element ED_R. The sizes of the light emitting elements ED_R, ED_G1, ED_G2, and ED_B are not limited thereto and may be diversely modified. For example, in an embodiment of the present disclosure, the light emitting elements ED_R, ED_G1, ED_G2, and ED_B may have the same size.

The first and second green light emitting elements ED_G1 and ED_G2 may have a shape different from those of the red and blue light emitting elements ED_R and ED_B. In an embodiment of the present disclosure, each of the red and blue light emitting elements ED_R and ED_B may have an octagonal shape that is longer in the first direction DR1 than in the second direction DR2. The red and blue light emitting elements ED_R and ED_B may have the same size or different sizes, but have the same shape. The shapes of the red and blue light emitting elements ED_R and ED_G are not limited thereto. For example, the red and blue light emitting elements ED_R and ED_G may have an octagonal shape having the same length in the first direction DR1 and the second direction DR2, or may have one of a square shape and a rectangular shape.

Each of the first and second green light emitting elements ED_G1 and ED_G2 may have an octagonal shape that is longer the second direction DR2 than in the first direction DR1. In an embodiment of the present disclosure, the first and second green light emitting elements ED_G1 and ED_G2 have the same size and shape. However, the shapes of the first and second green light emitting elements ED_G1 and ED_G2 are not limited thereto. The first and second green light emitting elements ED_G1 and ED_G2 may have an octagonal shape having the same length in the first direction DR1 and the second direction DR2, or may have one of a square shape and a rectangular shape.

The first green light emitting element ED_G1 is electrically connected to a first green pixel drive circuit G1_PD. Specifically, the first green light emitting element ED_G1 includes a first green anode electrode G1_AE and a first green light emitting layer G1_EL, and the first green anode electrode G1_AE is connected with the first green pixel drive circuit G1_PD through a contact hole. The second green light emitting element ED_G2 is electrically connected to a second green pixel drive circuit G2_PD. Specifically, the second green light emitting element ED_G2 includes a second green anode electrode G2_AE and a second green light emitting layer G2_EL, and the second green anode electrode G2_AE is connected with the second green pixel drive circuit G2_PD through a contact hole.

The first green light emitting layer G1_EL and the second green light emitting layer G2_EL may have the same size. The first green light emitting layer G1_EL and the second green light emitting layer G2_EL may have the same shape or different shapes. In an embodiment of the present disclosure, the first green light emitting layer G1_EL and the second green light emitting layer G2_EL may have different shapes on the same plane. The first green anode electrode G1_AE and the second green anode electrode G2_AE may have different sizes and shapes.

The red light emitting element ED_R is electrically connected to a red pixel drive circuit R_PD. Specifically, the red light emitting element ED_R includes a red anode electrode R_AE and a red light emitting layer R_EL, and the red anode electrode R_AE is connected with the red pixel drive circuit R_PD through a contact hole. The blue light emitting element ED_B is electrically connected to a blue pixel drive circuit B_PD. Specifically, the blue light emitting element ED_B includes a blue anode electrode B_AE and a blue light emitting layer B_EL, and the blue anode electrode B_AE is connected with the blue pixel drive circuit B_PD through a contact hole.

Each of the sensors FX includes a light sensing unit LSU and a sensor drive circuit O_SD. The light sensing unit LSU may include at least one light receiving element. In an embodiment of the present disclosure, the light sensing unit LSU includes k light receiving elements, and one of the k light receiving elements is connected to the sensor drive circuit O_SD. Here, k may be a natural number of 1 or larger. FIG. 4A illustrates one example that k is 2. When k is 2, the light sensing unit LSU includes two light receiving elements (hereinafter, referred to as first and second light receiving elements OPD1 and OPD2). In an embodiment of the present disclosure, the two light receiving elements (e.g., the first and second light receiving elements OPD1 and OPD2) may be disposed to correspond to one reference pixel unit RPU. However, the number of light receiving elements disposed to correspond to each reference pixel unit RPU is not limited thereto. For example, one light receiving element may be disposed to correspond to each reference pixel unit RPU.

Each of the first and second light receiving elements OPD1 and OPD2 is disposed between the red and blue light emitting elements ED_R and ED_B in the second direction DR2. Each of the first and second light receiving elements OPD1 and OPD2 may be disposed adjacent to the first green light emitting element ED_G1 or the second green light emitting element ED_G2 in the first direction DR1. In a first reference pixel unit row, the first light receiving element OPD1 and the first green light emitting element ED_G1 are adjacent to each other in the first direction DR1, and the second light receiving element OPD2 and the second green light emitting element ED_G2 are adjacent to each other in the first direction DR1. In a second reference pixel unit row, the first light receiving element OPD1 and the second green light emitting element ED_G2 are adjacent to each other in the first direction DR1, and the second light receiving element OPD2 and the first green light emitting element ED_G1 are adjacent to each other in the first direction DR1. In an embodiment of the present disclosure, each of the first and second light receiving elements OPD1 and OPD2 is disposed between the first and second green light emitting elements ED_G1 and ED_G2 adjacent to each other in the first direction DR1.

The first and second light receiving elements OPD1 and OPD2 may have the same size and shape. The first and second light receiving elements OPD1 and OPD2 may have a smaller size than the red and blue light emitting elements ED_R and ED_B. In an embodiment of the present disclosure, the first and second light receiving elements OPD1 and OPD2 may have a size that is the same as, or smaller than, the sizes of the first and second green light emitting elements ED_G1 and ED_G2. However, the sizes of the first and second light receiving elements OPD1 and OPD2 are not particularly limited and may be diversely modified. The first and second light receiving elements OPD1 and OPD2 may have a shape different from those of the red and blue light emitting elements ED_R and ED_B. In an embodiment of the present disclosure, the first and second light receiving elements OPD1 and OPD2 may have a square shape. The shapes of the first and second light receiving elements OPD1 and OPD2 are not limited thereto. Alternatively, the first and second light receiving elements OPD1 and OPD2 may have a rectangular shape that is longer in the first direction DR1 than in the second direction DR2.

The sensor drive circuit O_SD is connected to one of the first and second light receiving elements OPD1 and OPD2 (e.g., the first light receiving element OPD1). The sensor drive circuit O_SD may have the same length as red and blue pixel drive circuits R_PD and B_PD in the first direction DR1. The sensor drive circuit O_SD may overlap one of the first and second light receiving elements OPD1 and OPD2 (e.g., the first light receiving element OPD1) on a plane. The sensor drive circuit O_SD may overlap one of the first and second green light emitting elements ED_G1 and ED_G2 (e.g., the first green light emitting element ED_G1) on a plane.

The first light receiving element OPD1 includes a first sensing anode electrode O_AE1 and a first photoelectric conversion layer O_RL1, and the second light receiving element OPD2 includes a second sensing anode electrode O_AE2 and a second photoelectric conversion layer O_RL2. The first sensing anode electrode O_AE1 is directly connected with the sensor drive circuit O_SD through a contact hole.

Each of the sensors FX may further include a routing wire RW electrically connecting the first and second light receiving elements OPD1 and OPD2. The routing wire RW is electrically connected to the first sensing anode electrode O_AE1 of the first light receiving element OPD1 and the second sensing anode electrode O_AE2 of the second light receiving element OPD2. In an embodiment of the present disclosure, the routing wire RW may be integrally formed with the first sensing anode electrode O_AE1 and the second sensing anode electrode O_AE2.

The routing wire RW, the first sensing anode electrode O_AE1, and the second sensing anode electrode O_AE2 may be disposed on the same layer as the anode electrodes R_AE, G1_AE, G2_AE, and B_AE. In this case, the routing wire RW, the first sensing anode electrode O_AE1, and the second sensing anode electrode O_AE2 may include the same material as the anode electrodes R_AE, G1_AE, G2_AE, and B_AE and may be formed through the same process.

The first and second light receiving elements OPD1 and OPD2 may be connected to the sensor drive circuit O_SD in parallel by the routing wire RW. Accordingly, the first and second light receiving elements OPD1 and OPD2 may be simultaneously turned on, or may be simultaneously turned off, by the sensor drive circuit O_SD. The first light receiving element OPD1 connected to the sensor drive circuit O_SD may be referred to as a main light receiving element, and the second light receiving element OPD2 electrically connected with the first light receiving element OPD1 through the routing wire RW may be referred to as a dummy light receiving element.

When k is 4 as in FIG. 4B, a light sensing unit LSUa may include four light receiving elements (hereinafter, referred to as first to fourth light receiving elements OPD1, OPD2, OPD3, and OPD4). One of the first to fourth light receiving elements OPD1, OPD2, OPD3, and OPD4 (e.g., the third light receiving element OPD3) is connected to a sensor drive circuit O_SDa.

Each of sensors FX may further include three routing wires (hereinafter, referred to as first to third routing wires RW1, RW2, and RW3) that electrically connect the first to fourth light receiving elements OPD1, OPD2, OPD3, and OPD4. The first routing wire RW1 electrically connects two light receiving elements (in other words, the first and third light receiving elements OPD1 and OPD3) adjacent to each other in the first direction DR1 among the four light receiving elements OPD1, OPD2, OPD3, and OPD4. The second routing wire RW2 electrically connects two light receiving elements (in other words, the first and second light receiving elements OPD1 and OPD2) adjacent to each other in the second direction DR2 among the four light receiving elements OPD1, OPD2, OPD3, and OPD4. The first and second routing wires RW1 and RW2 may be integrally formed. The third routing wire RW3 electrically connects two light receiving elements (in other words, the third and fourth light receiving elements OPD3 and OPD4) adjacent to each other in the second direction DR2 among the four light receiving elements OPD1, OPD2, OPD3, and OPD4. The third light receiving element OPD3 directly connected to the sensor drive circuit O_SDa may be referred to as the main light receiving element, and the remaining first, second, and fourth light receiving elements OPD1, OPD2, and OPD4 may be referred to as the dummy light receiving elements.

The first light receiving element OPD1 includes a first sensing anode electrode O_AE1 and a first photoelectric conversion layer O_RL1, and the second light receiving element OPD2 includes a second sensing anode electrode O_AE2 and a second photoelectric conversion layer O_RL2. The third light receiving element OPD3 includes a third sensing anode electrode O_AE3 and a third photoelectric conversion layer O_RL3, and the fourth light receiving element OPD4 includes a fourth sensing anode electrode O_AE4 and a fourth photoelectric conversion layer O_RL4. The third sensing anode electrode O_AE3 is directly connected with the sensor drive circuit O_SDa through a contact hole. In the first direction DR1, the sensor drive circuit O_SDa may be longer than red and blue pixel drive circuits R_PD and B_PD. Accordingly, the sensor drive circuit O_SDa may overlap two light receiving elements (e.g., the first and third light receiving elements OPD1 and OPD3) among the first to fourth light receiving elements OPD1 to OPD4. The sensor drive circuit O_SDa may overlap two green light emitting elements (e.g., first and second green light emitting elements ED_G1 and ED_G2) on a plane. The sensor drive circuit O_SDa may also overlap portions of the first and third routing wires RW1 and RW3.

The first routing wire RW1 is electrically connected to the first sensing anode electrode O_AE1 and the third sensing anode electrode O_AE3, and the second routing wire RW2 is electrically connected to the first sensing anode electrode O_AE1 and the second sensing anode electrode O_AE2. The third routing wire RW3 is electrically connected to the third sensing anode electrode O_AE3 and the fourth sensing anode electrode O_AE4. In an embodiment of the present disclosure, the first to third routing wires RW1 to RW3 may be integrally formed with the first to fourth sensing anode electrodes O_AE1 to O_AE4.

The first to third routing wires RW1, RW2, and RW3 and the first to fourth sensing anode electrodes O_AE1 to O_AE4 may be disposed on the same layer as anode electrodes R_AE, G1_AE, G2_AE, and B_AE. In this case, the first to third routing wires RW1, RW2, and RW3 and the first to fourth sensing anode electrodes O_AE1 to O_AE4 may include the same material as the anode electrodes R_AE, G1_AE, G2_AE, and B_AE and may be formed through the same process.

The first to fourth light receiving elements OPD1, OPD2, OPD3, and OPD4 may be connected to the sensor drive circuit O_SDa in parallel by the first to third routing wires RW1, RW2, and RW3. Accordingly, the first to fourth light receiving elements OPD1, OPD2, OPD3, and OPD4 may be simultaneously turned on, or may be simultaneously turned off, by the sensor drive circuit O_SDa.

The sensor drive circuits O_SD and O_SDa may include a plurality of transistors. In an embodiment of the present disclosure, the sensor drive circuits O_SD and O_SDa and the pixel drive circuits R_PD, G1_PD, G2_PD, and B_PD may be simultaneously formed through the same process. Furthermore, the scan driver 300 (refer to FIG. 3) may include transistors formed through the same process as the sensor drive circuits O_SD and O_SDa and the pixel drive circuits R_PD, G1_PD, G2_PD, and B_PD.

Figure 5A:
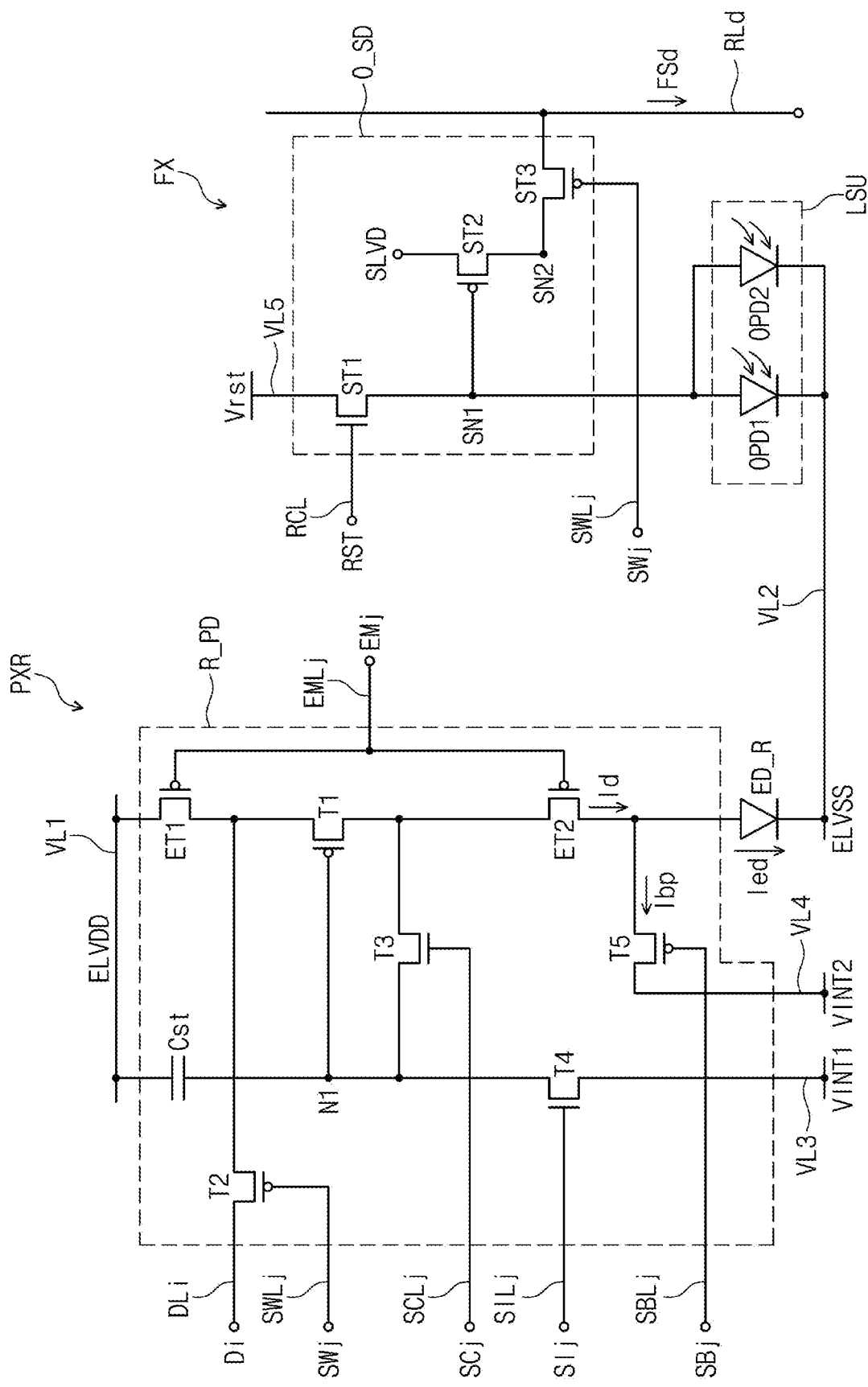
FIG. 5A is a circuit diagram illustrating a pixel and a sensor according to an embodiment of the present disclosure.
Figure 5B:
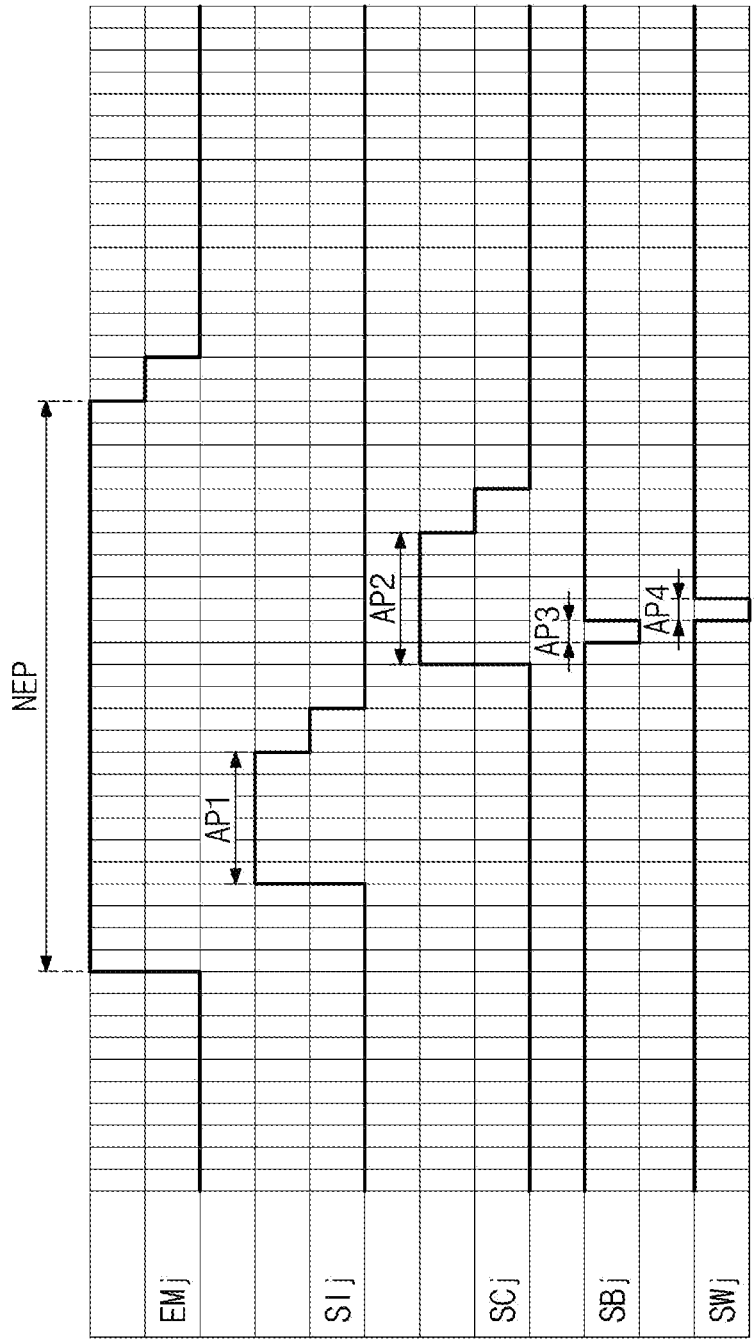
FIG. 5B is a waveform diagram for describing operations of the pixel and the sensor illustrated in FIG. 5A.

FIG. 5A is a circuit diagram illustrating a pixel and a sensor according to an embodiment of the present disclosure. FIG. 5B is a waveform diagram for describing operations of the pixel and the sensor illustrated in FIG. 5A.

FIG. 5A illustrates an equivalent circuit diagram of one pixel (e.g., the red pixel PXR) among the plurality of pixels PX illustrated in FIG. 3. The plurality of pixels PX have the same circuit structure. Therefore, the description of the circuit structure of the red pixel PXR may be applied to the remaining pixels, and detailed descriptions of the remaining pixels will be omitted. Furthermore, FIG. 5A illustrates an equivalent circuit diagram of one sensor FX among the plurality of sensors FX illustrated in FIG. 3. The plurality of sensors FX have the same circuit structure. Therefore, the description of the circuit structure of the sensor FX may be applied to the remaining sensors, and detailed descriptions of the remaining sensors will be omitted.

Referring to FIG. 5A, the red pixel PXR is connected to an i-th data line DLi among the data lines DL1 to DLm, a j-th initialization scan line SILj among the initialization scan lines SIL1 to SILn, a j-th compensation scan line SCLj among the compensation scan lines SCL1 to SCLn, a j-th write scan line SWLj among the write scan lines SWL1 to SWLn, a j-th black scan line SBLj among the black scan lines SBL1 to SBLn, and a j-th emission control line EMLj among the emission control lines EML1 to EMLn.

The red pixel PXR includes the red light emitting element ED_R and the red pixel drive circuit R_PD. The red light emitting element ED_R may be a light emitting diode. In an embodiment of the present disclosure, the red light emitting element ED_R may be an organic light emitting diode including an organic light emitting layer.

The red pixel drive circuit R_PD includes first to fifth transistors T1, T2, T3, T4, and T5, first and second emission control transistors ET1 and ET2, and one capacitor Cst. At least one of the first to fifth transistors T1, T2, T3, T4, and T5 and the first and second emission control transistors ET1 and ET2 may be a transistor having a low-temperature polycrystalline silicon (LTPS) semiconductor layer. Some of the first to fifth transistors T1, T2, T3, T4, and T5 and the first and second emission control transistors ET1 and ET2 may be P-type transistors, and the others of the first to fifth transistors T1, T2, T3, T4, and T5 and the first and second emission control transistors ET1 and ET2 may be N-type transistors. For example, the first, second, and fifth transistors T1, T2, and T5 and the first and second emission control transistors ET1 and ET2 may be PMOS transistors, and the third and fourth transistors T3 and T4 may be NMOS transistors. At least one of the first to fifth transistors T1, T2, T3, T4, and T5 and the first and second emission control transistors ET1 and ET2 may be a transistor having an oxide semiconductor layer. For example, the third and fourth transistors T3 and T4 may be oxide semiconductor transistors, and the first, second, and fifth transistors T1, T2, and T5 and the first and second emission control transistors ET1 and ET2 may be LTPS transistors.

The configuration of the red pixel drive circuit R_PD according to the present disclosure is not limited to the embodiment illustrated in FIG. 5A. The red pixel drive circuit R_PD illustrated in FIG. 5A is merely an example, and various changes and modifications can be made to the configuration of the red pixel drive circuit R_PD. For example, the first to fifth transistors T1, T2, T3, T4, and T5 and the first and second emission control transistors ET1 and ET2 may all be P-type transistors or N-type transistors.

The j-th initialization scan line SILj, the j-th compensation scan line SCLj, the j-th write scan line SWLj, the j-th black scan line SBLj, and the j-th emission control line EMLj may transfer a j-th initialization scan signal SIj, a j-th compensation scan signal SCj, a j-th write scan signal SWj, a j-th black scan signal SBj, and a j-th emission control signal EMj to the red pixel PXR, respectively. The i-th data line DLi transfers an i-th data signal Di to the red pixel PXR. The i-th data signal Di may have a voltage level corresponding to the image signal RGB (refer to FIG. 3) that is input to the display device DD (refer to FIG. 3).

A first drive voltage line VL1 and a second drive voltage line VL2 may transfer the first drive voltage ELVDD and the second drive voltage ELVSS to the red pixel PXR, respectively. Furthermore, a first initialization voltage line VL3 and a second initialization voltage line VL4 may transfer the first initialization voltage VINT and the second initialization voltage VINT2 to the red pixel PXR, respectively.

The first transistor T1 is connected between the first drive voltage line VL1 receiving the first drive voltage ELVDD and the red light emitting element ED_R. The first transistor T1 includes a first electrode connected with the first drive voltage line VL1 via the first emission control transistor ET1, a second electrode connected with the red anode electrode R_AE (refer to FIG. 4A) of the red light emitting element ED_R via the second emission control transistor ET2, and a third electrode (e.g., a gate electrode) connected with one end (e.g., a first node N1) of the capacitor Cst. The first transistor T1 may receive the i-th data signal Di that the i-th data line DLi transfers depending on a switching operation of the second transistor T2 and may supply a drive current Id to the red light emitting element ED_R.

The second transistor T2 is connected between the i-th data line DLi and the first electrode of the first transistor T1. The second transistor T2 includes a first electrode connected with the i-th data line DLi, a second electrode connected with the first electrode of the first transistor T1, and a third electrode (e.g., a gate electrode) connected with the j-th write scan line SWLj. The second transistor T2 may be turned on in response to the j-th write scan signal SWj transferred through the j-th write scan line SWLj and may transfer, to the first electrode of the first transistor T1, the i-th data signal Di transferred from the i-th data line DLi.

The third transistor T3 is connected between the second electrode of the first transistor T1 and the first node N1. For example, the third transistor T3 may be directly connected to the first and second electrodes of the first transistor T1. The third transistor T3 includes a first electrode connected with the third electrode of the first transistor T1, a second electrode connected with the second electrode of the first transistor T1, and a third electrode (e.g., a gate electrode) connected with the j-th compensation scan line SCLj. The third transistor T3 may be turned on in response to the j-th compensation scan signal SCj transferred through the j-th compensation scan line SCLj and may diode-connect the first transistor T1 by connecting the third electrode and the second electrode of the first transistor T1.

The fourth transistor T4 is connected between the first initialization voltage line VL3 through which the first initialization voltage VINT1 is applied and the first node N1. The fourth transistor T4 includes a first electrode connected with the first initialization voltage line VL3 through which the first initialization voltage VINT1 is transferred, a second electrode connected with the first node N1, and a third electrode (e.g., a gate electrode) connected with the j-th initialization scan line SILj. The fourth transistor T4 is turned on in response to the j-th initialization scan signal SIj transferred through the j-th initialization scan line SILj. The turned-on fourth transistor T4 initializes the potential of the third electrode of the first transistor T1 (in other words, the potential of the first node N1) by transferring the first initialization voltage VINT1 to the first node N1.

The first emission control transistor ET1 includes a first electrode connected with the first drive voltage line VL1, a second electrode connected with the first electrode of the first transistor T1, and a third electrode (e.g., a gate electrode) connected to the j-th emission control line EMLj.

The second emission control transistor ET2 includes a first electrode connected with the second electrode of the first transistor T1, a second electrode connected to the red anode electrode R_AE of the red light emitting element ED_R, and a third electrode (e.g., a gate electrode) connected to the j-th emission control line EMLj. The first electrode of the second emission control transistor ET2 is also connected to the second electrode of the third transistor T3.

The first and second emission control transistors ET1 and ET2 are simultaneously turned on in response to the j-th emission control signal EMj transferred through the j-th emission control line EMLj. The first drive voltage ELVDD applied through the turned-on first emission control transistor ET1 may be compensated for through the diode-connected first transistor T1 and may be transferred to the red light emitting element ED_R.

The fifth transistor T5 includes a first electrode connected to the second initialization voltage line VIA through which the second initialization voltage VINT2 is transferred, a second electrode connected with the second electrode of the second emission control transistor ET2 and the red anode electrode R_AE of the red light emitting element ED_R, and a third electrode (e.g., a gate electrode) connected with the j-th black scan line SBLj. The second initialization voltage VINT2 may have a voltage level lower than or equal to the voltage level of the first initialization voltage VINT1.

A first end of the capacitor Cst is connected with the third electrode of the first transistor T1 as described above, and a second end of the capacitor Cst is connected with the first drive voltage line VL1. A cathode electrode of the red light emitting element ED_R may be connected with the second drive voltage line VL2 that transfers the second drive voltage ELVSS. The second drive voltage ELVSS may have a lower voltage level than the first drive voltage ELVDD. In an embodiment of the present disclosure, the second drive voltage ELVSS may have a lower voltage level than the first and second initialization voltages VINT1 and VINT2.

Referring to FIGS. 5A and 5B, the j-th emission control signal EMj has a high level during a non-light emission period NEP and a low level when not in the non-light emission period NEP. Within the non-light emission period NEP, the j-th initialization scan signal SIj is activated. When the j-th initialization scan signal SIj having a high level is provided through the j-th initialization scan line SILj during an activation period AP1 of the j-th initialization scan signal SIj (hereinafter, referred to as a first activation period), the fourth transistor T4 is turned on in response to the j-th initialization scan signal SIj having the high level. The first initialization voltage VINT1 is transferred to the third electrode of the first transistor T1 through the turned-on fourth transistor T4, and the first node N1 is initialized to the first initialization voltage VINT1. Accordingly, the first activation period AP1 may be an initialization period of the red pixel PXR.

Next, the j-th compensation scan signal SCj is activated, and when the j-th compensation scan signal SCj having a high level is supplied through the j-th compensation scan line SCLj during an activation period AP2 of the j-th compensation scan signal SCj (hereinafter, referred to as a second activation period), the third transistor T3 is turned on. The first transistor T1 is diode-connected by the turned-on third transistor T3 and is forward-biased. The first activation period AP1 may not overlap the second activation period AP2. In other words, the j-th compensation scan signal SCj having the high level does not overlap the j-th initialization scan signal SIj having the high level.

Within the second activation period AP2, the j-th write scan signal SWj is activated. The j-th write scan signal SWj has a low level during an activation period AP4 (hereinafter, referred to as a fourth activation period). During the fourth activation period AP4, the second transistor T2 is turned on by the j-th write scan signal SWj having the low level. Then, a compensation voltage "Di-Vth" obtained by subtracting a threshold voltage Vth of the first transistor T1 from the i-th data signal Di supplied from the i-th data line DLi is applied to the third electrode of the first transistor T1. In other words, the potential of the third electrode of the first transistor T1 may be the compensation voltage "Di-Vth". The fourth activation period AP4 may overlap the second activation period AP2. The duration of the second activation period AP2 may be greater than the duration of the fourth activation period AP4.

The first drive voltage ELVDD and the compensation voltage "Di-Vth" may be applied to the opposite (e.g., first and second) ends of the capacitor Cst, and charges corresponding to a difference between voltages at the opposite ends of the capacitor Cst may be stored in the capacitor Cst. Here, the period during which the j-th compensation scan signal SCj has the high level may be referred to as a compensation period of the red pixel PXR.

The j-th black scan signal SBj may also be activated within the second activation period AP2 of the j-th compensation scan signal SCj. The j-th black scan signal SBj has a low level during an activation period AP3 (hereinafter, referred to as a third activation period). During the third activation period AP3, the fifth transistor T5 is turned on by receiving the j-th black scan signal SBj having the low level through the j-th black scan line SBLj. A portion of the drive current Id may escape through the fifth transistor T5 as a bypass current Ibp. The third activation period AP3 may overlap the second activation period AP2. The duration of the second activation period AP2 may be greater than the duration of the third activation period AP3. The third activation period AP3 may precede the fourth activation period AP4 and may not overlap the fourth activation period AP4.

When the red pixel PXR displays a black image, the red pixel PXR cannot normally display the black image if the red light emitting element ED_R emits light even though the minimum drive current of the first transistor T1 flows as the drive current Id. Accordingly, the fifth transistor T5 in the red pixel PXR according to an embodiment of the present disclosure may distribute a portion of the minimum drive current of the first transistor T1 as the bypass current Ibp to a current path other than the current path toward the red light emitting element ED_R. Here, the minimum drive current of the first transistor T1 is a current flowing to the first transistor T1 under the condition that a gate-source voltage Vgs of the first transistor T1 is lower than the threshold voltage Vth so that the first transistor T1 is turned off. The minimum drive current (e.g., a current of 10 pA or less) flowing to the first transistor T1 under the condition that the first transistor T1 is turned off is transferred to the red light emitting element ED_R, and a black gray-scale image is displayed. When the red pixel PXR displays a black image, an influence of the bypass current Ibp on the minimum drive current is relatively great, whereas when the red pixel PXR displays an image such as a normal image or a white image, the bypass current Ibp has little influence on the drive current Id. Accordingly, when the red pixel PXR displays a black image, a current obtained by subtracting the bypass current Ibp escaping through the fifth transistor T5 from the drive current Id (in other words, an emission current Ied) may be provided to the red light emitting element ED_R so that the black image may be clearly expressed. Thus, the red pixel PXR may implement an accurate black gray-scale image using the fifth transistor T5. As a result, the contrast ratio may be improved.

After that, the j-th emission control signal EMj supplied from the j-th emission control line EMLj is changed from the high level to a low level. The first and second emission control transistors ET1 and ET2 are turned on by the j-th emission control signal EMj having the low level. Then, the drive current Id depending on a difference between the voltage of the third electrode of the first transistor T1 and the first drive voltage ELVDD is generated, the drive current Id is supplied to the red light emitting element ED_R through the second emission control transistor ET2, and the emission current Ied flows through the red light emitting element ED_R.

Referring again to FIG. 5A, the sensor FX is connected to a d-th readout line RLd among the readout lines RL1 to RLh, the j-th write scan line SWLj, and a reset control line RCL.

The sensor FX includes the light sensing unit LSU and the sensor drive circuit O_SD. The light sensing unit LSU may include k light receiving elements connected in parallel. When k is 2, the first and second light receiving elements OPD1 and OPD2 may be connected with each other in parallel. When k is 4, the first to fourth light receiving elements OPD1 to OPD4 (refer to FIG. 4B) may be connected in parallel. Each of the first and second light receiving elements OPD1 and OPD2 may be a photo diode. In an embodiment of the present disclosure, each of the first and second light receiving elements OPD1 and OPD2 may be an organic photo diode that includes an organic material as a photoelectric conversion layer.

The first and second sensing anode electrodes O_AE1 and O_AE2 of the first and second light receiving elements OPD1 and OPD2 (refer to FIG. 4A) may be connected to a first sensing node SN1, and first and second sensing cathode electrodes of the first and second light receiving elements OPD1 and OPD2 may be connected with the second drive voltage line VL2 that transfers the second drive voltage ELVSS. The first and second sensing cathode electrodes may be electrically connected with cathode electrodes of the light emitting elements ED_R, ED_G1, ED_G2, and ED_B (refer to FIG. 4A). In an embodiment of the present disclosure, the first and second sensing cathode electrodes may be integrally formed with the cathode electrodes of the light emitting elements ED_R, ED_G1, ED_G2, and ED_B to form a common cathode electrode C_CE (refer to FIG. 6).

The sensor drive circuit O_SD includes three transistors ST1, ST2, and ST3. The three transistors ST1, ST2, and ST3 may be a reset transistor ST1, an amplifying transistor ST2, and an output transistor ST3. At least one of the reset transistor ST1, the amplifying transistor ST2, and the output transistor ST3 may be an oxide semiconductor transistor. In an embodiment of the present disclosure, the reset transistor ST1 may be an oxide semiconductor transistor, and the amplifying transistor ST2 and the output transistor ST3 may be LTPS transistors. However, without being limited thereto, at least the reset transistor ST1 and the output transistor ST3 may be oxide semiconductor transistors, and the amplifying transistor ST2 may be an LTPS transistor.

Furthermore, some of the reset transistor ST1, the amplifying transistor ST2, and the output transistor ST3 may be P-type transistors, and the rest of the reset transistor ST1, the amplifying transistor ST2, and the output transistor ST3 may be an N-type transistor. In an embodiment of the present disclosure, the amplifying transistor ST2 and the output transistor ST3 may be PMOS transistors, and the reset transistor ST1 may be an NMOS transistor. However, without being limited thereto, the reset transistor ST1, the amplifying transistor ST2, and the output transistor ST3 may all be N-type transistors or P-type transistors.

Some of the reset transistor ST1, the amplifying transistor ST2, and the output transistor ST3 (e.g., the reset transistor ST1) may be transistors of the same type as the third and fourth transistors T3 and T4 of the red pixel PXR. The amplifying transistor ST2 and the output transistor ST3 may be transistors of the same type as the first, second, and fifth transistors T1, T2, and T5 and the first and second emission control transistors ET1 and ET2 of the red pixel PXR.

A circuit configuration of the sensor drive circuit O_SD according to the present disclosure is not limited to that illustrated in FIG. 5A. The sensor drive circuit O_SD illustrated in FIG. 5A is merely illustrative, and various changes and modifications can be made to the configuration of the sensor drive circuit O_SD.

The reset transistor ST1 includes a first electrode connected to a reset voltage line VL5 that receives a reset voltage Vrst, a second electrode connected with the first sensing node SN1, and a third electrode that receives a reset control signal RST. The third electrode of the reset transistor ST1 may be a gate electrode. In response to the reset control signal RST, the reset transistor ST1 may reset the potential of the first sensing node SN1 to the reset signal RST. The reset control signal RST may be a signal provided through the reset control line RCL. However, the present disclosure is not limited thereto. Alternatively, the reset control signal RST may be the j-th compensation scan signal SCj supplied through the j-th compensation scan line SCLj. In other words, the reset transistor ST1 may receive the j-th compensation scan signal SCj, which is supplied from the j-th compensation scan line SCLj, as the reset control signal RST. In an embodiment of the present disclosure, the reset voltage Vrst may have a lower voltage level than the second drive voltage ELVSS at least during an activation period of the reset control signal RST. The reset voltage Vrst may be a DC voltage maintained at a lower voltage level than the second drive voltage ELVSS.

The reset transistor ST1 may include a plurality of sub-reset transistors connected in series. For example, the reset transistor ST1 may include two sub-reset transistors (hereinafter, referred to as first and second sub-reset transistors). In this case, a third electrode of the first sub-reset transistor and a third electrode of the second sub-reset transistor are connected to the reset control line RCL. Furthermore, a second electrode of the first sub-reset transistor and a first electrode of the second sub-reset transistor may be electrically connected with each other. In addition, the reset voltage RST may be applied to a first electrode of the first sub-reset transistor, and a second electrode of the second sub-reset transistor may be electrically connected with the first sensing node SN1. However, the number of sub-reset transistors is not limited thereto and may be diversely modified.

The amplifying transistor ST2 includes a first electrode that receives a sensing drive voltage SLVD, a second electrode connected with a second sensing node SN2, and a third electrode connected with the first sensing node SN1. The third electrode of the amplifying transistor ST2 may be a gate electrode. The amplifying transistor ST2 may be turned on depending on the potential of the first sensing node SN1 and may apply the sensing drive voltage SLVD to the second sensing node SN2. In an embodiment of the present disclosure, the sensing drive voltage SLVD may be one of the first drive voltage ELVDD and the first and second initialization voltages VINT1 and VINT2. When the sensing drive voltage SLVD is the first drive voltage ELVDD, the first electrode of the amplifying transistor ST2 may be electrically connected to the first drive voltage line VL1. When the sensing drive voltage SLVD is the first initialization voltage VINT1, the first electrode of the amplifying transistor ST2 may be electrically connected to the first initialization voltage line VL3, and when the sensing drive voltage SLVD is the second initialization voltage VINT2, the first electrode of the amplifying transistor ST2 may be electrically connected to the second initialization voltage line VL4.

The output transistor ST3 includes a first electrode connected with the second sensing node SN2, a second electrode connected with the d-th readout line RLd, and a third electrode that receives an output control signal. The third electrode of the output transistor ST3 may be a gate electrode. The output transistor ST3 may transfer the d-th readout signal FSd to the d-th readout line RLd in response to the output control signal. The output control signal may be the j-th write scan signal SWj supplied through the j-th write scan line SWLj. In other words, the output transistor ST3 may receive the j-th write scan signal SWj, which is supplied from the j-th write scan line SWLj, as the output control signal.

The light sensing unit LSU of the sensor FX may be exposed to light during light emission periods of the light emitting elements ED_R, ED_G1, ED_G2, and ED_B. The light may be light output from one of the light emitting elements ED_R, ED_G1, ED_G2, and ED_B.

If the user's hand US_F (refer to FIG. 1) touches the display surface, the first and second light receiving elements OPD1 and OPD2 may generate photo-charges corresponding to light reflected by ridges of a fingerprint or valleys between the ridges. The amount of current flowing through the light receiving elements OPD1 and OPD2 varies depending on the generated photo-charges. When the light receiving elements OPD1 and OPD2 receive the light reflected by the ridge of the fingerprint, the current flowing through the light receiving elements OPD1 and OPD2 may be referred to as a first current, and when the light receiving elements OPD1 and OPD2 receive the light reflected by the valleys of the fingerprint, the current flowing through the light receiving elements OPD1 and OPD2 may be referred to as a second current. The amount of light reflected by the ridges of the fingerprint and the amount of light reflected by the valleys of the fingerprint differ from each other, and the difference between the amounts of light appears as a difference between the first and second currents. When the first current flows through the light receiving elements OPD1 and OPD2, the potential of the first sensing node SN1 may be referred to as a first potential, and when the second current flows through the light receiving elements OPD1 and OPD2, the potential of the first sensing node SN1 may be referred to as a second potential. In an embodiment, the first current may be greater than the second current. In this case, the first potential may be lower than the second potential.

The amplifying transistor ST2 may be a source follower amplifier that generates a source-drain current in proportion to the potential of the first sensing node SN1 that is input to the third electrode of the amplifying transistor ST2.

During the fourth activation period AP4, the j-th write scan signal SWj having the low level is supplied to the output transistor ST3 through the j-th write scan line SWLj. When the output transistor ST3 is turned on in response to the j-th write scan signal SWj having the low level, the d-th readout signal FSd corresponding to a current flowing through the amplifying transistor ST2 may be output to the d-th readout line RLd.

When the reset control signal RST having a high level is supplied through the reset control line RCL during a reset period, the reset transistor ST1 is turned on. The reset period may be referred to as an activation period (e.g., a high-level period) of the reset control line RCL. Alternatively, when the reset transistor ST1 is implemented with a PMOS transistor, the reset control signal RST having a low level may be supplied to the reset control line RCL during the reset period. During the reset period, the first sensing node SN1 may be reset to a potential corresponding to the reset voltage Vrst. In an embodiment of the present disclosure, the reset voltage Vrst may have a lower voltage level than the second drive voltage ELVSS.

When the reset period ends, the light sensing unit LSU may generate photo-charges corresponding to received light, and the generated photo-charges may be accumulated in the first sensing node SN1.

Figure 6:
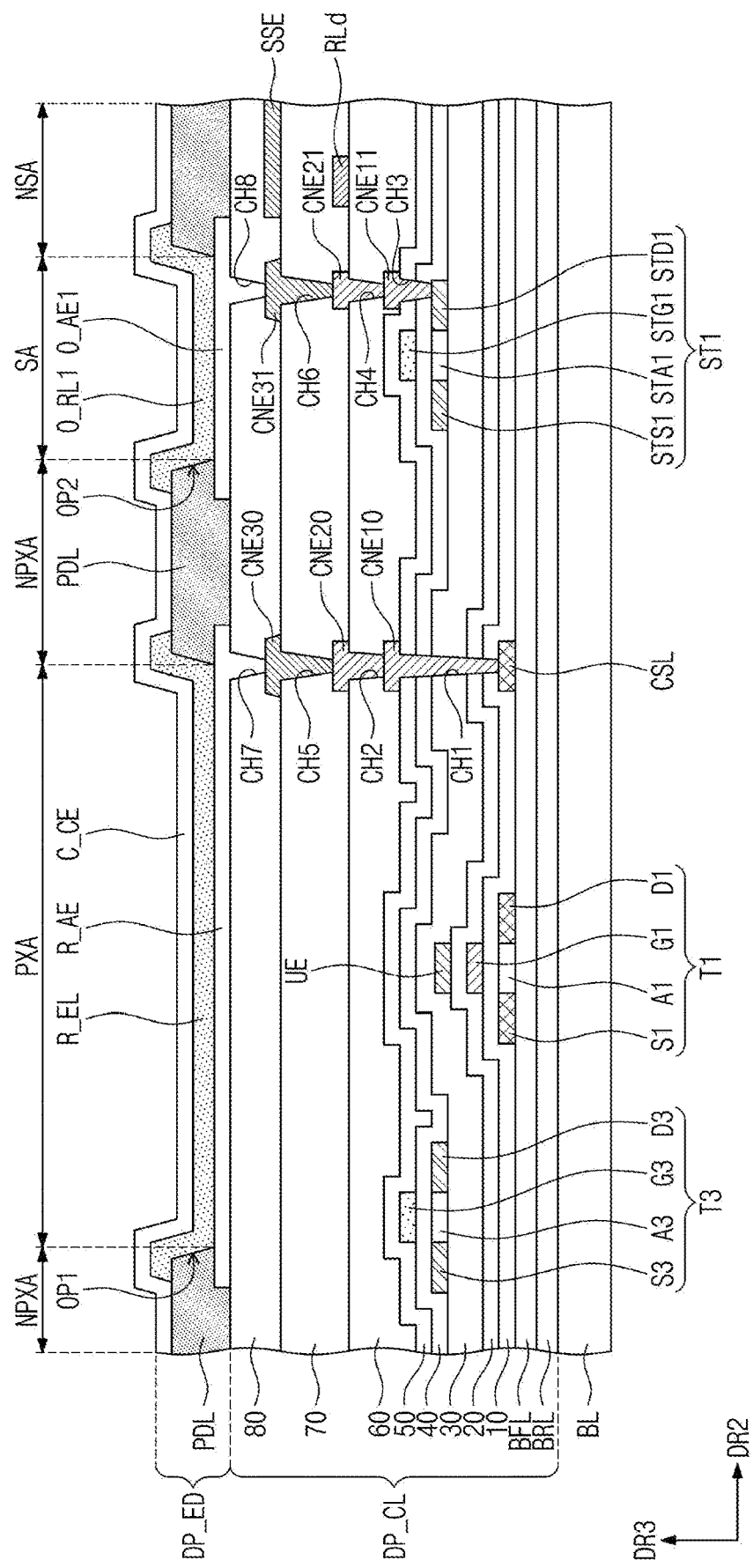
FIG. 6 is a sectional view of the display panel according to an embodiment of the present disclosure.

FIG. 6 is a sectional view illustrating a pixel and a sensor of the display panel according to an embodiment of the present disclosure.

Referring to FIG. 6, the display panel DP may include the base layer BL, the circuit layer DP-CL, and the element layer DP_ED.

The base layer BL may include a synthetic resin layer. The synthetic resin layer may include a thermosetting resin. In particular, the synthetic resin layer may be a polyimide-based resin layer, and the material thereof is not particularly limited. The synthetic resin layer may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, and a perylene-based resin. In addition, the base layer BL may include a glass substrate, a metal substrate, or an organic/inorganic composite substrate.

At least one inorganic layer is formed on an upper surface of the base layer BL. The inorganic layer may include at least one of aluminum oxide, titanium oxide, silicon oxide, silicon oxy-nitride, zirconium oxide, and hafnium oxide. The inorganic layer may be formed in multiple layers. The multiple inorganic layers may constitute a barrier layer BRL and/or a buffer layer BFL that will be described below. The barrier layer BRL and the buffer layer BFL may be selectively disposed. The barrier layer BRL may be disposed between the buffer layer BFL and the base layer BL.

The circuit layer DP_CL may include the barrier layer BRL and/or the buffer layer BFL. The barrier layer BRL prevents infiltration of foreign matter from the outside. The barrier layer BRL may include a silicon oxide layer and a silicon nitride layer. A plurality of silicon oxide layers and a plurality of silicon nitride layers may be provided. The silicon oxide layers and the silicon nitride layers may be alternately stacked one above another.

The buffer layer BFL may be disposed on the barrier layer BRL. The buffer layer BFL improves a coupling force between the base layer BL and a semiconductor pattern and/or a conductive pattern. The buffer layer BFL may include silicon oxide layers and silicon nitride layers. The silicon oxide layers and the silicon nitride layers may be alternately stacked one above another.

The semiconductor pattern is disposed on the buffer layer BFL. Hereinafter, the semiconductor pattern directly disposed on the buffer layer BFL is referred to as the first semiconductor pattern. The first semiconductor pattern may include a silicon semiconductor. The first semiconductor pattern may include poly-silicon. However, without being limited thereto, the first semiconductor pattern may include amorphous silicon.

FIG. 6 merely illustrates a portion of the first semiconductor pattern, and the first semiconductor pattern may be additionally disposed in another region of the red pixel PXR (refer to FIG. 5A). The first semiconductor pattern has different electrical properties depending on whether it is doped or not. The first semiconductor pattern may include a doped region and an undoped region. The doped region may be doped with an N-type dopant or a P-type dopant. A P-type transistor may include a doped region doped with a P-type dopant, and an N-type transistor may include a doped region doped with an N-type dopant.

The doped region has a higher conductivity than the undoped region and may be used as an electrode or a signal line. The undoped region may correspond to an active region (or, a channel) of a transistor. In other words, a first portion of the first semiconductor pattern may be an active region of the transistor, a second portion of the first semiconductor pattern may be a source or drain of the transistor, and a third portion of the first semiconductor pattern may be a connecting signal line (or, a connecting electrode).

As illustrated in FIG. 6, the first electrode Si, a channel part A1, and the second electrode D1 of the first transistor T1 are formed from the first semiconductor pattern. The first electrode Si and the second electrode D1 of the first transistor T1 extend from the channel part A1 in opposite directions.

In FIG. 6, a portion of a connecting signal line CSL formed from the semiconductor pattern is illustrated. The connecting signal line CSL may be connected to the second electrode of the second emission control transistor ET2 (refer to FIG. 5A) on a plane.

A first insulating layer 10 is disposed on the buffer layer BFL. The first insulating layer 10 commonly overlaps the plurality of pixels PX (refer to FIG. 3) and covers the first semiconductor pattern. The first insulating layer 10 may be an inorganic layer and/or an organic layer and may have a single-layer structure or a multi-layer structure. The first insulating layer 10 may include at least one of aluminum oxide, titanium oxide, silicon oxide, silicon oxy-nitride, zirconium oxide, and hafnium oxide. In this embodiment, the first insulating layer 10 may be a single silicon oxide layer. Not only the first insulating layer 10 but also insulating layers of the circuit layer DP_CL to be described below may be inorganic layers and/or organic layers and may have a single-layer structure or a multi-layer structure. The inorganic layers may include at least one of the aforementioned materials.

The third electrode G1 of the first transistor T1 is disposed on the first insulating layer 10. The third electrode G1 may be a portion of a metal pattern. The third electrode G1 of the first transistor T1 overlaps the channel part A1 of the first transistor T1. The first semiconductor pattern can be doped using the third electrode G1 of the first transistor T1 as a mask.

A second insulating layer 20 that covers the third electrode G1 is disposed on the first insulating layer 10. The second insulating layer 20 commonly overlaps the plurality of pixels PX. The second insulating layer 20 may be an inorganic layer and/or an organic layer and may have a single-layer structure or a multi-layer structure. In this embodiment, the second insulating layer 20 may be a single silicon oxide layer.

An upper electrode UE may be disposed on the second insulating layer 20. The upper electrode UE may overlap the third electrode G1. The upper electrode UE may be a portion of a metal pattern, or may be a portion of a doped semiconductor pattern. A portion of the third electrode G1 and the upper electrode UE overlapping the portion of the third electrode G1 may form the capacitor Cst (refer to FIG. 5A). In an embodiment of the present disclosure, the upper electrode UE may be omitted.

In an embodiment of the present disclosure, the second insulating layer 20 may be replaced with an insulating pattern. The upper electrode UE is disposed on the insulating pattern. The upper electrode UE may function as a mask to create the insulating pattern from the second insulating layer 20.

A third insulating layer 30 that covers the upper electrode UE is disposed on the second insulating layer 20. In this embodiment, the third insulating layer 30 may be a single silicon oxide layer. A semiconductor pattern is disposed on the third insulating layer 30. Hereinafter, the semiconductor pattern directly disposed on the third insulating layer 30 is referred to as a second semiconductor pattern. The second semiconductor pattern may include an oxide semiconductor. The oxide semiconductor may include a crystalline or amorphous oxide semiconductor. For example, the oxide semiconductor may include metal oxide of zinc (Zn), indium (In), gallium (Ga), tin (Sn), or titanium (T1), or may include metal such as zinc (Zn), indium (In), gallium (Ga), tin (Sn), or titanium (T1) and a mixture of oxide thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), or zinc-tin oxide (ZTO).

FIG. 6 merely illustrates a portion of the second semiconductor pattern, and the second semiconductor pattern may be additionally disposed in another region of the red pixel PXR. The second semiconductor pattern may include a plurality of regions distinguished depending on whether metal oxide is reduced or not. A region where metal oxide is reduced (hereinafter, referred to as the reduced region) has a higher conductivity than a region where metal oxide is not reduced (hereinafter, referred to as the non-reduced region). The reduced region may function as an electrode or a signal line. The non-reduced region may correspond to a channel part of a transistor. In other words, a first portion of the second semiconductor pattern may be a channel part of the transistor, and a second portion of the second semiconductor pattern may be a first electrode or a second electrode of the transistor.

The circuit layer DP_CL may further include a portion of a semiconductor pattern of the sensor drive circuit O_SD (refer to FIG. 5A). For convenience of description, the reset transistor ST1 of the semiconductor pattern of the sensor drive circuit O_SD is illustrated. The first electrode STS1, a channel part STA1, and the second electrode STD1 of the reset transistor ST1 are formed from the second semiconductor pattern. In an embodiment of the present disclosure, the second semiconductor pattern may include a metal oxide semiconductor. The first electrode STS1 and the second electrode STD1 include metal reduced from the metal oxide semiconductor. The first electrode STS1 and the second electrode STD1 may include a metal layer that has a predetermined thickness from an upper surface of the second semiconductor pattern and includes the reduced metal.

A fourth insulating layer 40 is disposed to cover the first electrode STS1, the channel part STA1, and the second electrode STD1 of the first reset transistor ST1. The third electrode STG1 of the first reset transistor ST1 is disposed on the fourth insulating layer 40. In this embodiment, the third electrode STG1 may be a portion of a metal pattern. The third electrode STG1 of the reset transistor ST1 overlaps the channel part STA1 of the first reset transistor ST1. Although one third electrode STG1 is illustrated in this embodiment for convenience of description, the first reset transistor ST1 may include two third electrodes. The third transistor T3 may include a first electrode S3, a second electrode D3 and a channel part A3 formed on the third insulating layer 30 and a third electrode G3 formed on the fourth insulating layer 40.

A fifth insulating layer 50 that covers the third electrode STG1 is disposed on the fourth insulating layer 40. In this embodiment, the fifth insulating layer 50 may include a silicon oxide layer and a silicon nitride layer. The fifth insulating layer 50 may include a plurality of silicon oxide layers and a plurality of silicon nitride layers alternately stacked one above another.

At least one insulating layer is additionally disposed on the fifth insulating layer 50. Also in this embodiment, a sixth insulating layer 60 and a seventh insulating layer 70 may be disposed on the fifth insulating layer 50. The sixth insulating layer 60 and the seventh insulating layer 70 may be organic layers and may have a single-layer structure or a multi-layer structure. Each of the sixth insulating layer 60 and the seventh insulating layer 70 may be a single polyimide-based resin layer. Without being limited thereto, the sixth insulating layer 60 and the seventh insulating layer 70 may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, and a perylene-based resin.

A first connecting electrode CNE10 may be disposed on the fifth insulating layer 50. The first connecting electrode CNE10 may be connected to the connecting signal line CSL through a first contact hole CH1 penetrating the first to fifth insulating layers 10 to 50, and a second connecting electrode CNE20 may be connected to the first connecting electrode CNE10 through a second contact hole CH2 penetrating the sixth insulating layer 60. In an embodiment of the present disclosure, at least one of the fifth to seventh insulating layers 50 to 70 may be omitted, and one of the first and second connecting electrodes CNE10 and CNE20 may be omitted.

A third connecting electrode CNE11 may be additionally disposed on the fifth insulating layer 50. The third connecting electrode CNE1 may be connected with the third electrode STD1 of the reset transistor ST1 through a third contact hole CH3 penetrating the fourth and fifth insulating layers 40 and 50, and a fourth connecting electrode CNE21 may be connected to the third connecting electrode CNE11 through a fourth contact hole CH4 penetrating the sixth insulating layer 60.

The i-th data line DLi (refer to FIG. 5A) and the d-th readout line RLd may be disposed on the same layer as the second and fourth connecting electrodes CNE20 and CNE21 (in other words, on the sixth insulating layer 60). However, the present disclosure is not limited thereto. Alternatively, the i-th data line DLi (refer to FIG. 5A) and the d-th readout line RLd may be disposed on the same layer as the first and third connecting electrodes CNE10 and CNE11 (in other words, on the fifth insulating layer 50). The second and fourth connecting electrodes CNE20 and CNE21, the i-th data line DLi, and the d-th readout line RLd are covered by the seventh insulating layer 70.

A shielding electrode SSE may be disposed on the seventh insulating layer 70. The shielding electrode SSE may overlap the d-th readout line RLd on a plane. A first dummy connecting electrode CNE30 and a second dummy connecting electrode CNE31 may be additionally disposed on the seventh insulating layer 70. The shielding electrode SSE may be disposed on the same layer as the first and second dummy connecting electrodes CNE30 and CNE31, but may be electrically insulated from the first and second dummy connecting electrodes CNE30 and CNE31. The first dummy connecting electrode CNE30 may be connected to the second connecting electrode CNE20 through a fifth contact hole CH5 penetrating the seventh insulating layer 70. The second dummy connecting electrode CNE31 may be connected to the fourth connecting electrode CNE21 through a sixth contact hole CH6 penetrating the seventh insulating layer 70. The shielding electrode will be described below in detail with reference to FIGS. 7H to 12.

The element layer DP_ED is disposed on the circuit layer DP_CL. The element layer DP_ED may include the red anode electrode R_AE of the red light emitting element ED_R (refer to FIG. 4A) and the sensing anode electrode O_AE1 of the first light receiving element OPD1 (refer to FIG. 4A). As illustrated in FIG. 6, the red anode electrode R_AE may be connected to the first dummy connecting electrode CNE30 through a seventh contact hole CH7 penetrating an eighth insulating layer 80. The sensing anode electrode O_AE1 may be connected to the second dummy connecting electrode CNE31 through an eighth contact hole CH8 penetrating the eighth insulating layer 80.

Although the structure in which the circuit layer DP_CL includes the first dummy connecting electrode CNE30 and the second dummy connecting electrode CNE31 is illustrated in FIG. 6, the present disclosure is not limited thereto. Alternatively, the first dummy connecting electrode CNE30 and the second dummy connecting electrode CNE31 may be omitted from the circuit layer DP_CL. In this case, the red anode electrode R_AE may be directly connected with the second connecting electrode CNE20, and the first sensing anode electrode O_AE1 may be directly connected with the fourth connecting electrode CNE21.

The element layer DP_ED further includes a pixel defining layer PDL disposed on the circuit layer DP_CL. The pixel defining layer PDL may include a light emitting opening OP1 formed to correspond to the red light emitting element ED_R and a light receiving opening OP2 formed to correspond to the first light receiving element OPD1. The light emitting opening OP1 exposes at least a portion of the red anode electrode R_AE of the red light emitting element ED_R. The light emitting opening OP1 of the pixel defining layer PDL may define an emissive region PXA. For example, the plurality of pixels PX (refer to FIG. 3) may be disposed on the plane of the display panel DP (refer to FIG. 3) according to a predetermined rule. The regions where the plurality of pixels PX are disposed may be referred to as pixel regions, and one pixel region may include an emissive region PXA and a non-emissive region NPXA adjacent to the emissive region PXA. The non-emissive region NPXA may surround the emissive region PXA.

The light receiving opening OP2 exposes the first sensing anode electrode O_AE1 of the first light receiving element OPD1. The light receiving opening OP2 of the pixel defining layer PDL may define a light receiving region SA. For example, the plurality of sensors FX (refer to FIG. 3) may be disposed in the display layer DP according to a predetermined rule. The regions where the plurality of sensors FX are disposed may be referred to as sensing regions, and one sensing region may include a light receiving region SA and a non-light receiving region NSA adjacent to the light receiving region SA. The non-light receiving region NSA may surround the light receiving region SA.

The red light emitting layer R_EL is disposed to correspond to the light emitting opening OP1 formed in the pixel defining layer PDL, and the first photoelectric conversion layer O_RL1 is provided to correspond to the light receiving opening OP2 formed in the pixel defining layer PDL. Although the patterned red light emitting layer R_EL is illustrated in this embodiment, the present disclosure is not limited thereto. A common light emitting layer may be commonly disposed for the plurality of pixels PX. In this case, the common light emitting layer may generate white light or blue light. The common cathode electrode C_CE is commonly connected to the red light emitting element ED_R and the first light receiving element OPD1. The common cathode electrode C_CE may face the first sensing anode electrode O_AE1 and the red anode electrode R_AE. The common cathode electrode C_CE is disposed on the red light emitting layer R_EL and the first photoelectric conversion layer O_RL1. The common cathode electrode C_CE is commonly disposed for the plurality of pixels PX and the plurality of sensors FX.

FIGS. 7A to 7I are plan views illustrating an arrangement order of conductive patterns included in the circuit layer according to an embodiment of the present disclosure.

Referring to FIGS. 7A to 7I, conductive patterns and semiconductor patterns may be repeatedly arranged according to a predetermined rule on a plane. FIGS. 7A to 7I illustrate plan views of portions of pixel drive circuits and a portion of a sensor drive circuit.

A first circuit portion PDC1 and a second circuit portion PDC2 may have structures symmetrical to each other. The first circuit portion PDC1 may be a portion of the first green pixel drive circuit G1_PD illustrated in FIG. 4A, and the second circuit portion PDC2 may be a portion of the blue pixel drive circuit B_PD illustrated in FIG. 4A. A third circuit portion SDC may be a portion of the sensor drive circuit O_SD illustrated in FIG. 4A.

Although FIGS. 7A to 7I illustrate the first circuit portion PDC1 and the second circuit portion PDC2 having structures symmetrical to each other, the same structure as the first circuit portion PDC1 may be continuously repeated, or the same structure as the second circuit portion PDC2 may be continuously repeated. Furthermore, the first circuit portion PDC1, the third circuit portion SDC, and the second circuit portion PDC2 illustrated in FIGS. 7A to 7I may be arranged in the second direction DR2. However, the present disclosure is not particularly limited thereto.

Referring to FIGS. 6 and 7A, a first semiconductor layer 1100 is illustrated. The first semiconductor layer 1100 may be disposed between the buffer layer BFL and the first insulating layer 10. The first semiconductor layer 1100 may include a silicon semiconductor. For example, the silicon semiconductor may include amorphous silicon or polycrystalline silicon. For example, the first semiconductor layer 1100 may include low-temperature polycrystalline silicon (LTPS).

The first semiconductor layer 1100 includes a first semiconductor pattern 1110 included in the first and second circuit portions PDC1 and PDC2 and a second semiconductor pattern 1120 included in the third circuit portion SDC.

Referring to FIGS. 6, 7A, and 7B, a first conductive layer 1200 may be disposed on the first insulating layer 10. The first conductive layer 1200 may include metal, an alloy, conductive metal oxide, or a transparent conductive material. For example, the first conductive layer 1200 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), or indium zinc oxide (IZO), but is not particularly limited thereto.

The first conductive layer 1200 may include a first gate wire 1210, a first gate electrode 1220, and a second gate wire 1230.

The first gate wire 1210 may extend in the second direction DR2. The first gate wire 1210 corresponds to the j-th write scan line SWLj of FIG. 5A. For example, the j-th write scan signal SWj (refer to FIG. 5A) may be provided to the first gate wire 1210.

The first gate wire 1210 may constitute the second transistor T2 of FIG. 5A together with the first semiconductor pattern 1110. Furthermore, the first gate wire 1210 may constitute the fifth transistor T5 of FIG. 5A together with the first semiconductor pattern 1110. The first gate wire 1210 may constitute the output transistor ST3 of FIG. 5A together with the second semiconductor pattern 1120.

The first gate electrode 1220 may have an island shape. The first gate electrode 1220 may constitute the first transistor T1 of FIG. 5A together with the first semiconductor pattern 1110. The first gate electrode 1220 may correspond to the third electrode G1 of the first transistor T1 illustrated in FIG. 6.

The second gate wire 1230 may extend in the second direction DR2. The second gate wire 1230 may correspond to the j-th emission control line EMLj of FIG. 5A. For example, the j-th emission control signal EMj (refer to FIG. 5A) may be provided to the second gate wire 1230. The second gate wire 1230 may constitute the first and second emission control transistors ET1 and ET2 of FIG. 5A together with the first semiconductor pattern 1110.

A second gate electrode 1240 may have an island shape. The second gate electrode 1240 may constitute the amplifying transistor ST2 of FIG. 5A together with the second semiconductor pattern 1120.

Figure 7C:
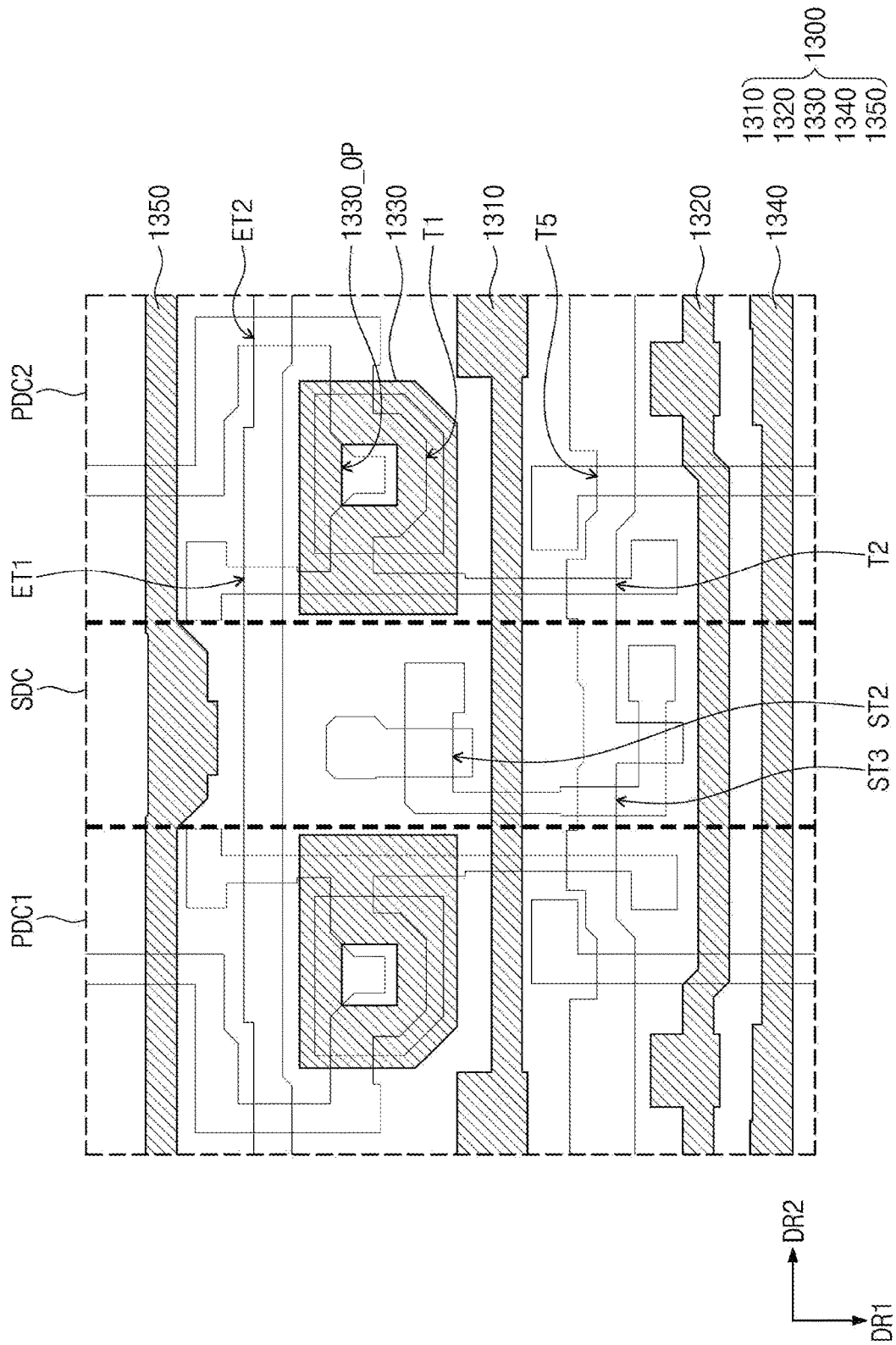

Referring to FIGS. 6, 7B, and 7C, the second insulating layer 20 may cover the first conductive layer 1200 and may be disposed on the first insulating layer 10. A second conductive layer 1300 may be disposed on the second insulating layer 20. The second conductive layer 1300 may include metal, an alloy, conductive metal oxide, or a transparent conductive material.

The second conductive layer 1300 may include a third gate wire 1310, a fourth gate electrode 1320, a capacitor electrode 1330, a first initialization voltage wire 1340, and a first reset control wire 1350.

The third gate wire 1310 may extend in the second direction DR2. The third gate wire 1310 may correspond to the j-th compensation scan line SCLj (refer to FIG. 5A). The fourth gate wire 1320 may extend in the second direction DR2. The fourth gate wire 1320 may correspond to the j-th initialization scan line SILj (refer to FIG. 5A). The capacitor electrode 1330 may overlap the first gate electrode 1220 and may have an island shape. For example, the capacitor electrode 1330 may constitute the capacitor Cst (refer to FIG. 5A) together with the first gate electrode 1220. The capacitor electrode 1330 may correspond to the upper electrode UE. The first drive voltage ELVDD (refer to FIG. 5A) may be provided to the capacitor electrode 1330. Furthermore, an opening 1330_OP penetrating the capacitor electrode 1330 may be formed in the capacitor electrode 1330, and the first gate electrode 1220 may be partially exposed through the opening 1330_OP. As shown in FIG. 7C, the opening 1330_OP may have a square shape, but it is not limited thereto.

The first initialization voltage wire 1340 may extend in the second direction DR2. The first initialization voltage wire 1340 may correspond to the first initialization voltage line VL3 of FIG. 5A. The first initialization voltage VINT1 (refer to FIG. 5A) may be provided through the first initialization voltage wire 1340. The first reset control wire 1350 may extend in the second direction DR2. The first reset control wire 1350 may correspond to the reset control line RCL of FIG. 5A. The reset control signal RST (refer to FIG. 5A) may be provided through the first reset control wire 1350.

Figure 7D:
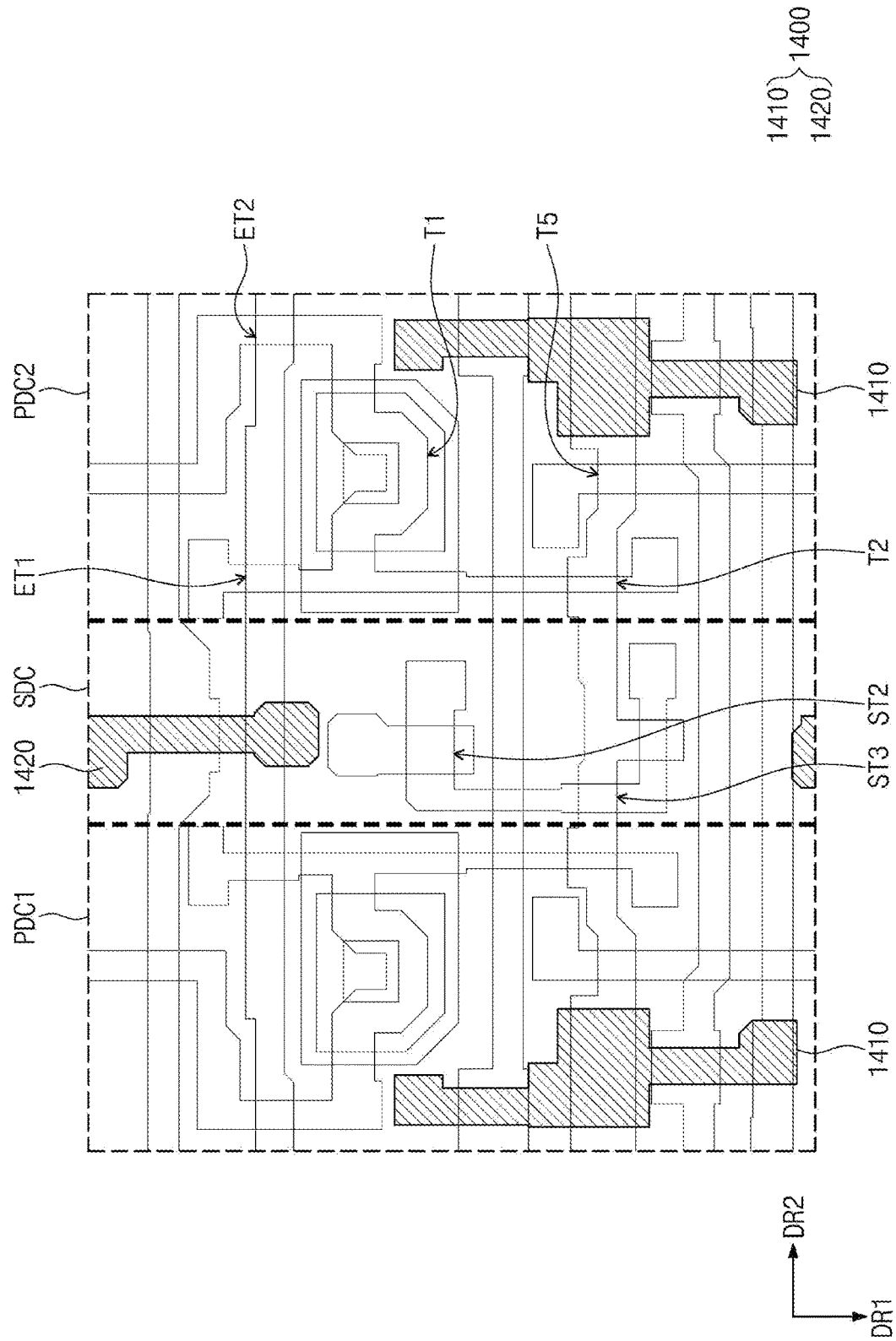
Figure 7E:
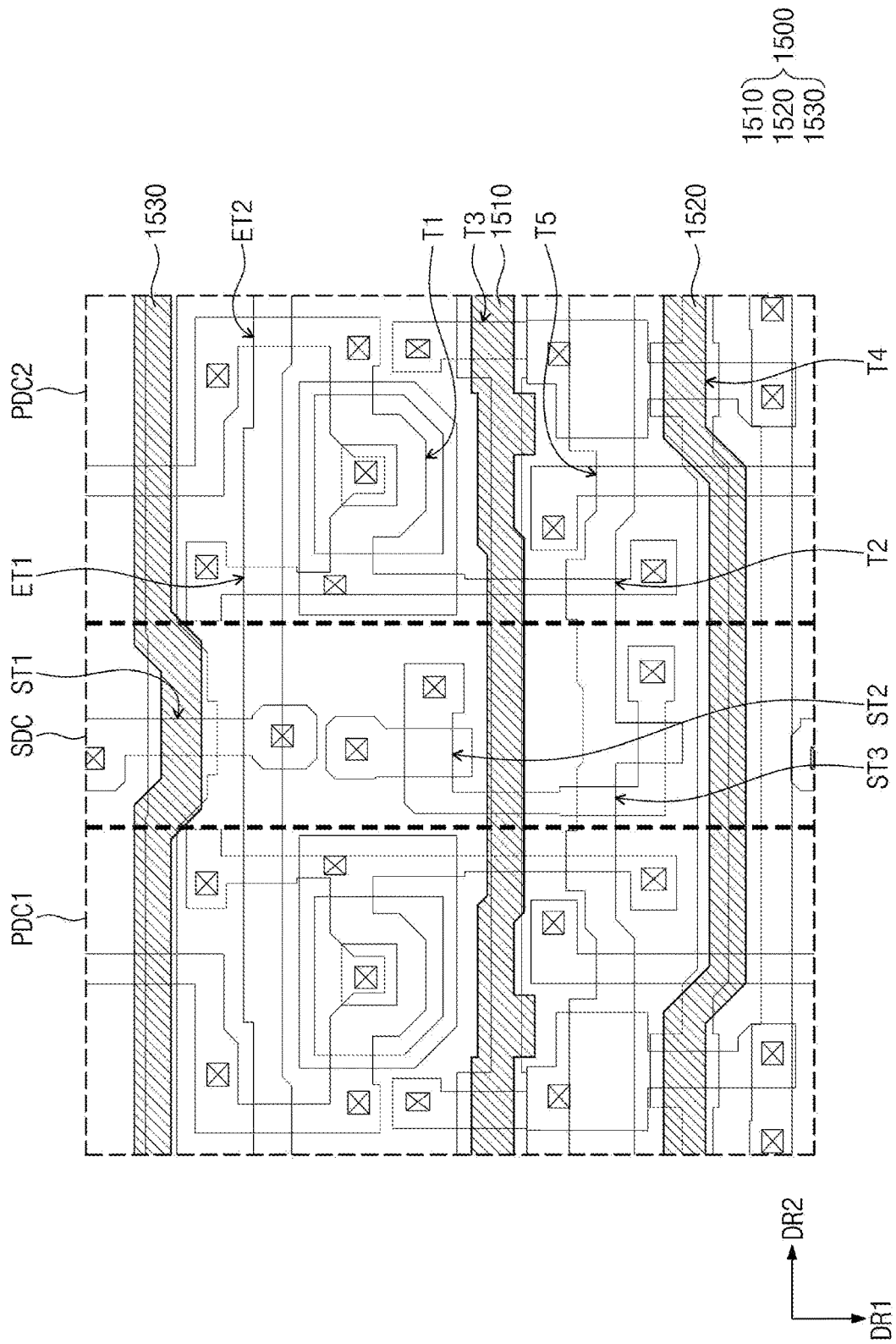

Referring to FIGS. 6, 7C, and 7D, the third insulating layer 30 may cover the second conductive layer 1300 and may be disposed on the second insulating layer 20. A second semiconductor layer 1400 may be disposed on the third insulating layer 30. The second semiconductor layer 1400 may include an oxide semiconductor. The second semiconductor layer 1400 may be disposed in a different layer from the first semiconductor layer 1100 and may not overlap the first semiconductor layer 1100.

The second semiconductor layer 1400 includes a third semiconductor pattern 1410 included in the first and second circuit portions PDC1 and PDC2 and a fourth semiconductor pattern 1420 included in the third circuit portion SDC.

Referring to FIGS. 6 and 7C to 7E, the fourth insulating layer 40 may cover the second semiconductor layer 1400 and may be disposed on the third insulating layer 30. A third conductive layer 1500 may be disposed on the fourth insulating layer 40. The third conductive layer 1500 may include metal, an alloy, conductive metal oxide, or a transparent conductive material.

The third conductive layer 1500 may include a fifth gate wire 1510, a sixth gate wire 1520, and a second reset control wire 1530.

The fifth gate wire 1510 may extend in the second direction DR2. The fifth gate wire 1510 may overlap the third gate wire 1310 and the third semiconductor pattern 1410. In some embodiments, the fifth gate wire 1510 may make contact with the third gate wire 1310 through a contact portion. Accordingly, the j-th compensation scan signal SCj applied to the third gate wire 1310 may be provided to the fifth gate wire 1510. The third gate wire 1310, the third semiconductor pattern 1410, and the fifth gate wire 1510 may constitute the third transistor T3 of FIG. 5A. The third transistor T3 may be disposed between the first transistor T1 and the fifth transistor T5 in the first direction DR1.

The sixth gate wire 1520 may extend in the second direction DR2. The sixth gate wire 1520 may overlap the fourth gate wire 1320 and the third semiconductor pattern 1410. The sixth gate wire 1520 may be electrically connected with the fourth gate wire 1320. The j-th initialization scan signal SIj may be provided to the sixth gate wire 1520. The fourth gate wire 1320, the sixth gate wire 1520, and the third semiconductor pattern 1410 may constitute the fourth transistor T4 of FIG. 5A. The fourth transistor T4 may be disposed adjacent to the fifth transistor T5.

The second reset control wire 1530 may extend in the second direction DR2. The second reset control wire 1530 may be electrically insulated from the fifth gate wire 1510. The second reset control wire 1530 may be spaced apart from the fifth gate wire 1510 in the first direction DR1. The second reset control wire 1530 may be electrically insulated from the sixth gate wire 1520. The second reset control wire 1530 may be spaced apart from the sixth gate wire 1520 in the first direction DR1. The second reset control wire 1530 may correspond to the reset control line RCL of FIG. 5A. The reset control signal RST (refer to FIG. 5A) may be provided through the second reset control wire 1530. The second reset control wire 1530 may overlap the fourth semiconductor pattern 1420. The second reset control wire 1530 may constitute the reset transistor ST1 of FIG. 5A together with the fourth semiconductor pattern 1420. The second reset control wire 1530 may be electrically connected with the first reset control wire 1530 illustrated in FIG. 7C.

Figure 7F:
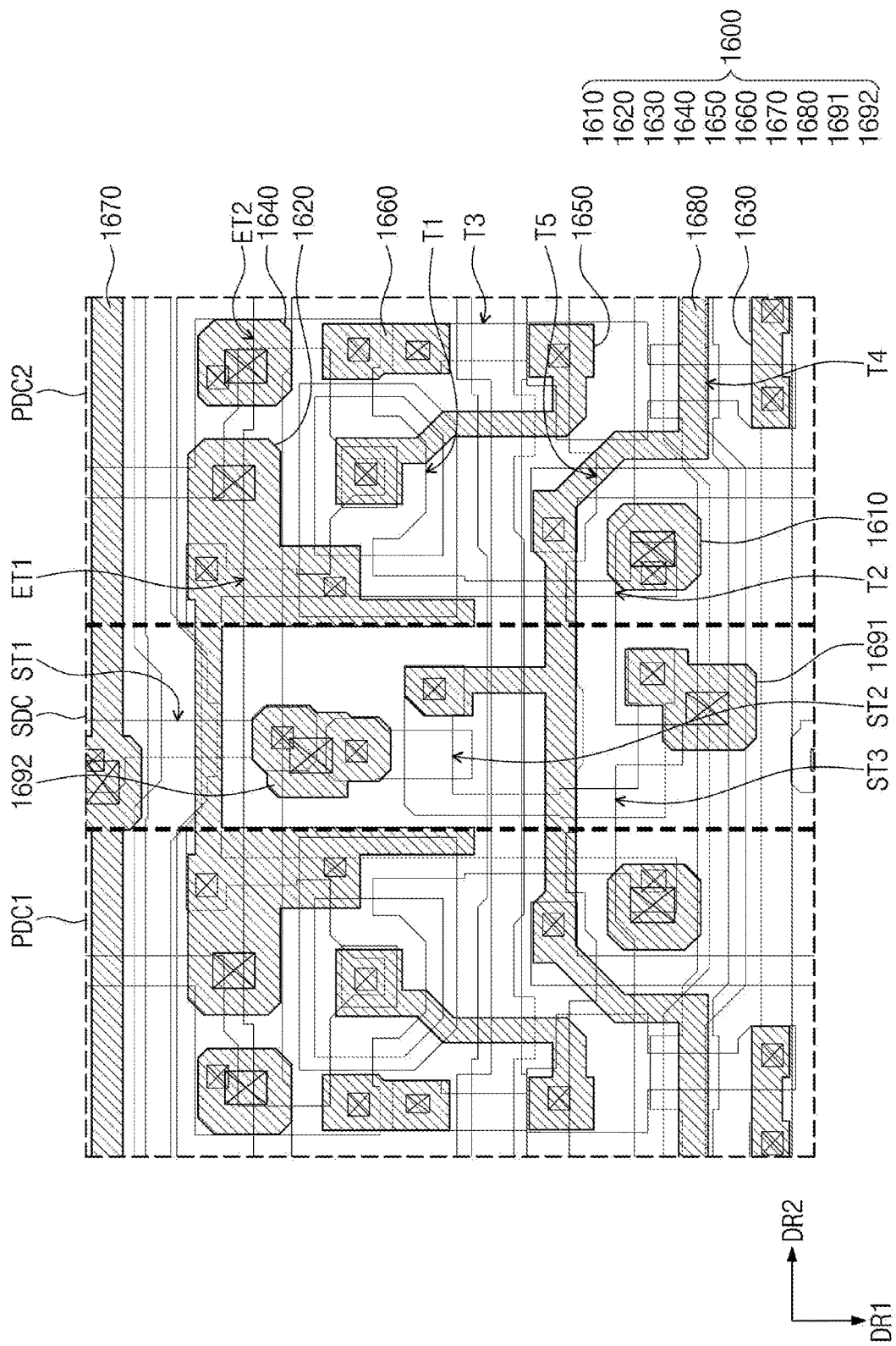

Referring to FIGS. 6 and 7A to 7F, the fifth insulating layer 50 may cover at least a portion of the third conductive layer 1500 and may be disposed on the fourth insulating layer 40. A fourth conductive layer 1600 may be disposed on the fifth insulating layer 50. The fourth conductive layer 1600 may include, for example, metal, an alloy, a conductive metal oxide, or a transparent conductive material. Hereinafter, for convenience of description, only some of the components included in the fourth conductive layer 1600 are illustrated in FIG. 7F.

The fourth conductive layer 1600 may include a first connecting pattern 1610, a second connecting pattern 1620, a third connecting pattern 1630, a fourth connecting pattern 1640, a fifth connecting pattern 1650, a sixth connecting pattern 1660, a first reset voltage wire 1670, a second initialization voltage wire 1680, and seventh and eighth connecting patterns 1691 and 1692.

The first connecting pattern 1610 may contact the first semiconductor pattern 1110. A data signal (e.g., the i-th data signal Di (refer to FIG. 5A)) may be transferred to the first semiconductor pattern 1110 through the first connecting pattern 1610.

The second connecting pattern 1620 may contact the first semiconductor pattern 1110 and the capacitor electrode 1330 through contact portions formed on opposite sides of the second connecting pattern 1620. The first drive voltage ELVDD (refer to FIG. 5A) may be transferred to the first semiconductor pattern 1110 through the second connecting pattern 1620.

The third connecting pattern 1630 may contact the third semiconductor pattern 1410 and the first initialization voltage wire 1340 through a contact portion. Accordingly, the first initialization voltage VINT1 may be transferred to the fourth transistor T4 through the third connecting pattern 1630.

The fourth connecting pattern 1640 may contact the first semiconductor pattern 1110 through a contact portion. The fourth connecting pattern 1640 may transfer the drive current Id (refer to FIG. 5A) from the first semiconductor pattern 1110 to a corresponding light emitting element (e.g., the red light emitting element ED_R (refer to FIG. 5A)).

The fifth connecting pattern 1650 may contact the first semiconductor pattern 1110 and the third semiconductor pattern 1410 through a contact portion. The fifth connecting pattern 1650 may electrically connect the first transistor T1 and the third transistor T3.

The sixth connecting pattern 1660 may contact the first semiconductor pattern 1110 and the third semiconductor pattern 1410 through a contact portion. The sixth connecting pattern 1660 may electrically connect the second emission control transistor ET2 and the third transistor T3.

The first reset voltage wire 1670 may extend in the second direction DR2. The first reset voltage wire 1670 may correspond to the reset voltage line VL5 of FIG. 5A. The reset voltage Vrst (refer to FIG. 5A) may be provided to the first reset voltage wire 1670. The first reset voltage wire 1670 may be connected with the reset transistor ST1 through a contact portion. The reset transistor ST1 may receive the reset voltage Vrst through the first reset voltage wire 1670. However, unlike in FIG. 7F, the first reset voltage wire 1670 may be connected with the fourth gate wire 1320 through a contact portion. In this case, the reset transistor ST1 may receive the j-th initialization scan signal SIj as the reset voltage Vrst through the first reset voltage wire 1670.

The second initialization voltage wire 1680 may extend in the second direction DR2. The second initialization voltage wire 1680 may correspond to the second initialization voltage line VL4 of FIG. 5A. The second initialization voltage VINT2 (refer to FIG. 5A) may be provided through the second initialization voltage wire 1680.

One side of the seventh connecting pattern 1691 may contact the second semiconductor pattern 1120 through a contact portion. The one side of the seventh connecting pattern 1691 may contact the sixth gate wire 1520 through a contact portion. The output transistor ST3 may receive the j-th compensation scan signal SWj through the seventh connecting pattern 1691.

One side of the eighth connecting pattern 1692 may contact the fourth semiconductor pattern 1420 through a contact portion. An opposite side of the eighth connecting pattern 1692 may contact the second gate electrode 1240 through a contact portion. The eighth connecting pattern 1692 may electrically connect the reset transistor ST1 to the amplifying transistor ST2.

Referring to FIGS. 6 and 7A to 7G, the sixth insulating layer 60 may cover at least a portion of the fourth conductive layer 1600 and may be disposed on the fifth insulating layer 50. A fifth conductive layer 1700 may be disposed on the sixth insulating layer 60. The fifth conductive layer 1700 may include, for example, metal, an alloy, conductive metal oxide, or a transparent conductive material.

The fifth conductive layer 1700 may include a first data wire 1711, a second data wire 1712, a drive voltage wire 1720, a ninth connecting pattern 1730, a tenth connecting pattern 1740, an eleventh connecting pattern 1750, and a readout wire 1760.

The first and second data wires 1711 and 1712 may extend in the first direction DR1. The first and second data wires 1711 and 1712 may be spaced apart from each other in the second direction DR2. One of the first and second data wires 1711 and 1712 may correspond to the i-th data line DLi of FIG. 5A. For example, the i-th data signal Di may be provided to one of the first and second data wires 1711 and 1712. Each of the first and second data wires 1711 and 1712 may contact the first connecting pattern 1610 through a contact portion.

The drive voltage wire 1720 may extend in the first direction DR1 and may overlap the first circuit portion PDC1 and the second circuit portion PDC2. The drive voltage wire 1720 may correspond to the first drive voltage line VL1 of FIG. 5A. For example, the first drive voltage ELVDD may be provided to the drive voltage wire 1720. The drive voltage wire 1720 may contact the second connecting pattern 1620 through a contact portion.

The ninth connecting pattern 1730 may have an island shape. The ninth connecting pattern 1730 may contact the fourth semiconductor pattern 1420 through a contact portion formed on one side of the ninth connecting pattern 1730. The ninth connecting pattern 1730 may be electrically connected with the first sensing anode electrode O_AE1 of the first light receiving element OPD1 of FIG. 5A through a contact portion formed on an opposite side of the ninth connecting pattern 1730.

The tenth connecting pattern 1740 may have an island shape. The tenth connecting pattern 1740 may contact the first semiconductor pattern 1110 through a contact portion formed on one side of the tenth connecting pattern 1740. The tenth connecting pattern 1740 may be electrically connected with an anode electrode (e.g., the red anode electrode R_AE) of a corresponding light emitting element (e.g., the red light emitting element ED_R) through a contact portion formed on an opposite side of the tenth connecting pattern 1740.

The eleventh connecting pattern 1750 may have an island shape. The eleventh connecting pattern 1750 may contact the first reset voltage wire 1670 through a contact portion formed on one side of the eleventh connecting pattern 1750. The eleventh connecting pattern 1750 may contact the shielding electrode SSE (refer to FIG. 6) through a contact portion formed on an opposite side of the eleventh connecting pattern 1750.

The readout wire 1760 may extend in the first direction DR1. The readout wire 1760 may be disposed between two adjacent data wires (e.g., the first and second data wires 1711 and 1712). A distance between the first and second data wires 1711 and 1712 is shown as d1 in FIG. 7G. The readout wire 1760 may correspond to the d-th readout line RLd of FIG. 5A. For example, the d-th readout signal FSd may be transferred to the readout wire 1760. The readout wire 1760 may contact the output transistor ST3 through a contact portion.

Figure 7G:
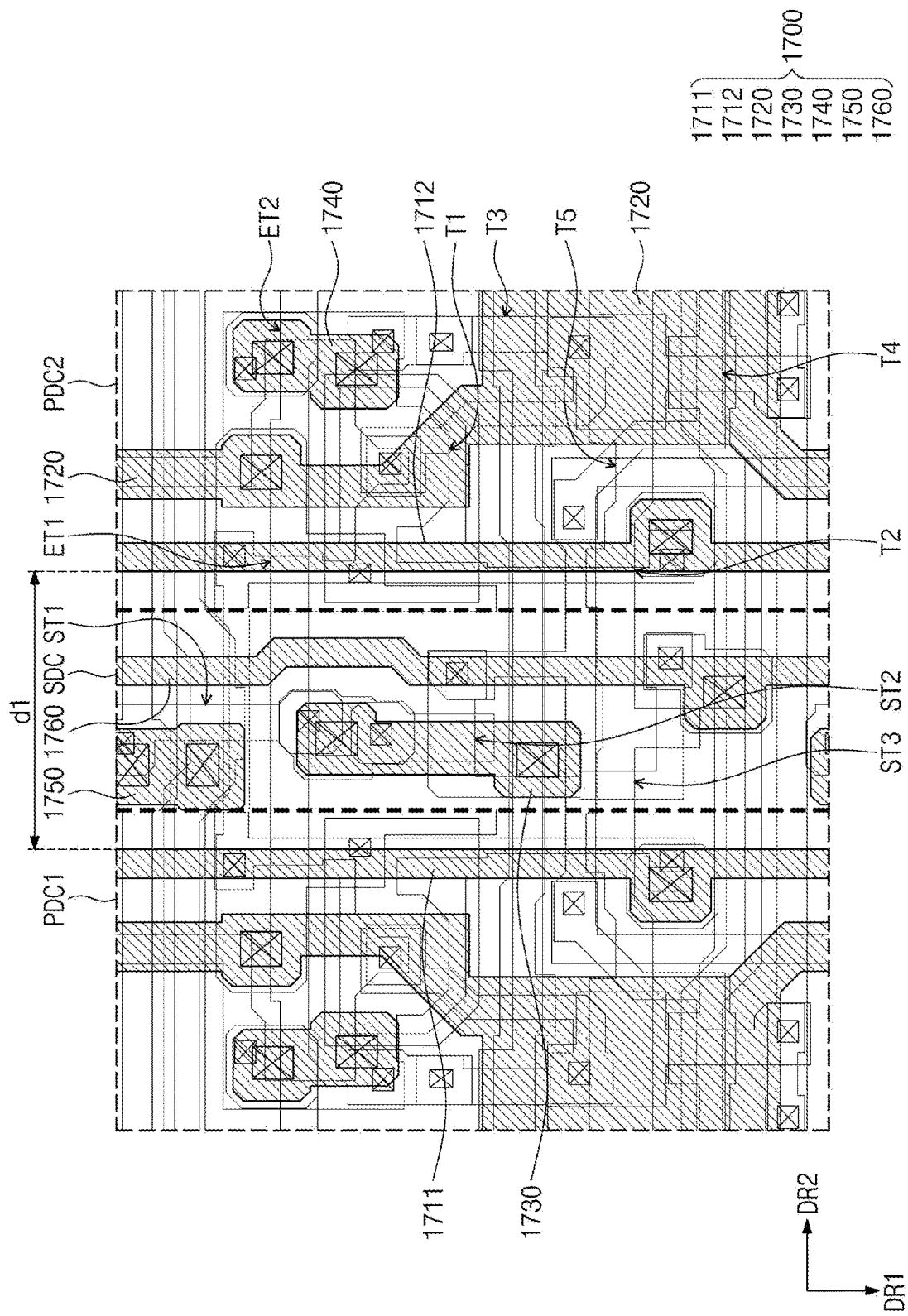
Figure 7H:
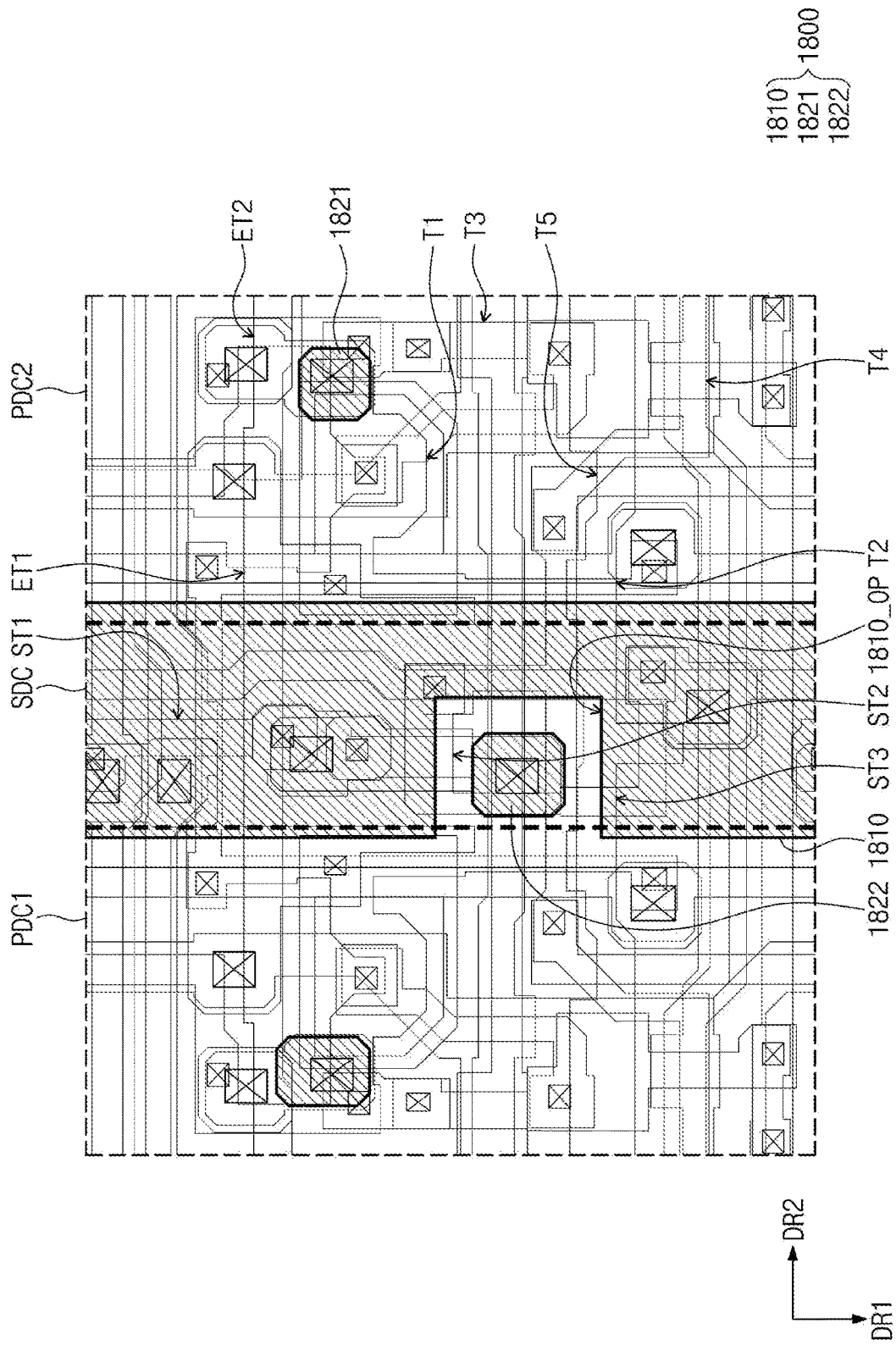

Referring to FIGS. 6, 7G, and 7H, the seventh insulating layer 70 may cover at least a portion of the fifth conductive layer 1700 and may be disposed on the sixth insulating layer

60. A sixth conductive layer 1800 may be disposed on the seventh insulating layer 70. The sixth conductive layer 1800 may include, for example, metal, an alloy, conductive metal oxide, or a transparent conductive material.

The sixth conductive layer 1800 may include a shielding electrode wire 1810, a first dummy connecting pattern 1821, and a second dummy connecting pattern 1822.

The shielding electrode wire 1810 may extend in the first direction DR1. The shielding electrode wire 1810 may extend along the readout wire 1760. On a plane, the shielding electrode wire 1810 may overlap the readout wire 1760. The shielding electrode wire 1810 may contact the eleventh connecting pattern 1750 through a contact portion. Accordingly, the reset voltage applied to the first reset voltage wire 1670 may be applied to the shielding electrode wire 1810 through the eleventh connecting pattern 1750. The shielding electrode wire 1810 may correspond to the shielding electrode SSE illustrated in FIG. 6.

The shielding electrode wire 1810 may partially cover the third circuit portion SDC. In particular, the shielding electrode wire 1810 may cover the reset transistor ST1, the amplifying transistor ST2, and the output transistor ST3.

The shielding electrode wire 1810 may have an open portion 1810_OP in which the second dummy connecting pattern 1822 is accommodated. The open portion 1810_OP may have a recess shape that is recessed in the second direction DR2 from one side of the shielding electrode wire 1810.

The second dummy connecting pattern 1822 may have an island shape. The second dummy connecting pattern 1822 may be disposed in the open portion 1810_OP and may be spaced apart from the shielding electrode wire 1810. The second dummy connecting pattern 1822 may not contact the shielding electrode wire 1810. The second dummy connecting pattern 1822 may be electrically insulated from the shielding electrode wire 1810. The second dummy connecting pattern 1822 may contact the ninth connecting pattern 1730 through a contact portion. The second dummy connecting pattern 1822 may contact the first sensing anode electrode O_AE1 of the first light receiving element OPD1 of FIG. 5A.

The first dummy connecting pattern 1821 may contact the tenth connecting pattern 1740 through a contact portion. The first dummy connecting pattern 1821 may contact an anode electrode (e.g., the red anode electrode R_AE) of a corresponding light emitting element (e.g., the red light emitting element ED_R) through a contact portion.

Figure 7I:
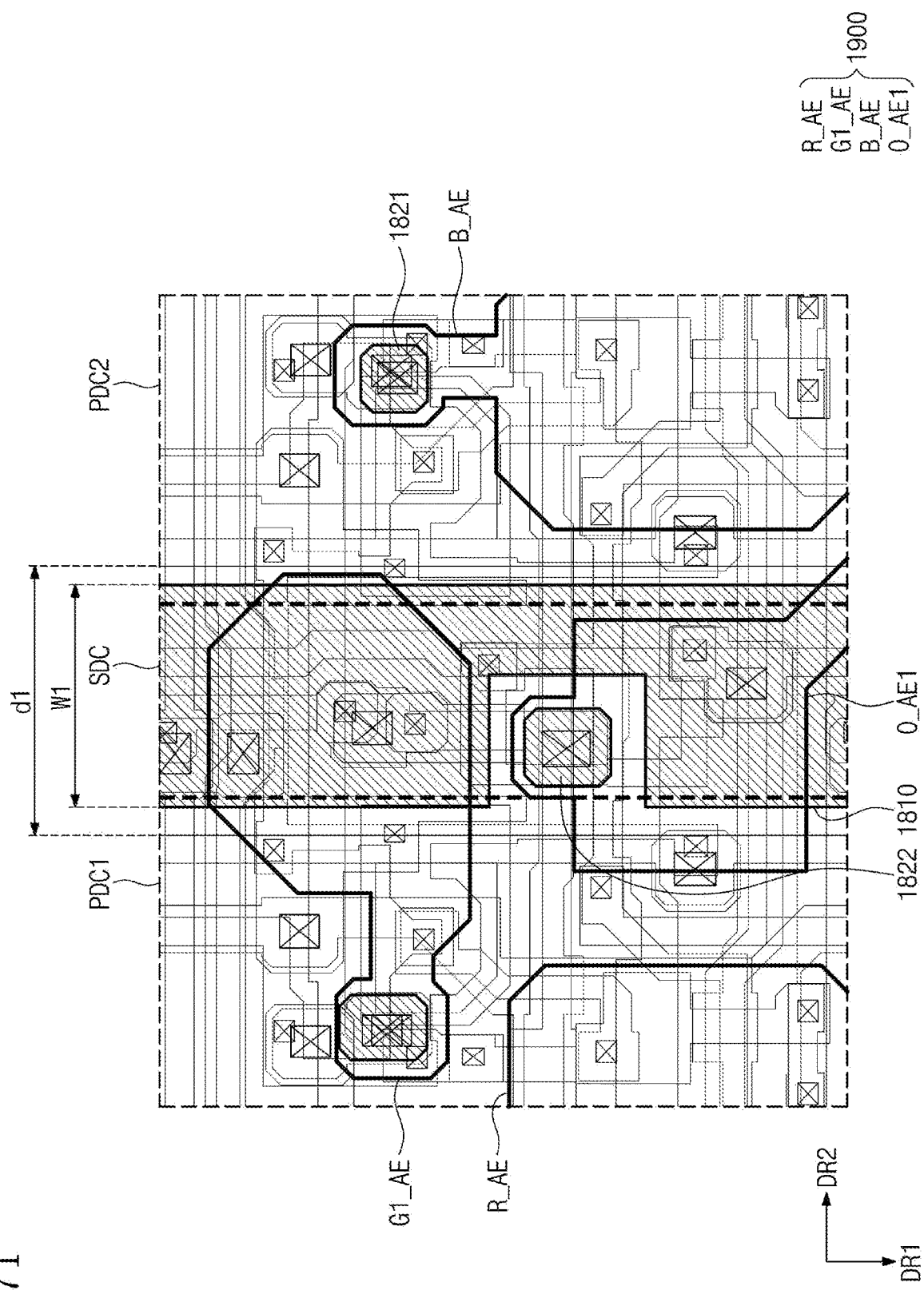

Referring to FIGS. 6, 7H, and 7I, the eighth insulating layer 80 may cover at least a portion of the sixth conductive layer 1800 and may be disposed on the seventh insulating layer 70. A seventh conductive layer 1900 may be disposed on the eighth insulating layer 80. The seventh conductive layer 1900 may include, for example, metal, an alloy, conductive metal oxide, or a transparent conductive material.

The seventh conductive layer 1900 may include the red anode electrode R_AE, the first green anode electrode G1_AE, the blue anode electrode B_AE, and the first sensing anode electrode O_AE1. The seventh conductive layer 1900 may further include the second green anode electrode G2_AE and the second sensing anode electrode O_AE2 illustrated in FIG. 4A.

Each of the red anode electrode R_AE, the first green anode electrode G1_AE, and the blue anode electrode B_AE makes contact with the first dummy connecting pattern 1821 through a contact portion. The first sensing anode electrode O_AE1 makes contact with the second dummy connecting pattern 1822 through a contact portion. On a plane, the first green anode electrode G1_AE and the first sensing anode electrode O_AE1 may overlap the shielding electrode wire 1810.

Referring to FIGS. 7G and 7I, the first and second data wires 1711 and 1712 may be spaced apart from each other by a first gap d1 in the second direction DR2. The shielding electrode wire 1810 has a first width W1 in the second direction DR2. In an embodiment of the present disclosure, the first width W1 may be smaller than the first gap d1. In this case, the shielding electrode wire 1810 may overlap the readout wire 1760, but may not overlap the first and second data wires 1711 and 1712.

The shielding electrode wire 1810 can reduce a coupling capacitance formed between the readout wire 1760 and the first and second data wires 1711 and 1712. In other words, the shielding electrode wire 1810 acts as a shield for the readout wire 1760 to prevent a sensing signal output from the readout wire 1760 from being affected by a data signal applied to the first and second data wires 1711 and 1712. Accordingly, the sensing accuracy of the sensor FX (refer to FIG. 3) may be improved.

Although FIG. 7H illustrates the structure in which the shielding electrode wire 1810 completely covers the readout wire 1760, the present disclosure is not limited thereto. Alternatively, the shielding electrode wire 1810 may partially overlap the readout wire 1760.

The shielding electrode wire 1810 may shield the reset transistor ST1, the amplifying transistor ST2, and the output transistor ST3 and may decrease a coupling capacitance between the first sensing anode SN1 (refer to FIG. 5A) and the readout wire 1760. Accordingly, the potential of the first sensing node SN1 may be stabilized, and thus, the sensing accuracy of the sensor FX (refer to FIG. 3) may be improved.

Figure 8A:
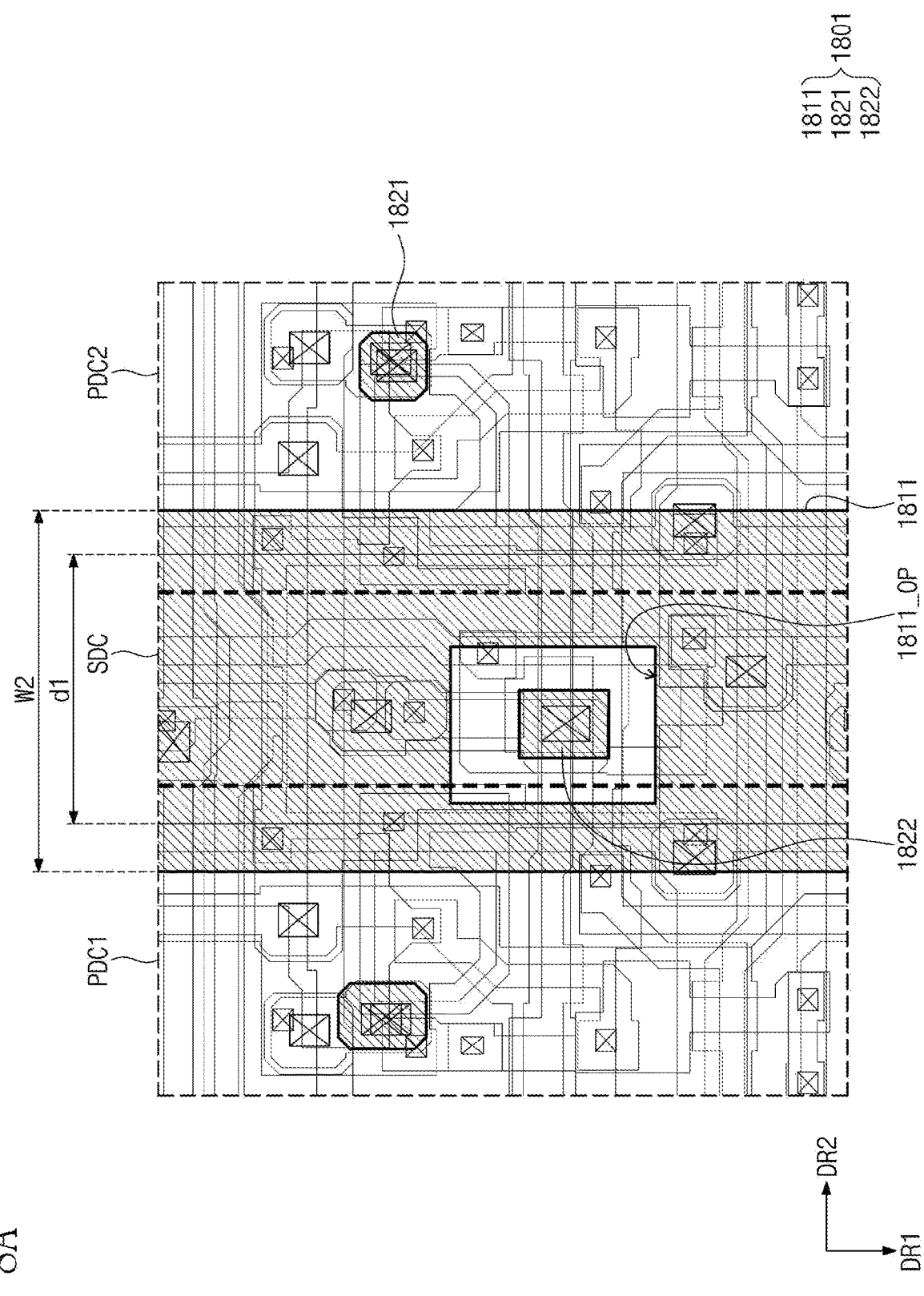

FIGS. 8A and 8B are plan views illustrating shielding electrode wires according to embodiments of the present disclosure.

Referring to FIGS. 6, 7G, 7H, and 8A, a sixth conductive layer 1801 may include a shielding electrode wire 1811, the first dummy connecting pattern 1821, and the second dummy connecting pattern 1822.

The shielding electrode wire 1811 may extend in the first direction DR1. The shielding electrode wire 1811 may extend along the readout wire 1760. The shielding electrode wire 1811 has a second width W2 in the second direction DR2. In an embodiment of the present disclosure, the second width W2 may be greater than the first gap d1. The first gap d1 corresponds to the separation distance between the first and second data wires 1711 and 1712. In this case, the shielding electrode wire 1811 may overlap the readout wire 1760 and the first and second data wires 1711 and 1712 on a plane. The shielding electrode wire 1811 may contact the eleventh connecting pattern 1750 through a contact portion. Accordingly, the reset voltage applied to the first reset voltage wire 1670 may be applied to the shielding electrode wire 1811 through the eleventh connecting pattern 1750. The shielding electrode wire 1811 may correspond to the shielding electrode SSE illustrated in FIG. 6.

The shielding electrode wire 1811 may have an open portion 1811_OP in which the second dummy connecting pattern 1822 is accommodated. The open portion 1811_OP may have the shape of a hole formed through the shielding electrode wire 1811. The open portion 1811_OP may surround the second dummy connecting pattern 1822.

The shielding electrode wire 1811 can reduce a coupling capacitance formed between the readout wire 1760 and the first and second data wires 1711 and 1712. In other words, the shielding electrode wire 1811 acts as a shield for the readout wire 1760 and the first and second data wires 1711 and 1712 to prevent a sensing signal output from the readout wire 1760 from being affected by a data signal applied to the first and second data wires 1711 and 1712. Accordingly, the sensing accuracy of the sensor FX (refer to FIG. 3) may be improved.

The second dummy connecting pattern 1822 may have an island shape. The second dummy connecting pattern 1822 may be disposed in the open portion 1811_OP and may be spaced apart from the shielding electrode wire 1811. The second dummy connecting pattern 1822 may be electrically insulated from the shielding electrode wire 1811. The second dummy connecting pattern 1822 may contact the ninth connecting pattern 1730 through a contact portion. The second dummy connecting pattern 1822 may contact the first sensing anode electrode O_AE1 of FIG. 7I.

Referring to FIGS. 6, 7G, 7H, and 8B, a sixth conductive layer 1802 may include a shielding electrode wire 1812, the first dummy connecting pattern 1821, and the second dummy connecting pattern 1822.

The shielding electrode wire 1812 may extend in the first direction DR1. In the structure in which the shielding electrode wire 1812 does not overlap the first and second data wires 1711 and 1712, an open portion 1812_OP may have the shape of a hole formed through the shielding electrode wire 1812. The second dummy connecting pattern 1822 may have an island shape. The second dummy connecting pattern 1822 may be disposed in the open portion 1812_OP and may be spaced apart from the shielding electrode wire 1812.

In the present disclosure, the shapes and positions of the open portions 1810_OP, 1811_OP, and 1812_OP are not particularly limited and may be modified to correspond to the shape and position of the second dummy connecting pattern 1822.

Figure 9A:
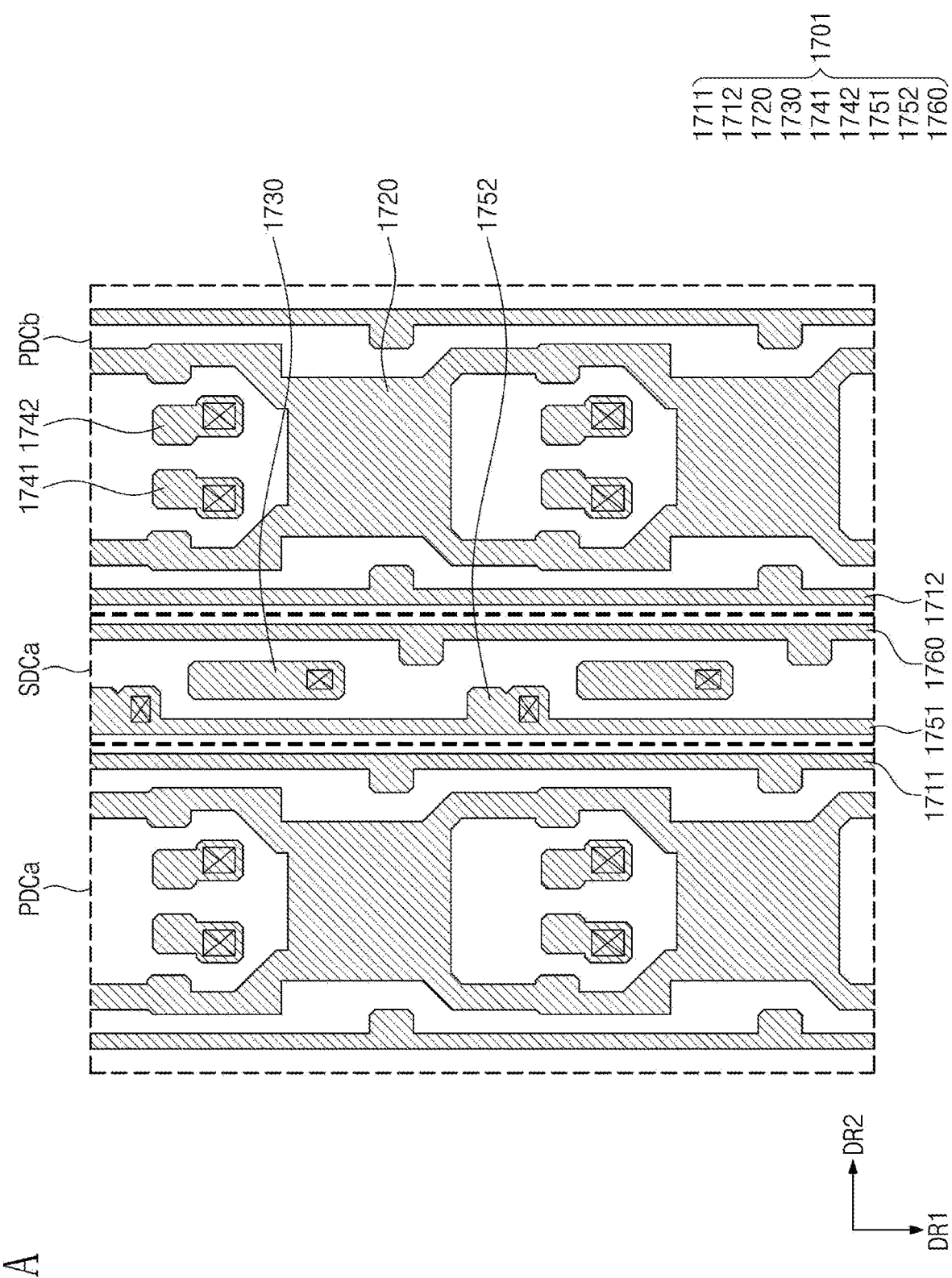
FIGS. 9A, 9B and 9C are plan views illustrating a process of forming a shielding electrode wire according to an embodiment of the present disclosure.
Figure 9B:
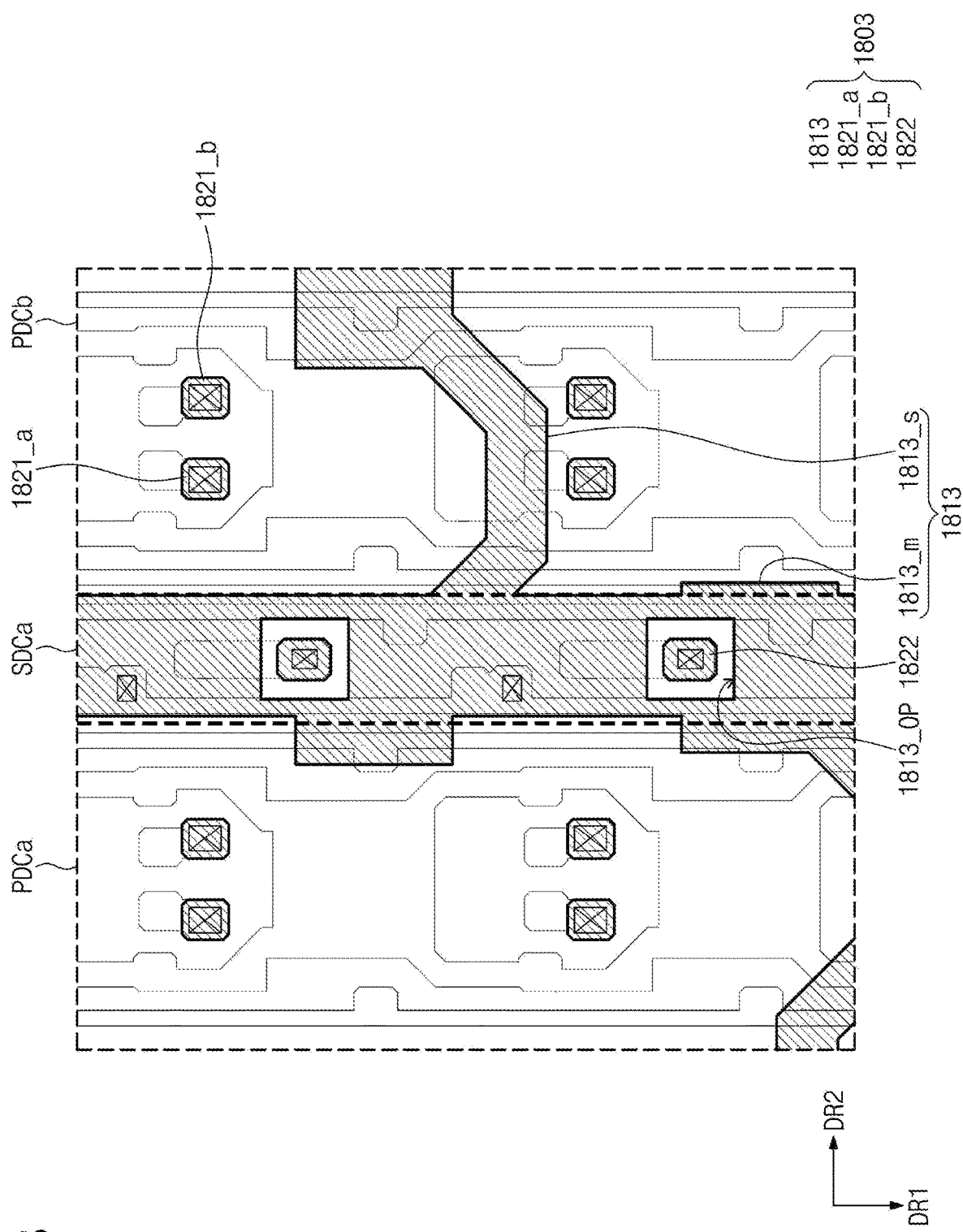
Figure 9C:
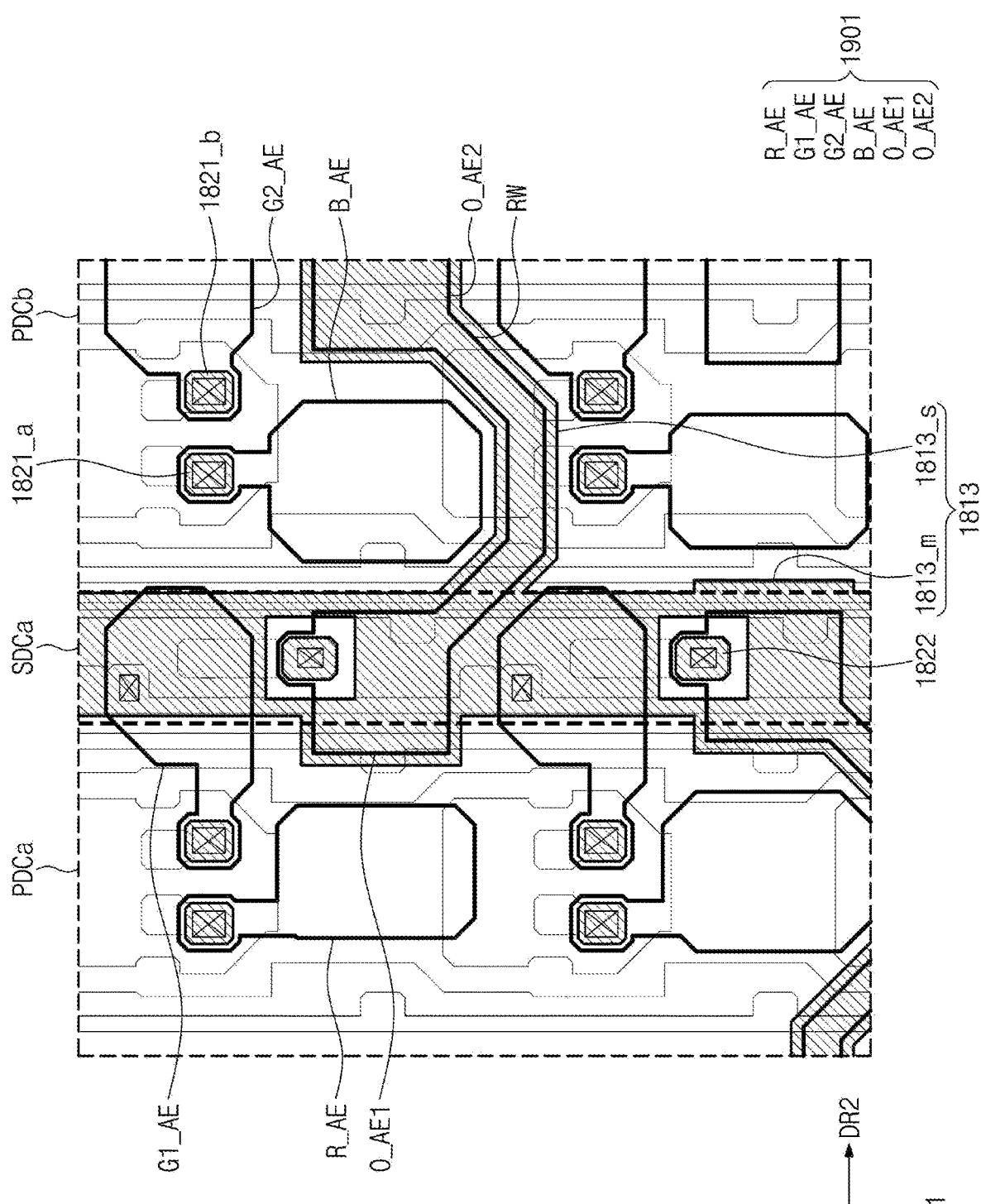

FIGS. 9A to 9C are plan views illustrating a process of forming a shielding electrode wire according to an embodiment of the present disclosure.

Referring to FIGS. 9A to 9C, conductive patterns and semiconductor patterns may be repeatedly arranged according to a predetermined rule on a plane. FIGS. 9A to 9C illustrate plan views of portions of pixel drive circuits and a portion of a sensor drive circuit.

A first circuit portion PDCa and a second circuit portion PDCb may have structures symmetrical to each other. The first circuit portion PDCa may be a portion of the two first green pixel drive circuits G1_PD illustrated in FIG. 4A, and the second circuit portion PDCb may be a portion of the blue pixel drive circuit B_PD and the red pixel drive circuit R_PD illustrated in FIG. 4A. A third circuit portion SDCa may be a portion of the two sensor drive circuits O_SD illustrated in FIG. 4A.

Referring to FIGS. 6 and 9A, a fifth conductive layer 1701 may include a first data wire 1711, a second data wire 1712, a drive voltage wire 1720, a ninth connecting pattern 1730, first and second sub-connecting patterns 1741 and 1742, a second reset voltage wire 1751, an eleventh connecting pattern 1752, and a readout wire 1760.

The first and second data wires 1711 and 1712 may extend in the first direction DR1. The first and second data wires 1711 and 1712 may be spaced apart from each other in the second direction DR2. One of the first and second data wires 1711 and 1712 may correspond to the i-th data line DLi of FIG. 5A. For example, the i-th data signal Di may be provided to one of the first and second data wires 1711 and 1712. Each of the first and second data wires 1711 and 1712 may contact the first connecting pattern 1610 (refer to FIG. 7F) through a contact portion.

The drive voltage wire 1720 may extend in the first direction DR1 and may overlap the first circuit portion PDCa and the second circuit portion PDCb. The drive voltage wire 1720 may correspond to the first drive voltage line VL1 of FIG. 5A. For example, the first drive voltage ELVDD may be provided to the drive voltage wire 1720. The drive voltage wire 1720 may contact the second connecting pattern 1620 (refer to FIG. 7F) through a contact portion.

The ninth connecting pattern 1730 may have an island shape. The ninth connecting pattern 1730 may contact the fourth semiconductor pattern 1420 (refer to FIG. 7D) through a contact portion formed on one side of the ninth connecting pattern 1730. The ninth connecting pattern 1730 may be electrically connected with the first sensing anode electrode O_AE1 of the first light receiving element OPD1 of FIG. 5A through a contact portion formed on an opposite side of the ninth connecting pattern 1730. The ninth connecting pattern 1730 may be disposed in the third circuit portion SDCa.

Each of the first and second sub-connecting patterns 1741 and 1742 may have an island shape. Each of the first and second sub-connecting patterns 1741 and 1742 may contact the first semiconductor pattern 1110 through a contact portion formed on one side thereof. The first sub-connecting pattern 1741 may be electrically connected with an anode electrode (e.g., the blue anode electrode B_AE (refer to FIG. 9C)) of a corresponding light emitting element (e.g., the blue light emitting element ED_B (refer to FIG. 4A)) through a contact portion formed on an opposite side of the first sub-connecting pattern 1741. The second sub-connecting pattern 1742 may be electrically connected with an anode electrode (e.g., the second green anode electrode G2_AE (refer to FIG. 9C)) of a corresponding light emitting element (e.g., the second green light emitting element ED_G2 (refer to FIG. 4A)) through a contact portion formed on an opposite side of the second sub-connecting pattern 1742. Each of the first and second sub-connecting patterns 1741 and 1742 may be disposed between portions of the drive voltage wire 1720.

The second reset voltage wire 1751 may extend in the first direction DR1. The second reset voltage wire 1751 may be disposed between the first data wire 1711 and the readout wire 1760. However, the present disclosure is not limited thereto. Alternatively, the second reset voltage wire 1751 may be disposed between the second data wire 1712 and the readout wire 1760.

The eleventh connecting pattern 1752 may extend from one side of the second reset voltage wire 1751. The eleventh connecting pattern 1752 and the second reset voltage wire 1751 may be integrally formed with each other. The eleventh connecting pattern 1752 may contact the first reset voltage wire 1670 (refer to FIG. 7F) through a contact portion formed on one side of the eleventh connecting pattern 1752. The second reset voltage wire 1751 may be electrically connected with the first reset voltage wire 1670 through the eleventh connecting pattern 1752.

The readout wire 1760 may extend in the first direction DR1. The readout wire 1760 may be disposed between two adjacent data wires (e.g., the first and second data wires 1711 and 1712). The readout wire 1760 may correspond to the d-th readout line RLd of FIG. 5A. For example, the d-th readout signal FSd may be transferred to the readout wire

1760. The readout wire 1760 may contact the output transistor ST3 through a contact portion.

Referring to FIGS. 6, 9A, and 9B, a sixth conductive layer 1803 may include a shielding electrode wire 1813, a first sub-dummy connecting pattern 1821_*a*, a second sub-dummy connecting pattern 1821_*b*, and a second dummy connecting pattern 1822.

The shielding electrode wire 1813 includes a main electrode wire 1813_*m* overlapping the readout wire 1760 on a plane and a sub-electrode wire 1813_*s* extending from the main electrode wire 1813_*m*. The main electrode wire 1813_*m* may extend in the first direction DR1. The main electrode wire 1813_*m* may additionally overlap the second reset voltage wire 1751 on a plane. The sub-electrode wire 1813_*s* may be integrally formed with the main electrode wire 1813_*m*. The sub-electrode wire 1813_*s* may overlap the second sensing anode electrode O_AE2 (refer to FIG. 9C) (or, a dummy anode electrode) of the second light receiving element OPD2 (refer to FIG. 4A) on a plane. The sub-electrode wire 1813_*s* may overlap the routing wire RW (refer to FIG. 9C) on a plane.

The shielding electrode wire 1813 may contact the eleventh connecting pattern 1752 through a contact portion. Accordingly, the reset voltage applied to the first reset voltage wire 1670 may be applied to the shielding electrode wire 1813 through the eleventh connecting pattern 1752. The shielding electrode wire 1813 may correspond to the shielding electrode SSE illustrated in FIG. 6.

The shielding electrode wire 1813 may have an open portion 1813_OP in which the second dummy connecting pattern 1822 is accommodated. The open portion 1813_OP may have the shape of a hole formed through the shielding electrode wire 1813.

The second dummy connecting pattern 1822 may have an island shape. The second dummy connecting pattern 1822 may be disposed in the open portion 1813_OP and may be spaced apart from the shielding electrode wire 1813. The second dummy connecting pattern 1822 may be surrounded by the shielding electrode wire 1813. The second dummy connecting pattern 1822 may be electrically insulated from the shielding electrode wire 1813. The second dummy connecting pattern 1822 may contact the ninth connecting pattern 1730 through a contact portion. The second dummy connecting pattern 1822 may contact the first sensing anode electrode O_AE1 (refer to FIG. 9C).

The first sub-dummy connecting pattern 1821_*a* may contact the first sub-connecting pattern 1741 through a contact portion. The first sub-dummy connecting pattern 1821_*a* may contact an anode electrode (e.g., the blue anode electrode B_AE) of a corresponding light emitting element (e.g., the blue light emitting element ED_B) through a contact portion. The second sub-dummy connecting pattern 1821_*b* may contact the second sub-connecting pattern 1742 through a contact portion. The second sub-dummy connecting pattern 1821_*b* may contact an anode electrode (e.g., the second green anode electrode G2_AE) of a corresponding light emitting element (e.g., the second green light emitting element ED_G2) through a contact portion.

Referring to FIGS. 6, 9B, and 9C, a seventh conductive layer 1901 may include the red anode electrode R_AE, the first green anode electrode G1_AE, the second green anode electrode G2_AE, the blue anode electrode B_AE, the first sensing anode electrode O_AE1, and the second sensing anode electrode O_AE2.

Each of the red anode electrode R_AE and the blue anode electrode B_AE makes contact with the first sub-dummy connecting pattern 1821_*a* through a contact portion. Each of the first green anode electrode G1_AE and the second green anode electrode G2_AE makes contact with the second sub-dummy connecting pattern 1821_*b* through a contact portion. The first sensing anode electrode O_AE1 makes contact with the second dummy connecting pattern 1822 through a contact portion. The first sensing anode electrode O_AE1 may be electrically connected with the second sensing anode electrode O_AE2 through the routing wire RW. In an embodiment of the present disclosure, the first sensing anode electrode O_AE1, the routing wire RW, and the second sensing anode electrode O_AE2 may be integrally formed.

On a plane, the first green anode electrode G1_AE, the first sensing anode electrode O_AE1, the routing wire RW, and the second sensing anode electrode O_AE2 may overlap the shielding electrode wire 1813.

The shielding electrode wire 1813 can reduce a coupling capacitance formed between the readout wire 1760 and the first and second data wires 1711 and 1712. In other words, the shielding electrode wire 1813 acts as a shield for the readout wire 1760 to prevent a sensing signal output from the readout wire 1760 from being affected by a data signal applied to the first and second data wires 1711 and 1712. Accordingly, the sensing accuracy of the sensor FX (refer to FIG. 3) may be improved.

The main electrode wire 1813_*m* of the shielding electrode wire 1813 may shield the reset transistor ST1, the amplifying transistor ST2, and the output transistor ST3 and may decrease a coupling capacitance between the first sensing anode SN1 (refer to FIG. 5A) and the readout wire 1760. Accordingly, the potential of the first sensing node SN1 may be stabilized, and thus, the sensing accuracy of the sensor FX (refer to FIG. 3) may be improved.

Figure 10A:
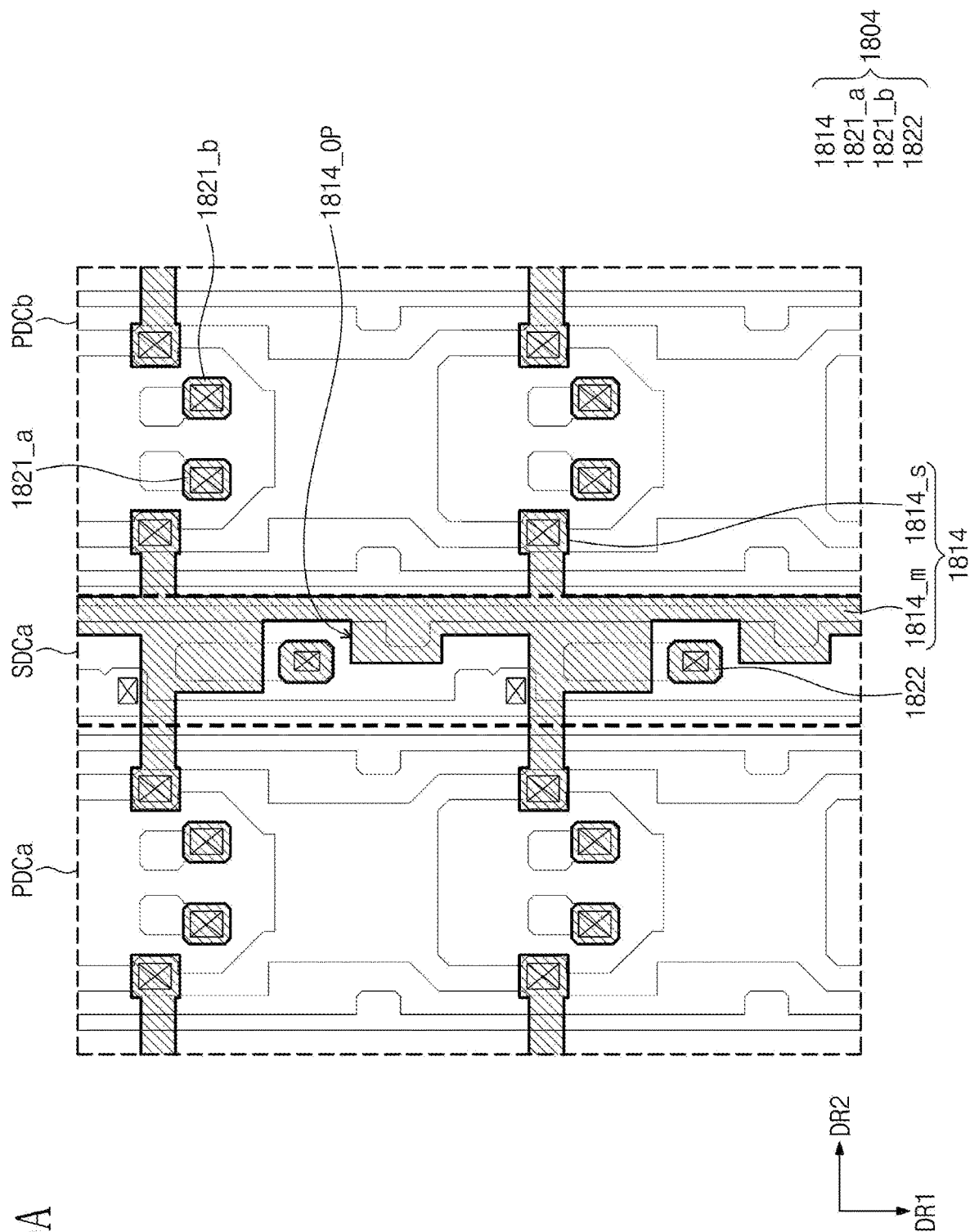
FIGS. 10A and 10B are plan views illustrating shielding electrode wires according to embodiments of the present disclosure.
Figure 10B:
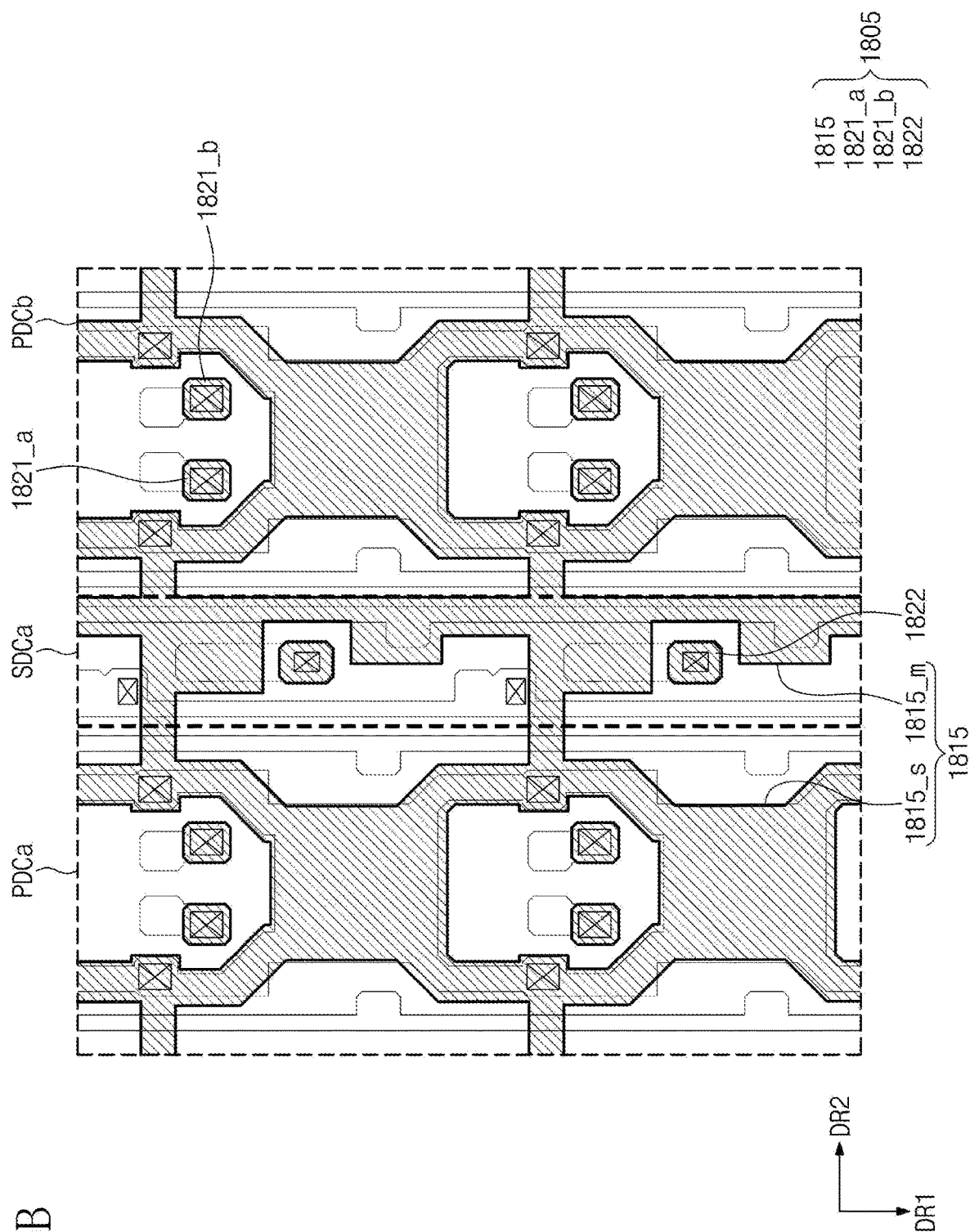

FIGS. 10A and 10B are plan views illustrating shielding electrode wires according to embodiments of the present disclosure. Among components illustrated in FIGS. 10A and 10B, components identical to the components illustrated in FIG. 9B will be assigned with identical reference numerals, and specific descriptions thereabout will be omitted.

Referring to FIGS. 6, 9A, and 10A, a sixth conductive layer 1804 may include a shielding electrode wire 1814, a first sub-dummy connecting pattern 1821_*a*, a second sub-dummy connecting pattern 1821_*b*, and a second dummy connecting pattern 1822.

The shielding electrode wire 1814 includes a main electrode wire 1814_*m* overlapping the readout wire 1760 on a plane and a sub-electrode wire 1814_*s* extending from the main electrode wire 1814_*m*. The main electrode wire 1814_*m* may extend in the first direction DR1. The sub-electrode wire 1814_*s* may be integrally formed with the main electrode wire 1814_*m*. The sub-electrode wire 1814_*s* may overlap the drive voltage wire 1720 on a plane. The sub-electrode wire 1814_*s* may contact the drive voltage wire 1720 through a contact portion. Accordingly, the first drive voltage ELVDD (refer to FIG. 5A) applied to the drive voltage wire 1720 may be applied to the shielding electrode wire 1814 through the contact portion. The shielding electrode wire 1814 may correspond to the shielding electrode SSE illustrated in FIG. 6.

The shielding electrode wire 1814 may have an open portion 1814_OP in which the second dummy connecting pattern 1822 is accommodated. The open portion 1814_OP may have a recess shape that is recessed from one side of the shielding electrode wire 1814.

The second dummy connecting pattern 1822 may be disposed in an island shape. The second dummy connecting pattern 1822 may be disposed in the open portion 1814_OP and may be spaced apart from the shielding electrode wire 1814. The second dummy connecting pattern 1822 may be electrically insulated from the shielding electrode wire 1814.

Referring to FIGS. 6, 9A, and 10B, a sixth conductive layer 1805 may include a shielding electrode wire 1815, a first sub-dummy connecting pattern 1821_a, a second sub-dummy connecting pattern 1821_b, and a second dummy connecting pattern 1822.

The shielding electrode wire 1815 includes a main electrode wire 1815_m overlapping the readout wire 1760 on a plane and a sub-electrode wire 1815_s extending from the main electrode wire 1815_m. The main electrode wire 1815_m may extend in the first direction DR1. The sub-electrode wire 1815_s may be integrally formed with the main electrode wire 1815_m. The sub-electrode wire 1815_s may overlap the drive voltage wire 1720 and may have a shape corresponding to the drive voltage wire 1720. The sub-electrode wire 1815_s may extend in the first direction DR1. The sub-electrode wire 1815_s may contact the drive voltage wire 1720 through a contact portion. Accordingly, the first drive voltage ELVDD (refer to FIG. 5A) applied to the drive voltage wire 1720 may be applied to the shielding electrode wire 1815 through the contact portion.

Although it has been described that the reset voltage or the first drive voltage is supplied to the shielding electrode wires 1810, 1811, 1812, 1813, 1814, and 1815, the present disclosure is not limited thereto. Alternatively, the shielding electrode wires 1810, 1811, 1812, 1813, 1814, and 1815 may be electrically connected to the first initialization voltage wire 1340 (refer to FIG. 7C) or the second initialization voltage wire 1680 (refer to FIG. 7F) and may receive the first initialization voltage VINT1 (refer to FIG. 5A) or the second initialization voltage VINT2 (refer to FIG. 5A).

The shielding electrode wire 1815 may further include the sub-electrode wire 1815_s corresponding to the drive voltage wire 1720, in addition to the main electrode wire 1815_m for shielding the readout wire 1760, thereby preventing a voltage drop phenomenon of the first drive voltage ELVDD supplied to the drive voltage wire 1720. Accordingly, the first drive voltage ELVDD may be uniformly supplied to the entire region of the display panel DP (refer to FIG. 3), and thus, deterioration in the display quality of the display panel DP caused by non-uniformity of the first drive voltage ELVDD may be improved.

Figure 11A:
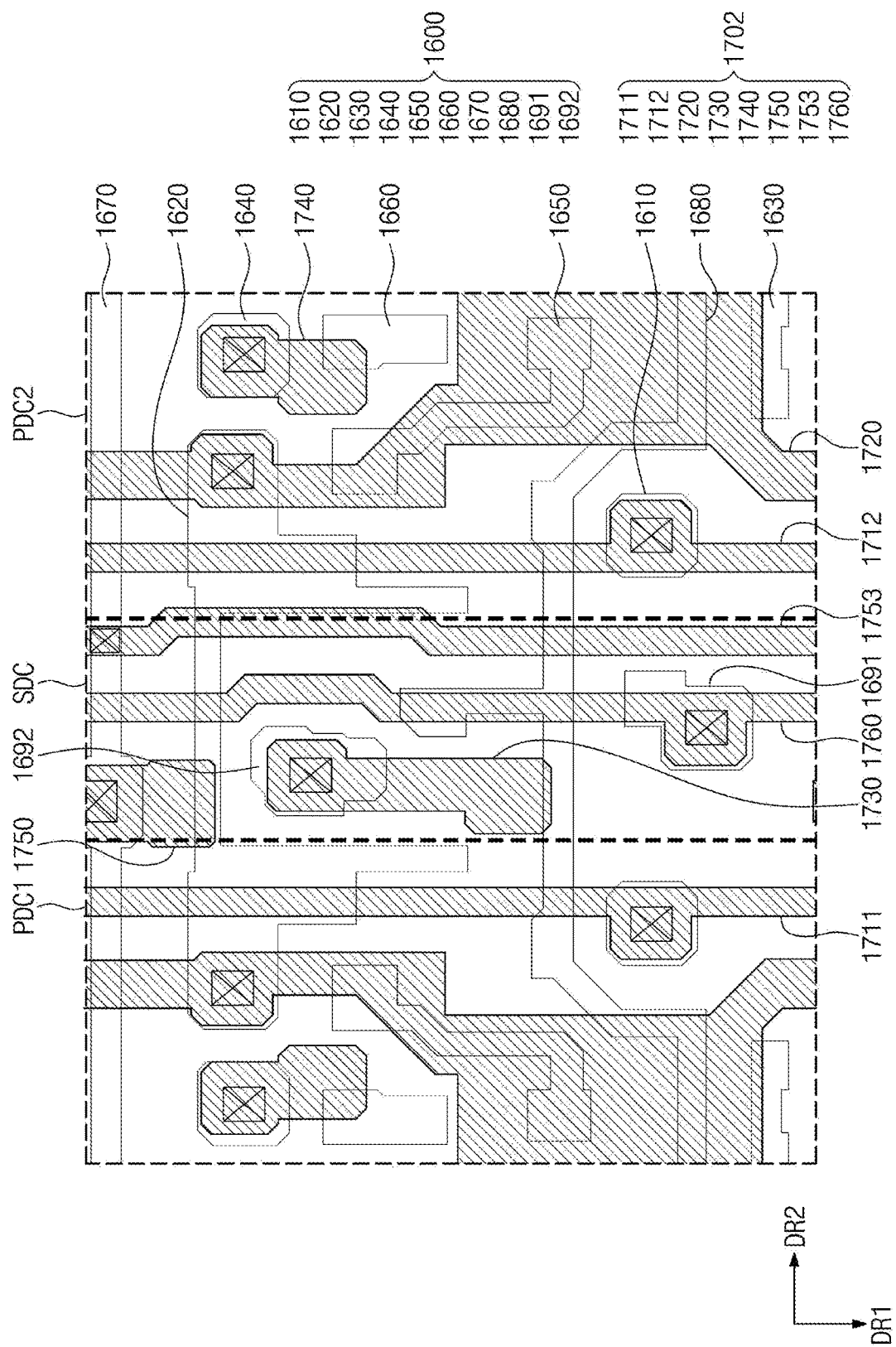
FIGS. 11A, 11B and 11C are plan views illustrating a process of forming a second reset voltage wire and a shielding electrode wire according to an embodiment of the present disclosure.
Figure 11B:
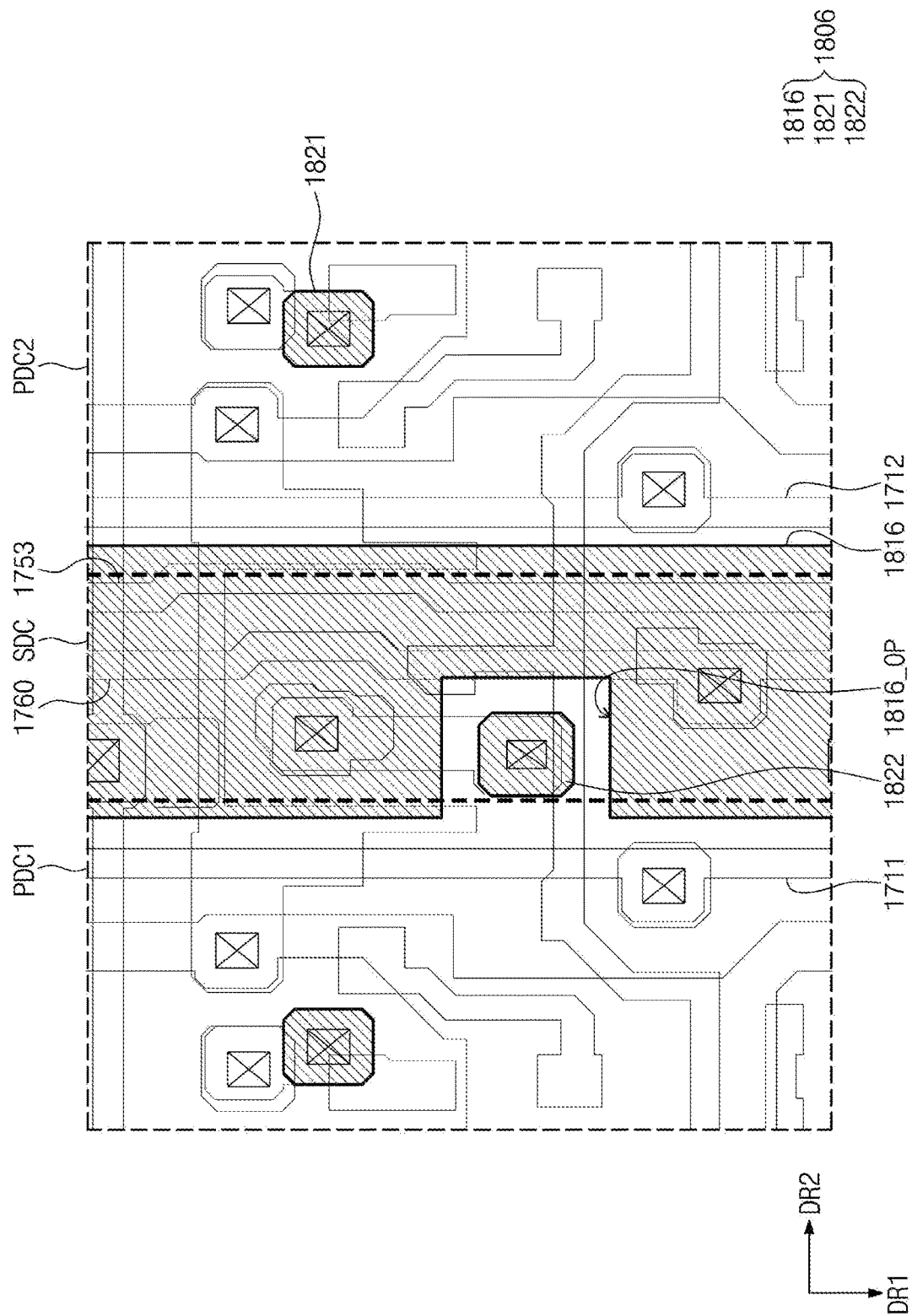
Figure 11C:
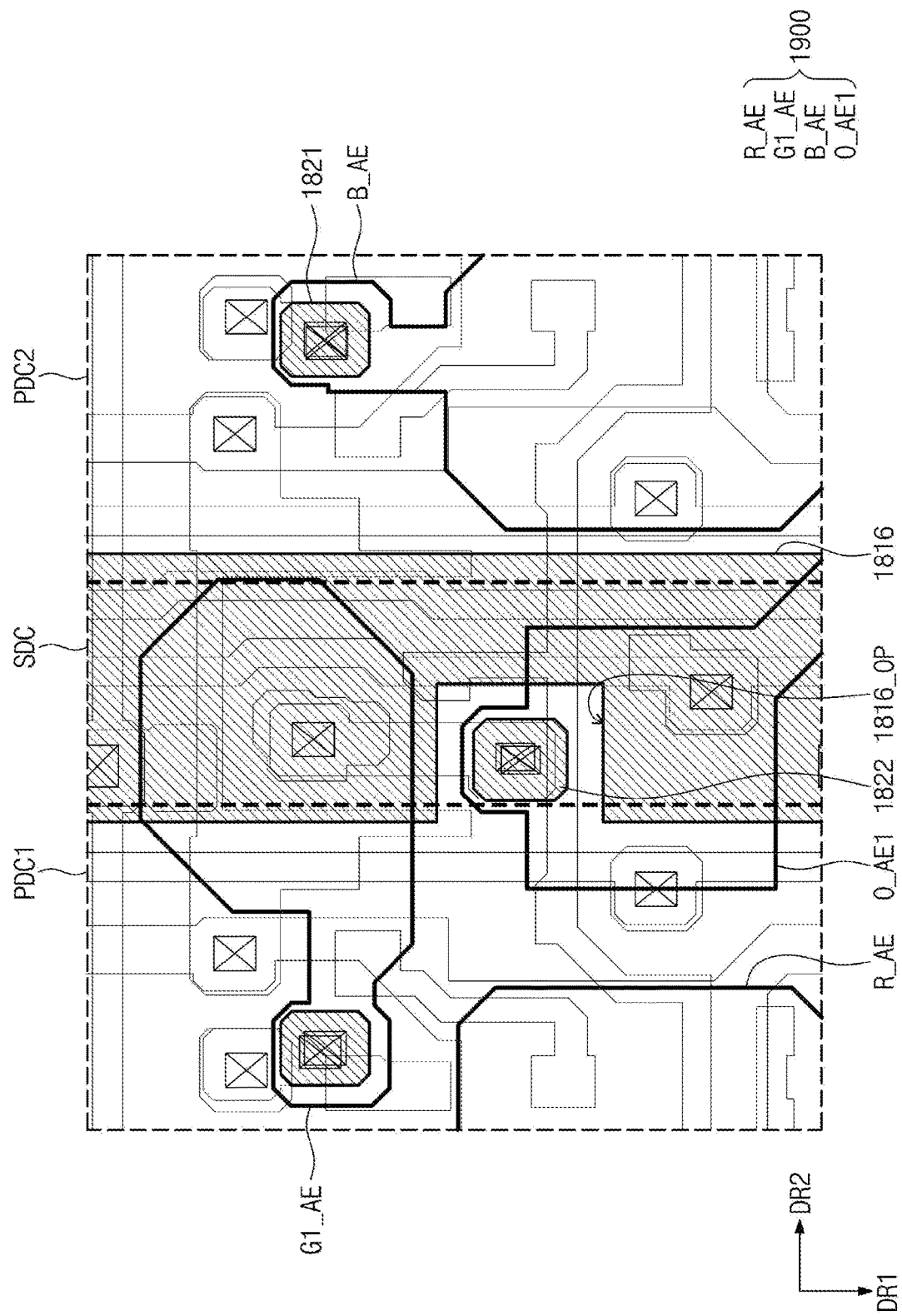

FIGS. 11A to 11C are plan views illustrating a process of forming a second reset voltage wire and a shielding electrode wire according to an embodiment of the present disclosure. Among components illustrated in FIGS. 11A to 11C, components identical to the components illustrated in FIGS. 7F to 7I will be assigned with identical reference numerals, and specific descriptions thereabout will be omitted.

Referring to FIGS. 6 and 11A, a fourth conductive layer 1600 may include a first connecting pattern 1610, a second connecting pattern 1620, a third connecting pattern 1630, a fourth connecting pattern 1640, a fifth connecting pattern 1650, a sixth connecting pattern 1660, a first reset voltage wire 1670, a second initialization voltage wire 1680, and seventh and eighth connecting patterns 1691 and 1692.

A fifth conductive layer 1702 may include a first data wire 1711, a second data wire 1712, a drive voltage wire 1720, a ninth connecting pattern 1730, a tenth connecting pattern 1740, an eleventh connecting pattern 1750, a second reset voltage wire 1753, and a readout wire 1760.

The second reset voltage wire 1753 may extend in the first direction DR1. The second reset voltage wire 1753 may be disposed between the readout wire 1760 and the second data wire 1712. The second reset voltage wire 1753 may contact the first reset voltage wire 1670 through a contact portion.

The readout wire 1760 may extend in the first direction DR1. The readout wire 1760 may be disposed between two adjacent data wires (e.g., the first and second data wires 1711 and 1712). The readout wire 1760 may correspond to the d-th readout line RLd of FIG. 5A. For example, the d-th readout signal FSd may be transferred to the readout wire 1760. The readout wire 1760 may contact the output transistor ST3 through a contact portion.

Referring to FIGS. 6, 11A, and 11B, a sixth conductive layer 1806 may include a shielding electrode wire 1816, a first dummy connecting pattern 1821, and a second dummy connecting pattern 1822.

The shielding electrode wire 1816 may extend in the first direction DR1. The shielding electrode wire 1816 may extend along the readout wire 1760. On a plane, the shielding electrode wire 1816 may overlap the readout wire 1760 and the second reset voltage wire 1753. The shielding electrode wire 1810 may make contact with the eleventh connecting pattern 1750 through a contact portion. Accordingly, the reset voltage applied to the first reset voltage wire 1670 may be applied to the shielding electrode wire 1816 through the eleventh connecting pattern 1750. The shielding electrode wire 1816 may correspond to the shielding electrode SSE illustrated in FIG. 6.

In FIG. 11B, the shielding electrode wire 1816 is illustrated as not overlapping the first and second data wires 1711 and 1712. However, the present disclosure is not limited thereto. Alternatively, the shielding electrode wire 1816 may be disposed to overlap both of the first and second data wires 1711 and 1712 or just one of the first and second data wires 1711 and 1712.

The shielding electrode wire 1816 may have an open portion 1816_OP in which the second dummy connecting pattern 1822 is accommodated. The open portion 1816_OP may have a recess shape that is recessed in the second direction DR2 from one side of the shielding electrode wire 1816.

Referring to FIGS. 6, 11B, and 11C, a seventh conductive layer 1900 may include the red anode electrode R_AE, the first green anode electrode G1_AE, the blue anode electrode B_AE, and the first sensing anode electrode O_AE1. The seventh conductive layer 1900 may further include the second green anode electrode G2_AE and the second sensing anode electrode O_AE2 illustrated in FIG. 4A.

Each of the red anode electrode R_AE, the first green anode electrode G1_AE, and the blue anode electrode B_AE makes contact with the first dummy connecting pattern 1821 through a contact portion. The first sensing anode electrode O_AE1 makes contact with the second dummy connecting pattern 1822 through a contact portion. On a plane, the first green anode electrode G1_AE and the first sensing anode electrode O_AE1 may overlap the shielding electrode wire 1816.

The shielding electrode wire 1816 can reduce a coupling capacitance formed between the readout wire 1760 and the first and second data wires 1711 and 1712. In other words, the shielding electrode wire 1810 acts as a shield for the readout wire 1760 to prevent a sensing signal output from the readout wire 1760 from being affected by a data signal applied to the first and second data wires 1711 and 1712. Furthermore, the second reset voltage wire 1753 which is disposed between the readout wire 1760 and the second data wire 1712 allows for sufficient space between the readout wire 1760 and the second data wire 1712. In addition, the capacitance between the readout wire 1760 and the second data wire 1712 may be decreased, eliminating or preventing a coupling phenomenon. Accordingly, the sensing accuracy of the sensor FX (refer to FIG. 3) may be improved.

Figure 12:
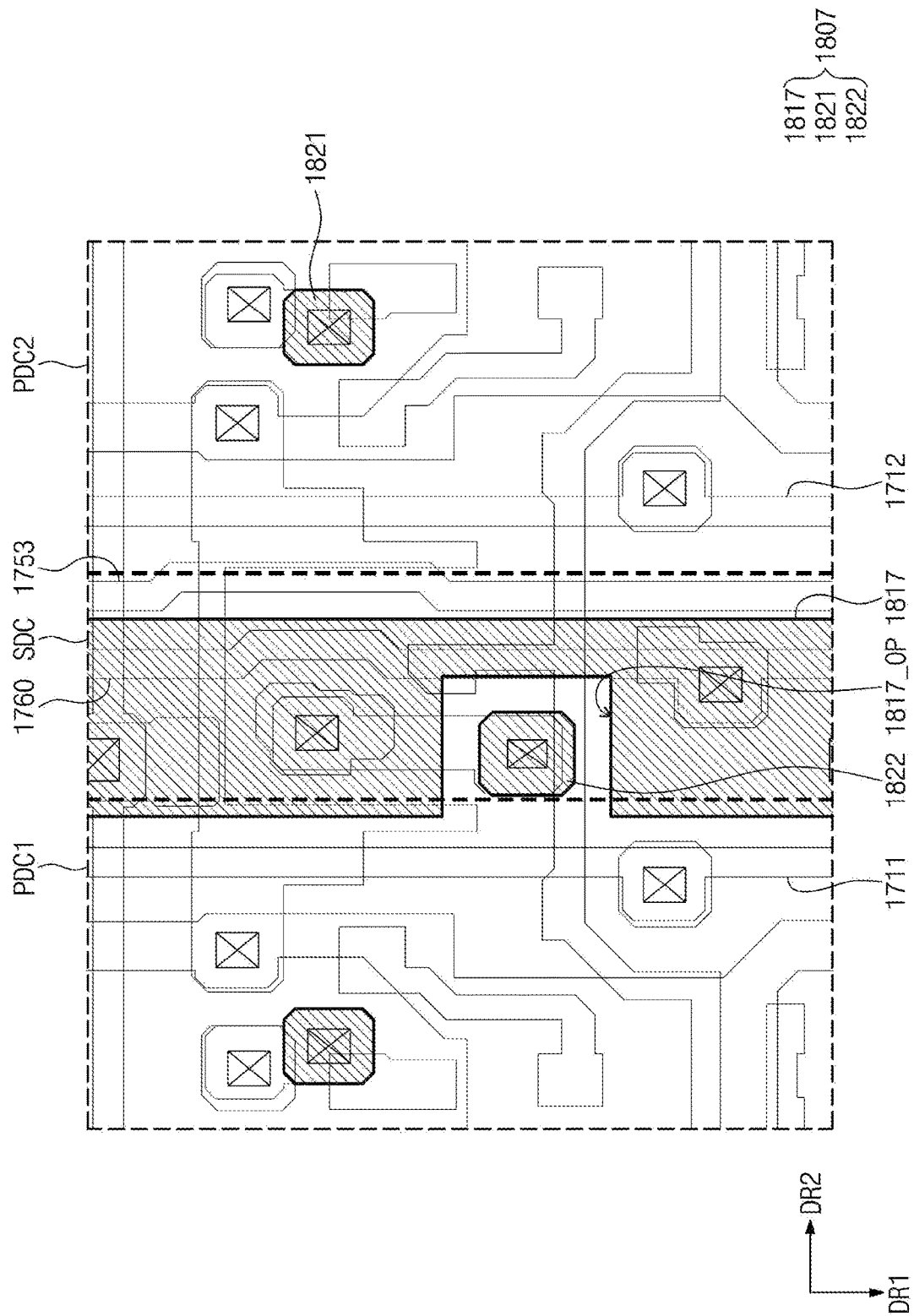
FIG. 12 is a plan view illustrating an arrangement relationship between a second reset voltage wire and a shielding electrode wire according to an embodiment of the present disclosure.

FIG. 12 is a plan view illustrating an arrangement relationship between a second reset voltage wire and a shielding electrode wire according to an embodiment of the present disclosure. Among components illustrated in FIG. 12, components identical to the components illustrated in FIG. 11B will be assigned with identical reference numerals, and specific descriptions thereabout will be omitted.

In FIG. 11B, the shielding electrode wire 1816 overlaps the second reset voltage wire 1753. However, the present disclosure is not limited thereto. As illustrated in FIG. 12, a sixth conductive layer 1807 includes a shielding electrode wire 1817, and on a plane, the shielding electrode wire 1817 may overlap the readout wire 1760, but not overlap the second reset voltage wire 1753. For example, the shielding electrode wire 1817 may be shifted to the left in FIG. 12.

The shielding electrode wire 1817 may have an open portion 1817_OP in which the second dummy connecting pattern 1822 is accommodated. The open portion 1817_OP may have a recess shape that is recessed in the second direction DR2 from one side of the shielding electrode wire 1817.

Figure 13A:
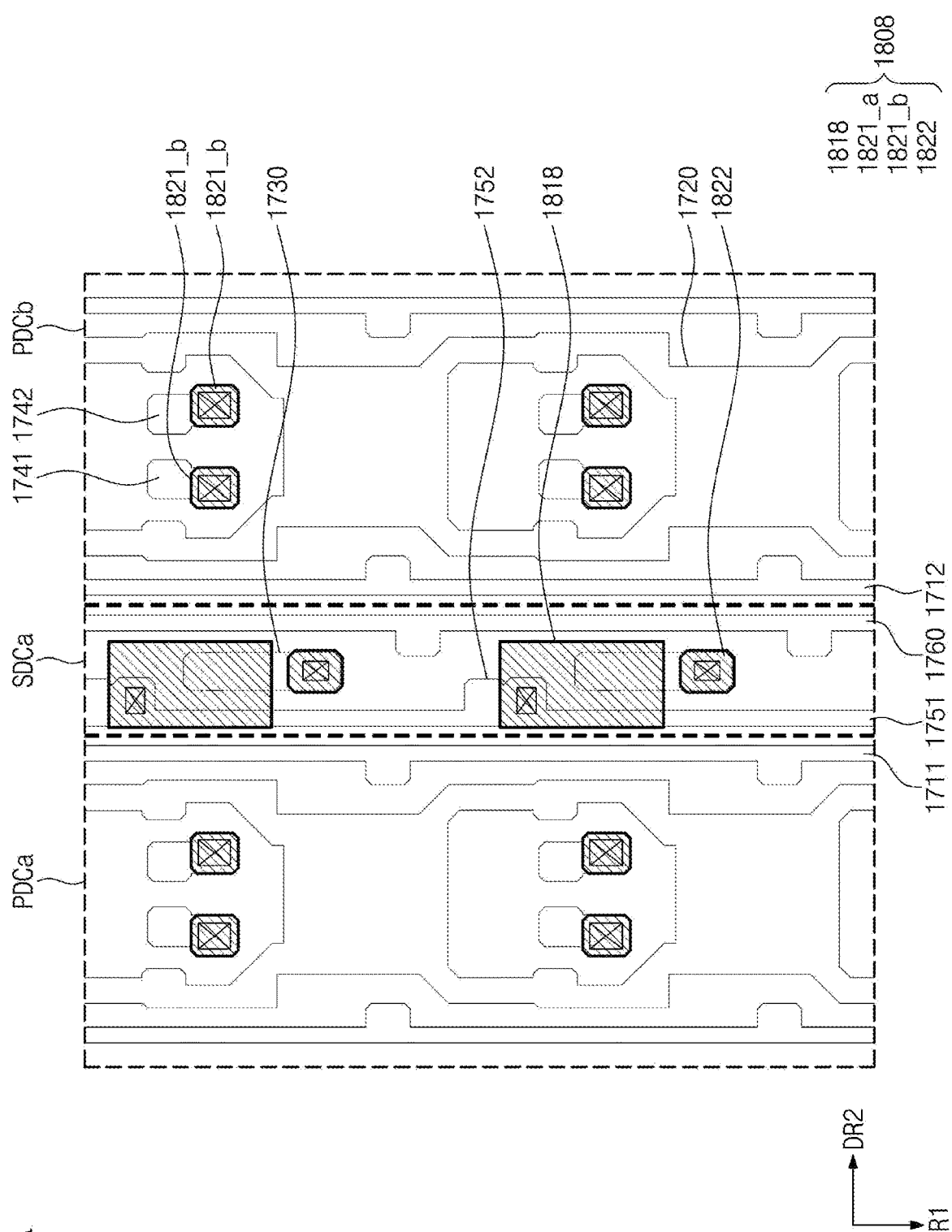
FIGS. 13A and 13B are plan views illustrating the position of a shielding electrode pattern according to an embodiment of the present disclosure.
Figure 13B:
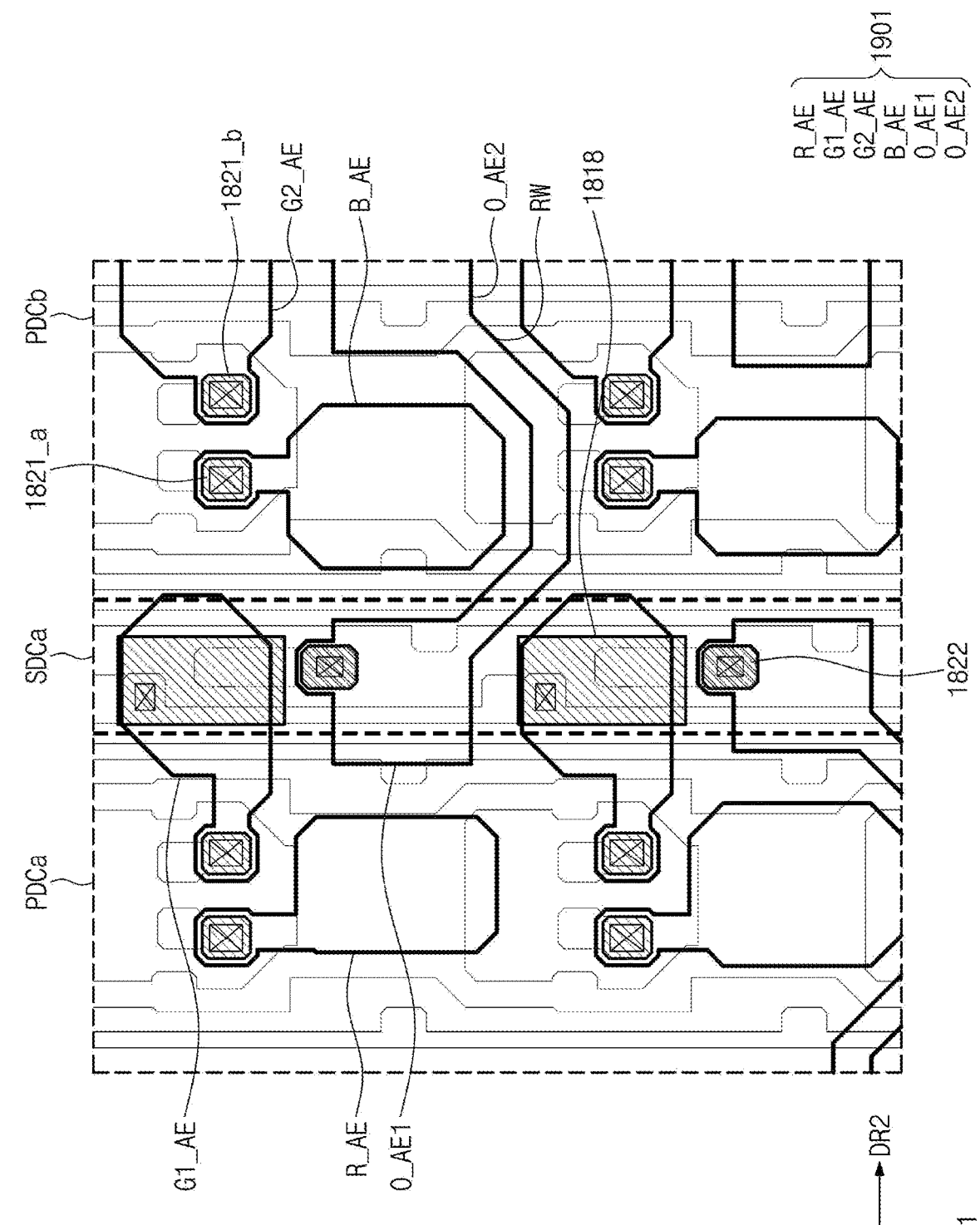

FIGS. 13A and 13B are plan views illustrating the position of a shielding electrode pattern according to an embodiment of the present disclosure. Among components illustrated in FIGS. 13A and 13B, components identical to the components illustrated in FIGS. 9B and 9C will be assigned with identical reference numerals, and detailed descriptions thereabout will be omitted.

Referring to FIGS. 7H and 13A, a sixth conductive layer 1808 includes a shielding electrode pattern 1818 which may have an island shape. The shielding electrode pattern 1818 may partially cover the third circuit portion SDCa. In particular, the shielding electrode pattern 1818 may overlap the reset transistor ST1, particularly, the first sensing node SN1 (refer to FIG. 5A) on a plane. The shielding electrode pattern 1818 may correspond to the shielding electrode SSE illustrated in FIG. 6.

The shielding electrode pattern 1818 may contact the eleventh connecting pattern 1752 through a contact portion. Accordingly, the reset voltage Vrst (refer to FIG. 5A) applied to the second reset voltage wire 1751 may be supplied to the shielding electrode pattern 1818 through the eleventh connecting pattern 1752.

Each of a first sub-dummy connecting pattern 1821_a and a second sub-dummy connecting pattern 1821_b may have an island shape. Each of the first sub-dummy connecting pattern 1821_a and the second sub-dummy connecting pattern 1821_b may be spaced apart from the shielding electrode pattern 1818 in the second direction DR2. Each of the first sub-dummy connecting pattern 1821_a and the second sub-dummy connecting pattern 1821b may be electrically insulated from the shielding electrode pattern 1818.

A second dummy connecting pattern 1822 may have an island shape. The second dummy connecting pattern 1822 may be disposed between two shielding electrode patterns 1818 adjacent to each other in the first direction DR1. The second dummy connecting pattern 1822 may be closer to one of the two shielding electrode patterns 1818 adjacent to each other in the first direction DR1. The second dummy connecting pattern 1822 may be electrically insulated from the shielding electrode patterns 1818.

Referring to FIGS. 13A and 13B, a seventh conductive layer 1901 may include the red anode electrode R_AE, the first green anode electrode G1_AE, the second green anode electrode G2_AE, the blue anode electrode B_AE, the first sensing anode electrode O_AE1, and the second sensing anode electrode O_AE2.

Each of the red anode electrode R_AE and the blue anode electrode B_AE makes contact with the first sub-dummy connecting pattern 1821_a through a contact portion. Each of the first green anode electrode G1_AE and the second green anode electrode G2_AE makes contact with the second sub-dummy connecting pattern 1821_b through a contact portion. The first sensing anode electrode O_AE1 makes contact with the second dummy connecting pattern 1822 through a contact portion. The first sensing anode electrode O_AE1 may be electrically connected with the second sensing anode electrode O_AE2 through the routing wire RW. In an embodiment of the present disclosure, the first sensing anode electrode O_AE1, the routing wire RW, and the second sensing anode electrode O_AE2 may be integrally formed.

On a plane, the first green anode electrode G1_AE may overlap the shielding electrode pattern 1818. On a plane, the shielding electrode pattern 1818 may not overlap the first and second sensing anode electrodes O_AE1 and O_AE2.

The shielding electrode pattern 1818 may shield the reset transistor ST1 and may decrease a coupling capacitance between the first sensing anode SN1 (refer to FIG. 5A) and the readout wire 1760. Accordingly, the potential of the first sensing node SN1 may be stabilized, and thus the sensing accuracy of the sensor FX (refer to FIG. 3) may be improved.

Although FIGS. 13A and 13B illustrate the structure in which the shielding electrode pattern 1818 does not overlap the readout wire 1760, the present disclosure is not limited thereto. Alternatively, the shielding electrode pattern 1818 may partially overlap the readout wire 1760.

Figure 14A:
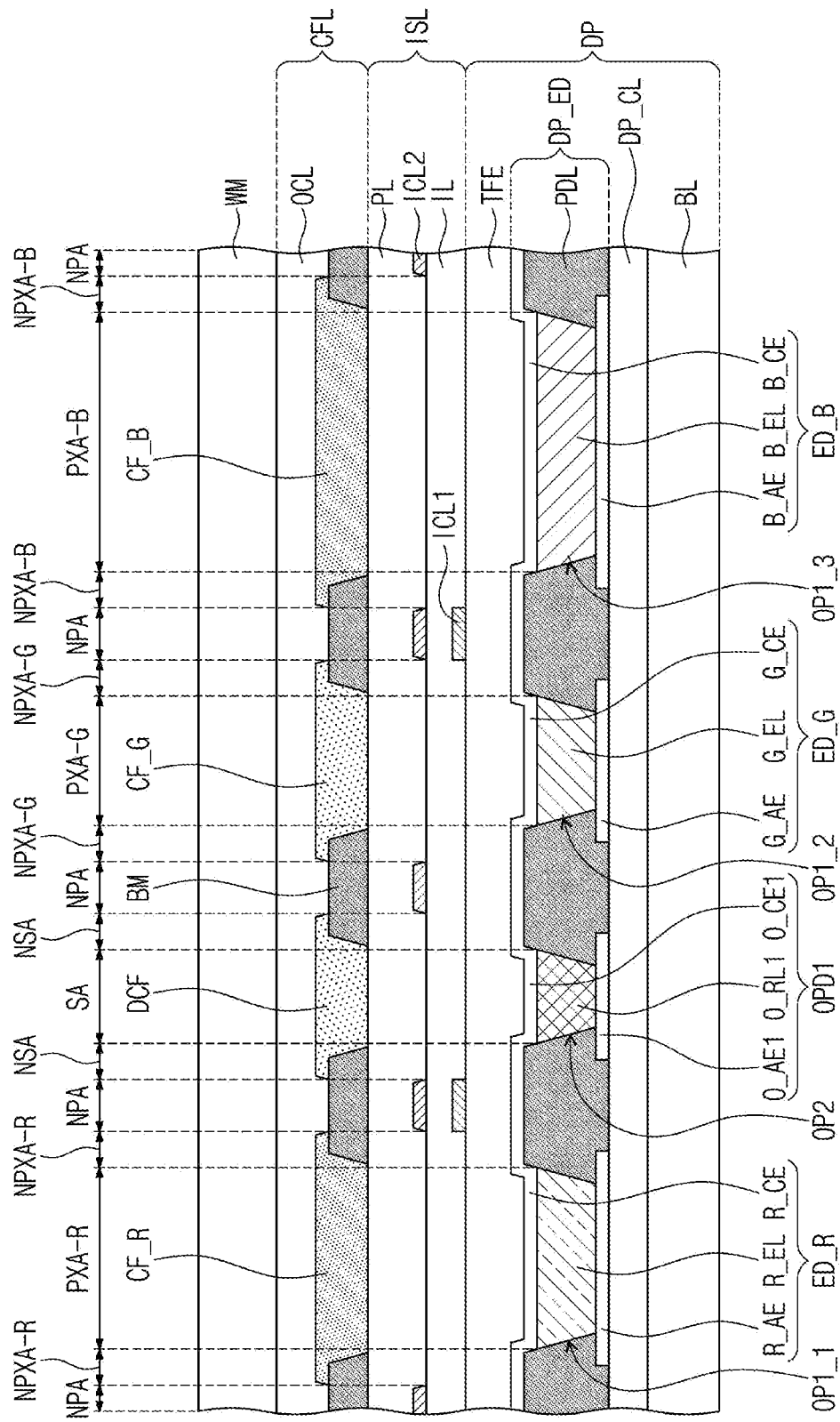
FIGS. 14A and 14B are sectional views illustrating a light emitting element and a light receiving element of the display panel according to an embodiment of the present disclosure.
Figure 14B:
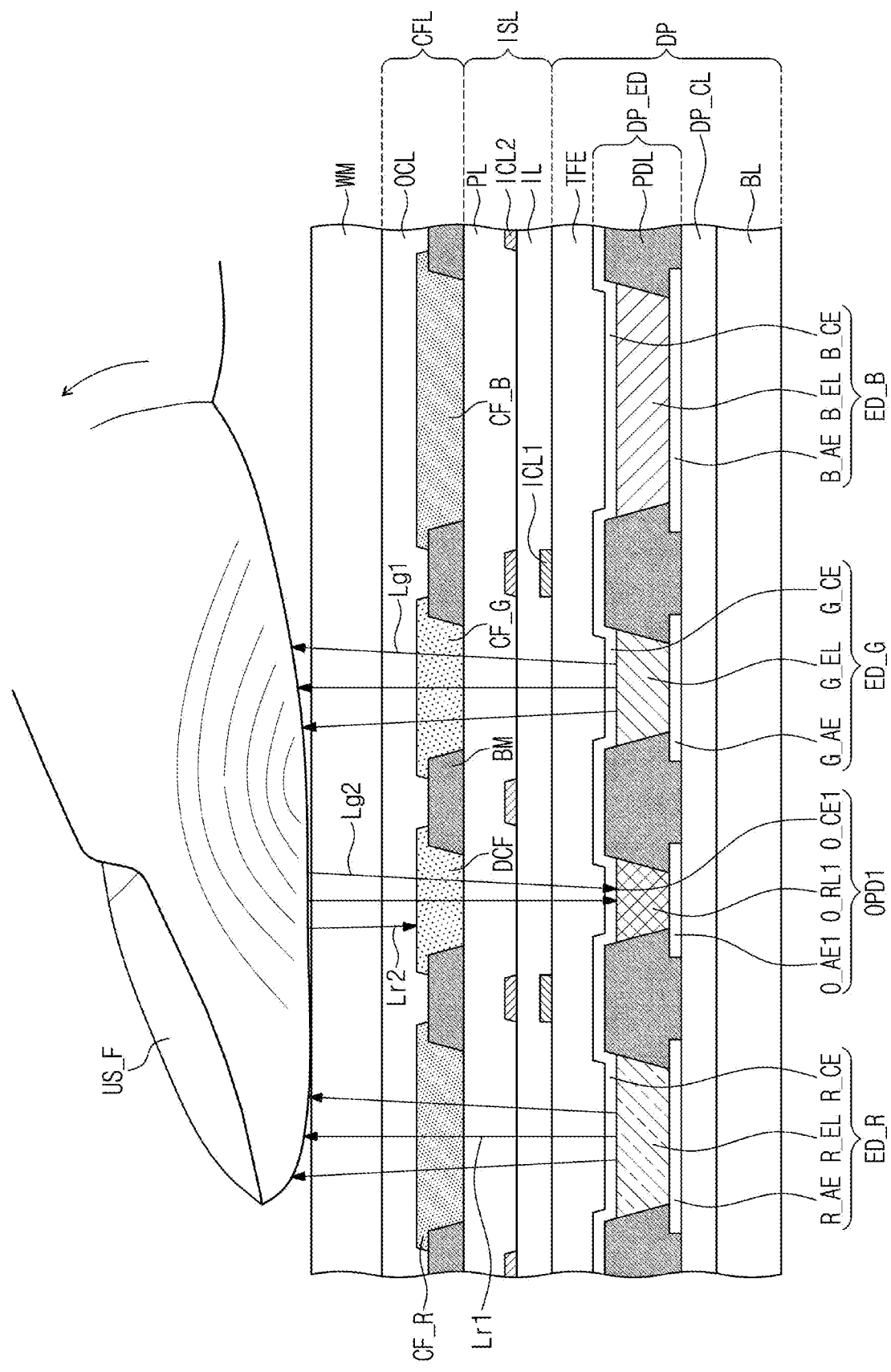

FIGS. 14A and 14B are sectional views illustrating a light emitting element and a light receiving element of the display panel according to an embodiment of the present disclosure.

Referring to FIGS. 14A and 14B, a first electrode layer is disposed on the circuit layer DP_CL. The pixel defining layer PDL is formed on the first electrode layer. The first electrode layer may include red, green, and blue anodes R_AE, G_AE, and B_AE. First to third light emitting openings OP1_1, OP1_2, and OP1_3 of the pixel defining layer PDL expose at least portions of the red, green, and blue anodes R_AE, G_AE, and B_AE, respectively. In an embodiment of the present disclosure, the pixel defining layer PDL may additionally include a black material. The pixel defining layer PDL may additionally include a black organic dye/pigment, such as carbon black, aniline black, or the like. The pixel defining layer PDL may be formed by mixing a blue organic material and a black organic material. The pixel defining layer PDL may additionally include a liquid-repellent organic material.

As illustrated in FIG. 14A, the display panel DP may include first to third emissive regions PXA-R, PXA-G, and PXA-B and first to third non-emissive regions NPXA-R, NPXA-G, and NPXA-B adjacent to the first to third emissive regions PXA-R, PXA-G, and PXA-B. The non-emissive regions NPXA-R, NPXA-G, and NPXA-B may surround the corresponding emissive regions PXA-R, PXA-G, and PXA-B, respectively. In this embodiment, the first emissive region PXA-R corresponds to a partial region of the red anode electrode R_AE exposed by the first light emitting opening OP1_1. The second emissive region PXA-G corresponds to a partial region of the green anode electrode G_AE exposed by the second light emitting opening OP1_2. The third emissive region PXA-B corresponds to a partial region of the blue anode electrode B_AE exposed by the third light emitting opening OP1_3. A non-pixel region NPA may be defined between the first to third non-emissive regions NPXA-R, NPXA-G, and NPXA-B.

A light emitting layer may be disposed on the first electrode layer. The light emitting layer may include red, green, and blue light emitting layers R_EL, G_EL, and B_EL. The red, green, and blue light emitting layers R_EL, G_EL, and B_EL may be disposed in regions corresponding to the first to third light emitting openings OP1_, OP1_2, and OP1_3, respectively. The red, green, and blue light emitting layers R_EL, G_EL, and B_EL may be separated from each other. Each of the red, green, and blue light emitting layers R_EL, G_EL, and B_EL may include an organic material and/or an inorganic material. The red, green, and blue light emitting layers R_EL, G_EL, and B_EL may generate light beams having predetermined colors. For example, the red light emitting layer R_EL may generate red light, the green light emitting layer G_EL may generate green light, and the blue light emitting layer B_EL may generate blue light.

Although the patterned red, green, and blue light emitting layers R_EL, G_EL, and B_EL are illustrated in this embodiment, one light emitting layer may be commonly disposed in the first to third emissive regions PXA_R, PXA_G, and PXA_B. In this case, the light emitting layer may generate white light or blue light. Furthermore, the light emitting layer may have a multi-layer structure called a tandem structure.

Each of the red, green, and blue light emitting layers R_EL, G_EL, and B_EL may include a low molecular weight organic material or a high molecular weight organic material as a luminescent material. Alternatively, each of the red, green, and blue light emitting layers R_EL, G_EL, and B_EL may include a quantum-dot material as a luminescent material. A core of a quantum dot may be selected from Group II-VI compounds, Group II-V compounds, Group IV-VI compounds, Group IV elements, Group IV compounds, and combinations thereof.

A second electrode layer is disposed on the red, green, and blue light emitting layers R_EL, G_EL, and B_EL. The second electrode layer may include red, green, and blue cathode electrodes R_CE, G_CE, and B_CE. The red, green, and blue cathode electrodes R_CE, G_CE, and B_CE may be electrically connected with one another. In an embodiment of the present disclosure, the red, green, and blue cathode electrodes R_CE, G_CE, and B_CE may be integrally formed. In this case, the red, green, and blue cathode electrodes R_CE, G_CE, and B_CE may be commonly disposed in the first to third emissive regions PXA-R, PXA-G, and PXA-B, the first to third non-emissive regions NPXA-R, NPXA-G, and NPXA-B, and the non-pixel region NPA.

The element layer DP_ED may further include a first light receiving element OPD1. The first light receiving element OPD1 may be a photo diode. The pixel defining layer PDL may further include a light receiving opening OP2 provided to correspond to the first light receiving element OPD1.

The first light receiving element OPD1 may include a first sensing anode electrode O_AE1, a first photoelectric conversion layer O_RL1, and a sensing cathode electrode O_CE1. The first sensing anode electrode O_AE1 may be disposed on the same layer as the first electrode layer. In other words, the first sensing anode electrode O_AE1 may be disposed on the circuit layer DP_CL and may be simultaneously formed through the same process as the red, green, and blue anode electrodes R_AE, G_AE, and B_AE.

The light receiving opening OP2 of the pixel defining layer PDL exposes at least a portion of the first sensing anode electrode O_AE1. The first photoelectric conversion layer O_RL1 is disposed on the first sensing anode electrode O_AE1 exposed by the light receiving opening OP2. The first photoelectric conversion layer O_RL1 may include an organic photo sensing material. The sensing cathode electrode O_CE1 may be disposed on the first photoelectric conversion layer O_RL1. The sensing cathode electrode O_CE1 may be simultaneously formed through the same process as the red, green, and blue cathode electrodes R_CE, G_CE, and B_CE. In an embodiment of the present disclosure, the sensing cathode electrode O_CE1 may be integrally formed with the red, green, and blue cathode electrodes R_CE, G_CE, and B_CE to form the common cathode electrode C_CE (refer to FIG. 5).

The encapsulation layer TFE is disposed on the element layer DP_ED. The encapsulation layer TFE includes at least an inorganic layer or an organic layer. In an embodiment of the present disclosure, the encapsulation layer TFE may include two inorganic layers and an organic layer disposed therebetween. In an embodiment of the present disclosure, the encapsulation layer TFE may include a plurality of inorganic layers and a plurality of organic layers that are alternately stacked one above another.

The inorganic encapsulation layer protects the red, green, and blue light emitting elements ED_R, ED_G, and ED_B and the first light receiving element OPD1 from moisture/oxygen, and the organic encapsulation layer protects the red, green, and blue light emitting elements ED_R, ED_G, and ED_B and the first light receiving element OPD1 from foreign matter such as dust particles. The inorganic encapsulation layer may include, but is not particularly limited to, a silicon nitride layer, a silicon oxy-nitride layer, a silicon oxide layer, a titanium oxide layer, or an aluminum oxide layer. The organic encapsulation layer may include, but is not particularly limited to, an acrylate-based organic layer.

The display device DD includes the input sensing layer ISL disposed on the display panel DP and the color filter layer CFL disposed on the input sensing layer ISL.

The input sensing layer ISL may be directly disposed on the encapsulation layer TFE. The input sensing layer ISL includes a first conductive layer ICL1, an insulating layer IL, a second conductive layer ICL2, and a protective layer PL. The first conductive layer ICL1 may be disposed on the encapsulation layer TFE. For example, the first conductive layer ICL1 may be in direct contact with the encapsulation layer TFE. The insulating layer IL may also be in direct contact with the encapsulation layer TFE. Although FIGS. 14A and 14B illustrate the structure in which the first conductive layer ICL1 is directly disposed on the encapsulation layer TFE, the present disclosure is not limited thereto. The input sensing layer ISL may further include a base insulating layer disposed between the first conductive layer ICL1 and the encapsulation layer TFE. In this case, the encapsulation layer TFE may be covered by the base insulating layer, and the first conductive layer ICL1 may be disposed on the base insulating layer. In an embodiment of the present disclosure, the base insulating layer may include an inorganic insulating material.

The insulating layer IL may cover the first conductive layer ICL1. The second conductive layer ICL2 is disposed on the insulating layer IL. The second conductive layer ICL2 may overlap the first conductive layer ICL1 in the non-pixel region NPA. Although FIGS. 14A and 14B illustrate the structure in which the input sensing layer ISL includes the first and second conductive layers ICL1 and ICL2, the present disclosure is not limited thereto. For example, the input sensing layer ISL may include only one of the first and second conductive layers ICL1 and ICL2.

The protective layer PL may be disposed on the second conductive layer ICL2. The protective layer PL may include an organic insulating material. The protective layer PL may protect the first and second conductive layers ICL1 and ICL2 from moisture/oxygen and protect the first and second conductive layers ICL1 and ICL2 from foreign matter.

The color filter layer CFL may be disposed on the input sensing layer ISL. The color filter layer CFL may be directly disposed on the protective layer PL. The color filter layer CFL may include a first color filter CF_R, a second color filter CF_G, and a third color filter CF_B. The first color filter CF_R has a first color, the second color filter CF_G has a second color, and the third color filter CF_B has a third color. In an embodiment of the present disclosure, the first color may be red, the second color may be green, and the third color may be blue.

The color filter layer CFL may further include a dummy color filter DCF. In an embodiment of the present disclosure, when a region where the first photoelectric conversion layer O_RL1 is disposed is a sensing region SA and a region around the sensing region SA is a non-sensing region NSA, the dummy color filter DCF may be disposed to correspond to the sensing region SA. The dummy color filter DCF may overlap the sensing region SA and the non-sensing region NSA. In an embodiment of the present disclosure, the dummy color filter DCF may have the same color as one of the first to third color filters CF_R, CF_G, and CF_B. In an embodiment of the present disclosure, the dummy color filter DCF may have the same green color as the second color filter CF_G.

The color filter layer CFL may further include a black matrix BM. The black matrix BM may be disposed to correspond to the non-pixel region NPA. The black matrix BM may be disposed to overlap the first and second conductive layers ICL1 and ICL2 in the non-pixel region NPA. In an embodiment of the present disclosure, the black matrix BM may overlap the non-pixel region NPA and the first to third non-emissive regions NPXA-G, NPXA-B, and NPXA-R. The black matrix BM may not overlap the first to third emissive regions PXA-R, PXA-G, and PXA-B.

The color filter layer CFL may further include an over-coating layer OCL. The over-coating layer OCL may include an organic insulating material. The over-coating layer OCL may have a thickness sufficient to remove steps between the first to third color filters CF_R, CF_G, and CF_B. Without any specific limitation, the over-coating layer OCL may include any material that has a predetermined thickness and is capable of flattening the upper surface of the color filter layer CFL. For example, the over-coating layer OCL may include an acrylate-based organic material.

Referring to FIG. 14B, when the display device DD (refer to FIG. 1) operates, the red, green, and blue light emitting elements ED_R, ED_G, and ED_B may output light. The red light emitting elements ED_R output red light in a red wavelength band, the green light emitting elements ED_G output green light in a green wavelength band, and the blue light emitting elements ED_B output blue light in a blue wavelength band.

In an embodiment of the present disclosure, the first light receiving element OPD1 may receive light from specific light emitting elements (e.g., the green light emitting element ED_G) among the red, green, and blue light emitting elements ED_R, ED_G, and ED_B. In other words, green light Lg1 may be output from the green light emitting elements ED_G, and the first light receiving element OPD1 may receive green reflected light Lg2 obtained by reflection of the green light Lg1 by the user's fingerprint. The green light Lg1 and the green reflected light Lg2 may be light in the green wavelength band. The dummy color filter DCF is disposed over the first light receiving element OPD1. The dummy color filter DCF may be green in color. Accordingly, the green reflected light Lg2 may pass through the dummy color filter DCF and may be incident on the first light receiving element OPD1.

Red light and blue light output from the red and blue light emitting elements ED_R and ED_B may also be reflected by the user's hand US_F. For example, when light obtained by reflection of red light Lr1 output from the red light emitting elements ED_R by the user's hand US_F is red reflected light Lr2, the red reflected light Lr2 fails to pass through the dummy color filter DCF and may be absorbed by the dummy color filer DCF. Accordingly, the red reflected light Lr2 fails to pass through the dummy color filter DCF and cannot be incident on the first light receiving element OPD1. Likewise, even though blue light is reflected by the user's hand US_F, the blue light may be absorbed by the dummy color filter DCF. Accordingly, only the green reflected light Lg2 may be provided to the first light receiving element OPD1.

According to the embodiments of the present disclosure, the shielding electrode wire can provide shielding to the readout wire leading to a reduction in the coupling capacitance formed between the readout wire and the first and second data wires. This reduction in coupling results in an improved sensing accuracy of the sensor since the data signal no longer interferes with the sensing signal read out through the readout wire.

In addition, the shielding electrode wire can shield the reset transistor of the sensor drive circuit, leading to a decrease in the coupling capacitance between the first sensing node and the readout wire. This reduction in coupling capacitance helps to stabilize the potential of the first sensing node, resulting in an improvement in the sensor's sensing accuracy.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
   a base layer;
   a circuit layer disposed on the base layer, the circuit layer including at least one insulating layer and circuit elements for an operation of the display device; and
   an element layer disposed on the circuit layer, the element layer including a light emitting element and a light receiving element,
   wherein the circuit layer includes:
   a pixel drive circuit connected to the light emitting element;
   a sensor drive circuit connected to the light receiving element;
   a data wire connected to the pixel drive circuit;
   a readout wire connected to the sensor drive circuit;
   a shielding electrode wire overlapping the readout wire on a plane; and
   an insulating layer covering the data wire and the readout wire,
   wherein the shielding electrode wire is disposed on the insulating layer.

2. The display device of claim 1, wherein the circuit layer further includes a reset voltage line configured to supply a reset voltage to the sensor drive circuit, and
wherein the shielding electrode wire is electrically connected with the reset voltage line.

3. The display device of claim 2, wherein the shielding electrode wire extends in a first direction in which the readout wire extends, and
wherein the reset voltage line extends in a second direction crossing the first direction.

4. The display device of claim 1, wherein the shielding electrode wire is spaced apart from the data wire on the plane.

5. The display device of claim 1, wherein the circuit layer further includes:
a first dummy connecting pattern disposed on the insulating layer and electrically connected with the light emitting element, and
a second dummy connecting pattern disposed on the insulating layer and electrically connected with the light receiving element, and
wherein the shielding electrode wire is electrically insulated from the first and second dummy connecting patterns.

6. The display device of claim 5, wherein the shielding electrode wire includes an open portion in which the second dummy connecting pattern is accommodated.

7. The display device of claim 1, wherein the light receiving element includes a sensing anode electrode electrically connected with the sensor drive circuit, and
wherein the shielding electrode wire includes:
a main electrode wire overlapping the readout wire on the plane; and
a sub-electrode wire extending from the main electrode wire and overlapping the sensing anode electrode on the plane.

8. The display device of claim 7, wherein the element layer further includes:
a dummy light receiving element including a dummy anode electrode electrically connected to the sensing anode electrode; and
a routing wire configured to connect the dummy anode electrode and the sensing anode electrode, and
wherein the sub-electrode wire overlaps the dummy anode electrode and the routing wire on the plane.

9. The display device of claim 1, wherein the circuit layer further includes:
a reset voltage line configured to supply a reset voltage to the sensor drive circuit,
wherein the shielding electrode wire extends in a first direction in which the readout wire extends, and
wherein the reset voltage line includes:
a first reset voltage wire extending in a second direction crossing the first direction; and
a second reset voltage wire extending in the first direction.

10. The display device of claim 9, wherein the second reset voltage wire is disposed between the readout wire and the data wire.

11. The display device of claim 9, wherein the shielding electrode wire overlaps the second reset voltage wire on the plane.

12. The display device of claim 9, wherein the shielding electrode wire is connected with the first reset voltage wire or the second reset voltage wire.

13. The display device of claim 9, wherein the circuit layer further includes:
a first insulating layer covering the first reset voltage wire, wherein the data wire and the readout wire are disposed on the first insulating layer; and
a second insulating layer covering the second reset voltage wire, the data wire, and the readout wire, and
wherein the shielding electrode wire is disposed on the second insulating layer.

14. The display device of claim 1, wherein the circuit layer further includes:
a drive voltage wire configured to supply a drive voltage to the pixel drive circuit, and
wherein the shielding electrode wire is electrically connected with the drive voltage wire.

15. The display device of claim 14, wherein the circuit layer further includes:
an insulating layer covering the drive voltage wire, the data wire, and the readout wire, wherein the shielding electrode wire is disposed on the insulating layer, and
wherein the shielding electrode wire includes:
a main electrode wire overlapping the readout wire on the plane; and
a sub-electrode wire extending from the main electrode wire and disposed to correspond to the drive voltage wire.

16. The display device of claim 1, wherein the sensor drive circuit includes:
a reset transistor including a first electrode configured to receive a reset voltage, a second electrode connected with a first sensing node, and a third electrode configured to receive a reset control signal;
an amplifying transistor including a first electrode configured to receive a sensor drive voltage, a second electrode connected with a second sensing node, and a third electrode connected with the first sensing node; and
an output transistor including a first electrode connected with the second sensing node, a second electrode connected with the readout wire, and a third electrode configured to receive an output control signal.

17. The display device of claim 16, wherein the shielding electrode wire overlaps the reset transistor, the amplifying transistor, and the output transistor on the plane.

18. A display device comprising:
a base layer;
a circuit layer disposed on the base layer, the circuit layer including electronic circuits and connectivity for the operation of the display device; and
an element layer disposed on the circuit layer, the element layer including a light emitting element and a light receiving element,
wherein the circuit layer includes:
a pixel drive circuit connected to the light emitting element;
a sensor drive circuit connected to the light receiving element;
a data wire connected to the pixel drive circuit;
a readout wire connected to the sensor drive circuit; and
a shielding electrode wire overlapping the readout wire on a plane,
wherein the shielding electrode wire overlaps the data wire on the plane.

19. A display device comprising:
a base layer,
a circuit layer disposed on the base layer, the circuit layer including at least one insulating layer and circuit elements for an operation of the display device; and an element layer disposed on the circuit layer, the element layer including a light emitting element and a light receiving element, wherein the circuit layer includes:

a pixel drive circuit connected to the light emitting element;

a sensor drive circuit connected to the light receiving element; and a shielding electrode pattern overlapping the sensor drive circuit on a plane.

20. The display device of claim 19, wherein the sensor drive circuit includes:

a reset transistor including a first electrode configured to receive a reset voltage, a second electrode connected with a first sensing node, and a third electrode configured to receive a reset control signal;

an amplifying transistor including a first electrode configured to receive a sensor drive voltage, a second electrode connected with a second sensing node, and a third electrode connected with the first sensing node; and an output transistor including a first electrode connected with the second sensing node, a second electrode connected with a readout wire, and a third electrode configured to receive an output control signal.

21. The display device of claim 20, wherein the shielding electrode pattern has an island shape, and wherein the shielding electrode pattern overlaps the reset transistor on the plane.

22. The display device of claim 21, wherein the circuit layer further includes:

a reset voltage line configured to supply the reset voltage to the sensor drive circuit, and wherein the shielding electrode pattern is electrically connected with the reset voltage line.

23. The display device of claim 22, wherein the circuit layer further includes:

an insulating layer disposed on the reset voltage line, and wherein the shielding electrode pattern is disposed on the insulating layer.

24. The display device of claim 23, wherein the circuit layer further includes:

a first dummy connecting pattern disposed on the insulating layer and electrically connected with the light emitting element, and a second dummy connecting pattern disposed on the insulating layer and electrically connected with the light receiving element, and wherein the shielding electrode pattern is electrically insulated from the first and second dummy connecting patterns.

25. The display device of claim 21, wherein the circuit layer further includes:

a reset voltage line configured to supply the reset voltage to the sensor drive circuit, and wherein the reset voltage line includes:

a first reset voltage wire; and a second reset voltage wire extending in a direction crossing the first reset voltage wire.

26. The display device of claim 25, wherein the circuit layer further includes:

a data wire connected to the pixel drive circuit; and the readout wire connected to the sensor drive circuit, and wherein the second reset voltage wire is disposed between the readout wire and the data wire.

27. The display device of claim 26, wherein the circuit layer further includes:

a first insulating layer covering the first reset voltage wire, wherein the data wire and the readout wire are disposed on the first insulating layer; and a second insulating layer covering the second reset voltage wire, the data wire, and the readout wire, and wherein the shielding electrode pattern is disposed on the second insulating layer.

* * * * *